United States Patent
Onobori et al.

(10) Patent No.: US 7,296,727 B2
(45) Date of Patent: Nov. 20, 2007

(54) APPARATUS AND METHOD FOR MOUNTING ELECTRONIC COMPONENTS

(75) Inventors: Shunji Onobori, Kyoto-fu (JP); Shuichi Hirata, Osaka (JP); Masakazu Yamano, Matsubara (JP); Kazuya Yamamoto, Neyagawa (JP); Satoshi Shida, Hirakata (JP); Takaharu Mae, Hirakata (JP); Makoto Akita, Takatsuki (JP); Shozo Minamitani, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 37 days.

(21) Appl. No.: 10/324,001

(22) Filed: Dec. 20, 2002

(65) Prior Publication Data

US 2005/0098610 A1 May 12, 2005

(51) Int. Cl.
*B23K 31/02* (2006.01)
*B23K 37/04* (2006.01)

(52) U.S. Cl. .................. 228/180.22; 228/6.2; 228/102; 228/8; 228/44.3

(58) Field of Classification Search ........... 228/180.21, 228/180.22, 6.1, 6.2, 5.5, 102; 29/740, 830, 29/840; 438/106–108
See application file for complete search history.

(56) References Cited

U.S. PATENT DOCUMENTS

| | | | | |
|---|---|---|---|---|
| 4,236,306 A | * | 12/1980 | Hug et al. ..................... 29/827 |
| 4,295,596 A | * | 10/1981 | Doten et al. ........... 228/180.21 |
| 4,752,025 A | * | 6/1988 | Stach et al. ...................... 228/9 |
| 4,875,614 A | * | 10/1989 | Cipolla et al. ................ 228/5.5 |
| 5,065,933 A | * | 11/1991 | Basavanhally ............... 228/102 |
| 5,145,099 A | * | 9/1992 | Wood et al. ..................... 228/9 |
| 5,309,545 A | * | 5/1994 | Spigarelli et al. ........... 392/419 |
| 5,667,129 A | * | 9/1997 | Morita et al. ................ 228/102 |
| 5,786,271 A | * | 7/1998 | Ohida et al. ................. 438/615 |
| 5,788,143 A | * | 8/1998 | Boyd et al. .................. 228/253 |
| 5,799,543 A | * | 9/1998 | Nagai et al. ............. 74/490.09 |
| 5,803,339 A | * | 9/1998 | Hoshiba et al. ................ 228/41 |
| 5,878,942 A | * | 3/1999 | Kodama et al. ........ 228/180.22 |
| 5,971,250 A | * | 10/1999 | Safabakhsh et al. ......... 228/102 |
| 6,122,823 A | * | 9/2000 | Kira et al. ..................... 29/840 |
| 6,131,795 A | * | 10/2000 | Sato ........................... 228/102 |
| 6,463,359 B2 | * | 10/2002 | Fischer ........................ 700/254 |
| 6,537,400 B1 | * | 3/2003 | Fogal et al. .................... 156/64 |
| 6,544,377 B1 | * | 4/2003 | Minamitani et al. ......... 156/299 |
| 6,550,669 B1 | * | 4/2003 | Walz et al. .................. 228/264 |
| 6,605,500 B2 | * | 8/2003 | Hudson et al. .............. 438/200 |

(Continued)

FOREIGN PATENT DOCUMENTS

JP          8-204327          8/1996

(Continued)

*Primary Examiner*—Kevin P. Kerns
(74) *Attorney, Agent, or Firm*—Wenderoth, Lind & Ponack, L.L.P.

(57) ABSTRACT

After detection of contact between respective solder bumps of an electronic component, sucked and held by a suction nozzle of a head tool, and respective solder portions of a circuit board, the solder bumps and the solder portions are melted by heating. Releasing of the electronic component from suction and holding by the suction nozzle of the head tool is performed, not at a time during solder melting, but at a time after the solder is melted, cooled and solidified. Thus, an electronic component mounting method and apparatus capable of mounting high-end electronic components having narrow-pitched bumps are provided.

26 Claims, 25 Drawing Sheets

U.S. PATENT DOCUMENTS 6,640,423 B1 * 11/2003 Johnson et al. ............... 29/740
6,821,813 B2 * 11/2004 Su ............................ 438/106
2003/0009876 A1 * 1/2003 Yamauchi ................... 29/832

FOREIGN PATENT DOCUMENTS

| | | |
|---|---|---|
| JP | 9-129687 | 5/1997 |
| JP | 2947220 | 7/1999 |
| JP | 11-330791 | 11/1999 |

* cited by examiner

CROSS

⊙ = MOUNTING POSITION

O-TYPE

⊙ = MOUNTING POSITION

8-TYPE (LONGITUDINAL)

⊙ = MOUNTING POSITION

8-TYPE (LATERAL)

⊙ = MOUNTING POSITION

PRIOR ART

PRIOR ART

APPARATUS AND METHOD FOR MOUNTING ELECTRONIC COMPONENTS

BACKGROUND OF THE INVENTION

The present invention relates to a method and apparatus for mounting electronic components onto a circuit board. More particularly, the invention relates to an electronic component mounting method and apparatus that makes it possible to mount such electronic components as IC chips having narrow pitched bumps onto a circuit board by performing a flip chip bonding method.

As electronic component mounting methods of this type, there have conventionally been known various methods. As an example of a conventional electronic component mounting method corresponding to the flip chip bonding method, is a method including steps of temporarily bonding a plurality of electronic components onto a circuit board and thereafter subjecting the electronic components collectively to reflow soldering, thus achieving electronic component mounting, (hereinafter, described as a collective reflow mounting method) as shown FIGS. 22A-22D.

As shown in FIG. 22A, solder paste is fed by printing or the like onto pads 84a, which are a plurality of electrodes on a top surface of a plate-like circuit board 84, so that solder portions 82 are formed on the pads 84a of the circuit board 84, respectively.

Next, in FIG. 22B, an electronic component 81, to which solder bumps 81b are bonded at a plurality of electrodes 81a provided on a bonding surface of the electronic component 81, is sucked and held at its rear surface, which has no electrodes 81a thereon, by a tool 83. After a positional alignment that makes the solder bumps 81b of the electronic component 81 bondable with the solder portions 82 on the circuit board 84, respectively, the solder bumps 81b of the electronic component 81 are pressed against the solder portions 82 of the circuit board 84, respectively, thereby achieving their temporary bonding. For mounting of a plurality of electronic components 81 onto the circuit board 84, these working steps are iteratively performed so that respective electronic components 81 are mounted onto the circuit board 84. It is noted here that the terms, "temporary bonding," refer to a bonding process such that the electronic component 81 and the circuit board 84 are releasable from their bonding by applying external force to the electronic component 81 or the circuit board 84 without breaking the electronic component 81 or the circuit board 84.

Thereafter, the circuit board 84, to which the electronic components 81 have been temporarily bonded, is conveyed to a reflow soldering working section. As shown in FIG. 22C, the electronic components 81 and the circuit board 84 are heated by a heat source in the reflow soldering working section, by which the solder portions 82 and the solder bumps 81b are melted. In a case where a plurality of electronic components 81 are temporarily bonded to the circuit board 84, those electronic components 81 are collectively subjected to heat so as to melt the solder in this reflow soldering working section.

Thereafter, as shown in FIG. 22D, with the circuit board 84 removed from the reflow soldering working section, molten solder is cooled and solidified, thereby achieving primary bonding of the electrodes 81a of each electronic component 81 to the pads 84a of the circuit board 84, respectively, via the solder, by which the electronic components 81 are collectively mounted onto the circuit board 84. It is noted here that the terms, "primary bonding," refer to a bonding process that is performed by melting the solder with heat applied to the temporarily bonded electronic component 81 and circuit board 84, and by thereafter solidifying the solder, and this makes it hard to release a resulting bonded state by applying external force to the electronic component 81 or the circuit board 84.

In such a collective reflow mounting method, a multiplicity of electronic components 81, after their temporary bonding, can be subjected to collective melting of solder, by which the electronic components 81 can be finally bonded and thereby mounted to the circuit board 84. This allows for electronic-component mounting operations to be efficiently achieved. As a result, it has been a case in that costs of mounting the electronic components 81 onto the circuit board 84 can be reduced.

However, for such a method, which includes steps for temporarily bonding of the electronic components 81 to the circuit board 84, and thereafter performing their primary bonding by melting the solder, there is a need for conveying the circuit board 84, to which the electronic components 81 have been temporarily bonded, to the reflow soldering working section. During this conveyance, a bonding position of each electronic component 81 relative to the circuit board 84 might be shifted due to vibrations or the like caused by the conveyance, in which case reflowing of the solder in such a shifted state might result in defective bonding of the electronic components 81 to the circuit board 84. Such shifts of the bonding positions as would occur in the collective reflow mounting method would not matter for electronic components to which high precision for their bonding positions is not required, such as general-purpose electronic components. However, for some electronic components, such as IC chips, to which particularly high precision for their bonding positions is required, this would matter.

As an example of a conventional electronic component mounting method corresponding to a flip chip bonding method intended to solve such issues of the collective reflow mounting method as described above, a method including the step of simultaneously heating and pressing electronic components onto a circuit board to thereby subject the electronic components individually to reflow soldering, thus achieving electronic component mounting, (hereinafter, described as a conventional local reflow mounting method) is shown FIGS. 23A-23D.

As shown in FIG. 23A, solder paste is fed by printing or the like onto pads 94a, which are a plurality of electrodes on a top surface of a plate-like circuit board 94, so that solder portions 92 are formed on the pads 94a of the circuit board 94, respectively.

Next, as shown in FIG. 23B, an electronic component 91 to which solder bumps 91b are bonded at a plurality of electrodes 91a provided on a bonding surface of the electronic component 91, is sucked and held at its rear surface, which has no electrodes 91a thereon, by a tool 93. After performing a positional alignment that makes the solder bumps 91b of the electronic component 91 bondable with the solder portions 92 on the circuit board 94, respectively, the solder bumps 91b of the electronic component 91 are, while heated, pressed against the solder portions 92 of the circuit board 94, respectively, by which the solder portions 92 and the solder bumps 911b are melted.

Next, as shown in FIG. 23C, while solder is maintained in a molten state, suction and holding of the electronic component 91 by the tool 93 is released. As a result of this, a self alignment effect by surface tension of the molten solder is obtained.

Thereafter, as shown in FIG. 23D, by solidifying the molten solder, the electrodes 91a of the electronic component 91 are bonded to the pads 94a of the circuit board 94, respectively, via the solder, by which the electronic component 91 is individually mounted onto the circuit board 94. In addition, for mounting of a plurality of electronic components 91 onto the circuit board 94, these working steps are iteratively performed so that respective electronic components 91 are mounted onto the circuit board 94, individually.

In such a local reflow mounting method, the electronic component 91 is sucked and held by the tool 93, the solder bumps 91b of the electronic component 91 are pressed against the solder portions 92 of the circuit board 94 while the solder bumps 91b and the solder portions 92 are heated, respectively, by the tool 93, and thereafter suction and holding of the electronic component 91 by the tool 93 is released while the solder is in the molten state. As a result, a self alignment effect by the surface tension of the molten solder is obtained. Thus, even with more or less poor precision of a bonding position of the electronic component 91 by the tool 93, a precision of a bonding position that would not result in defective bonding eventually could be obtained by the self alignment effect.

However, in a case of high-end electronic components of narrowed bump pitches, from among such electronic components as IC chips, with their bump pitch being as narrow as, for example, not more than 150 μm, it is required for electronic components having bumps of such narrow pitches to meet a high precision for a bonding position of, for example, ±5 μm, which would concern a bonding-position shift amount of an electronic component due to a vacuum break blow occurring at releasing of the suction and holding of the electronic component during solder melting, more than the self alignment effect would be concerned in the local reflow mounting method. Therefore, the above-described electronic component mounting performed by the local reflow mounting method, in which suction and holding of an electronic component by the tool is released during a solder's molten state, has had an issue of incapability of mounting high-end electronic components which have bumps of such narrow pitches as shown above and to which high precision for a bonding position is required.

Accordingly, an object of the present invention is to solve the above-described issues and provide an electronic-component mounting method and apparatus which are capable of mounting high-end electronic components having narrow-pitch bumps, and moreover, which are intended for mounting of electronic components onto a circuit board on which general-purpose electronic components and high-end electronic components are to be mixedly mounted. The method and apparatus allow both productivity and quality to be satisfied by changing a method to be used for individual electronic components depending on precision of a bonding position required for individual electronic components.

SUMMARY OF THE INVENTION

In accomplishing these and other aspects, according to a first aspect of the present invention, there is provided a method for mounting an electronic component, comprising, while a plurality of electrodes of an electronic component held by a component holding member and a plurality of electrodes of a circuit board are in contact with bonding members interposed therebetween: heating and thereby melting the bonding members; cooling and thereby solidifying the bonding members; and thereafter releasing the electronic component from suction and holding by the component holding member.

According to a second aspect of the present invention, there is provided a method for mounting an electronic component, comprising:

sucking and holding an electronic component, having a plurality of electrodes, by a component holding member;

performing positional alignment so that the electrodes of the electronic component and a plurality of electrodes of a circuit board become bondable with each other;

moving down the component holding member with the electronic component sucked and held thereon;

while the electrodes of the electronic component and the electrodes of the circuit board are kept in contact with bonding members, respectively, interposed therebetween, heating and thereby melting the bonding members, and cooling and thereby solidifying the bonding members; and thereafter releasing the electronic component from suction and holding by the component holding member.

According to a third aspect of the present invention, there is provided the method for mounting an electronic component according to the second aspect, wherein the bonding members are preliminarily fed at least either onto respective electrodes of the electronic component or onto respective electrodes of the circuit board.

According to a fourth aspect of the present invention, there is provided the method for mounting an electronic component according to the second aspect, wherein the bonding members are solder.

According to a fifth aspect of the present invention, there is provided the method for mounting an electronic component according to the second aspect, wherein flux is preliminarily fed onto respective electrodes of the electronic component, or onto respective electrodes of the circuit board, or onto the bonding members.

According to a sixth aspect of the present invention, there is provided the method for mounting an electronic component according to the second aspect, wherein the bonding members are solder bumps formed on respective electrodes of the electronic component, or solder bumps formed on the respective electrodes of the electronic component and solder portions formed on respective electrodes of the circuit board.

According to a seventh aspect of the present invention, there is provided a method for mounting an electronic component, comprising:

sucking and holding an electronic component, having a plurality of electrodes, by a component holding member;

performing positional alignment so that the electrodes of the electronic component and a plurality of electrodes of a circuit board become bondable with each other via bonding members interposed therebetween;

moving down the component holding member with the electronic component sucked and held thereon;

detecting contact between either the electrodes of the electronic component or the electrodes of the circuit board and the bonding members respectively interposed therebetween;

after detection of this contact, heating and thereby melting the bonding members; and cooling and thereby solidifying the bonding members.

According to an eighth aspect of the present invention, there is provided the method for mounting an electronic component according to the seventh aspect, wherein the detection of the contact is fulfilled by detecting that a load, which is actually generated upon contact between either the electrodes of the electronic component or the electrodes of the circuit board and the bonding member interposed therebetween, exceeds a contact load which is expected to be generated upon the contact.

According to a ninth aspect of the present invention, there is provided the method for mounting an electronic component according to the seventh aspect, wherein under such control of the component holding member that the component holding member is moved down in very small steps, in response to a load actually generated upon contact between either the electrodes of the electronic component or the electrodes of the circuit board and the bonding members respectively interposed therebetween, the detection of contact is fulfilled by detecting that the load actually generated upon the contact exceeds a contact load which is expected to be generated upon the contact.

According to a tenth aspect of the present invention, there is provided the method for mounting an electronic component according to the seventh aspect, further comprising releasing suction and holding of the electronic component by the component holding member after solidification of the bonding members.

According to a eleventh aspect of the present invention, there is provided the method for mounting an electronic component according to the seventh aspect, wherein the bonding members are preliminarily fed at least either onto respective electrodes of the electronic component or onto respective electrodes of the circuit board.

According to a twelfth aspect of the present invention, there is provided the method for mounting an electronic component according to the seventh aspect, wherein the bonding members are solder.

According to a thirteenth aspect of the present invention, there is provided the method for mounting an electronic component according to the seventh aspect, wherein flux is preliminarily fed onto respective electrodes of the electronic component, or onto respective electrodes of the circuit board, or onto the bonding members.

According to a fourteenth aspect of the present invention, there is provided the method for mounting an electronic component according to the seventh aspect, wherein the bonding members are solder bumps formed on respective electrodes of the electronic component, or solder bumps formed on the respective electrodes of the electronic component and solder portions formed on respective electrodes of the circuit board.

According to a fifteenth aspect of the present invention, there is provided the method for mounting an electronic component according to the seventh aspect, further comprising:

detecting contact between either the electrodes of the electronic component or the electrodes of the circuit board and the bonding members interposed therebetween;

deciding whether or not an elongation-amount correction of the component holding member by heating is performed;

if the elongation-amount correction of the component holding member is performed, then melting individual bonding members between the electrodes of the electronic component and the electrodes of the circuit board by this heating, while causing the component holding member to be moved up, based on data concerning elongation-amount variations of the component holding member by the heating; and if the elongation-amount correction of the component holding member is not performed, then melting the bonding members between the electrodes of the electronic component and the electrodes of the circuit board by heating;

after a start of cooling of molten bonding members, deciding whether or not a shrinkage-amount correction of the component holding member by the cooling is performed; and if the shrinkage-amount correction of the component holding member is performed, then solidifying individual bonding members between the electrodes of the electronic component and the electrodes of the circuit board by the cooling, while causing the component holding member to be moved down, based on data concerning shrinkage-amount variations of the component holding member by the cooling; and if the shrinkage-amount correction of the component holding member is not performed, then solidifying the bonding members between the electrodes of the electronic component and the electrodes of the circuit board by cooling.

According to a sixteenth aspect of the present invention, there is provided the method for mounting an electronic component according to the seventh aspect, further comprising:

detecting contact between either the electrodes of the electronic component or the electrodes of the circuit board and the bonding members interposed therebetween; and melting individual bonding members between the electrodes of the electronic component and the electrodes of the circuit board by heating, while causing the component holding member to be moved down, based on data concerning elongation-amount variations of the component holding member by the heating.

According to a seventeenth aspect of the present invention, there is provided the method for mounting an electronic component according to the seventh aspect, further comprising:

after a start of cooling of molten bonding members, solidifying individual bonding members between the electrodes of the electronic component and the electrodes of the circuit board by the cooling, while causing the component holding member to be moved down, based on data concerning shrinkage-amount variations of the component holding member by the cooling.

According to an eighteenth aspect of the present invention, there is provided the method for mounting an electronic component according to the seventh aspect, further comprising:

after detection of contact between either the electrodes of the electronic component or the electrodes of the circuit board and the bonding members interposed therebetween, maintaining a load, which is actually generated between the electrodes by this contact, at a generally constant level; and after a start of melting of the bonding members by heating, releasing maintaining of the actually generated load and maintaining a contact height position of the electronic components relative to the circuit board at a generally constant position.

According to a nineteenth aspect of the present invention, there is provided the method for mounting an electronic component according to the eighteenth aspect, wherein the start of the melting of the bonding members is a time when a decrease of the load generated between the electrodes by the contact is detected.

According to a twentieth aspect of the present invention, there is provided the method for mounting an electronic component according to the seventh aspect, further comprising:

after sucking and holding of the electronic component by the component holding member, making the bonding members preliminarily fed onto respective electrodes of the electronic component uniform in feed height, and performing positional alignment between the electronic component and the circuit board so that the electrodes of the electronic component and the electrodes of the circuit board become bondable with each other.

According to a twenty-first aspect of the present invention, there is provided the method for mounting an electronic component according to the seventh aspect, for use in a case where two types of electronic components, a first electronic component and a second electronic component, are mounted onto the circuit board, wherein the second electronic component is required to be mounted to the circuit board with a higher bonding position precision than that required for the first electronic component, the method further comprising:

sucking and holding the first electronic component by a component holding member;

performing a positional alignment so that a plurality of electrodes of the first electronic component and a plurality of electrodes of the circuit board become bondable with each other via bonding members interposed therebetween;

moving down the component holding member with the first electronic component sucked and held thereon, and pressing respective electrodes of the first electronic component and respective electrodes of the circuit board, with the bonding members interposed therebetween, to fulfill temporary bonding;

heating and thereby melting the bonding members between temporarily bonded respective electrodes of the first electronic component and respective electrodes of the circuit board, cooling and thereby solidifying the bonding members to fulfill final bonding, and mounting the respective electrodes of the first electronic component to the respective electrodes of the circuit board via the bonding members interposed therebetween; and thereafter mounting the second electronic component onto the circuit board which has a plurality of electrodes bondable with electrodes of the second electronic component, respectively, and on which the first electronic component has been mounted.

According to a twenty-second aspect of the present invention, there is provided an apparatus for mounting an electronic component by sucking and holding an electronic component by a component holding member and bonding a plurality of electrodes of the electronic component and a plurality of electrodes of a circuit board to each other via bonding members interposed therebetween, the apparatus comprising:

a suction-and-holding mechanism for sucking and holding the electronic component onto the component holding member;

an up-and-down moving mechanism for moving up or down the component holding member;

a frame section for placing the circuit board thereon;

a heating mechanism for heating the bonding members;

a cooling mechanism for cooling the bonding members; and a control part which is capable of controlling the suction-and-holding mechanism, the up-and-down moving mechanism, the heating mechanism and the cooling mechanism, and which performs: while controlling the up-and-down moving mechanism so that the electronic component sucked and held by the component holding member is kept in contact with the circuit board, controlling the heating mechanism for heating and thereby melting the bonding members; thereafter controlling the cooling mechanism for cooling and thereby solidifying the bonding members; and, after solidification of the bonding members, controlling the suction-and-holding mechanism for releasing the suction and holding of the electronic component.

According to a twenty-third aspect of the present invention, there is provided an apparatus for mounting an electronic component by sucking and holding an electronic component by a component holding member, and, while keeping a plurality of electrodes of the electronic component and a plurality of electrodes of a circuit board in contact with bonding members interposed therebetween, heating and thereby melting the bonding members, thus bonding the electrodes of the electronic component onto the electrodes of the circuit board, respectively, via the bonding members interposed therebetween, the apparatus comprising:

a suction-and-holding mechanism for sucking and holding the electronic component onto the component holding member;

an up-and-down moving mechanism for moving up or down the component holding member;

a frame section for placing the circuit board thereon;

a heating mechanism for heating the bonding members;

a cooling mechanism for cooling the bonding members; and a control part which is capable of controlling the suction-and-holding mechanism, the up-and-down moving mechanism, the heating mechanism and the cooling mechanism, and which performs: controlling the heating mechanism for heating and thereby melting the bonding members, and thereafter controlling the cooling mechanism for cooling and thereby solidifying the bonding members, and moreover; controlling the suction-and-holding mechanism for sucking and holding the electronic component by the component holding member even during melting of the bonding members by the heating mechanism; and after cooling and solidification of the bonding members by the cooling mechanism under control of the control part, causing the electronic component to be released from the suction and holding of the suction-and-holding mechanism.

According to a twenty-fourth aspect of the present invention, there is provided an apparatus for mounting an electronic component by sucking and holding an electronic component by a component holding member, putting a plurality of electrodes of the electronic component and a plurality of electrodes of a circuit board into contact with bonding members interposed therebetween, and heating and thereby melting the bonding members, thus bonding the electrodes of the electronic component and the electrodes of the circuit board with each other, respectively, via the bonding members interposed therebetween, the apparatus comprising:

a suction-and-holding mechanism for sucking and holding the electronic component onto the component holding member;

an up-and-down moving mechanism for moving up or down the component holding member;

a load detecting section for detecting a contact load generated between the electrodes of the electronic component and the electrodes of the circuit board upon contact between either the electrodes of the electronic component or the electrodes of the circuit board and the bonding members respectively interposed therebetween, with the contact resulting from moving down, by virtue of the up-and-down moving mechanism, the component holding member that is sucking and holding the electronic component by the suction-and-holding mechanism;

a heating mechanism for heating the bonding members;

a cooling mechanism for cooling the bonding members heated by the heating mechanism; and a control part which is capable of controlling the suction-and-holding mechanism, the up-and-down moving mechanism, the load detecting section, the heating mechanism and the cooling mechanism, and which performs: after detection of a contact load by the load detecting section, causing the bonding members to be melted by heating performed by the heating mechanism; and thereafter causing the bonding members to be cooled and solidified by the cooling mechanism, and moreover which is capable of controlling up-and-down movement operations of the component holding member by the up-and-down moving mechanism in response to the contact load detected by the load detecting section during a period from the contact between either the electrodes of the electronic component or the electrodes of the circuit board and the bonding members interposed therebetween until the melting of the bonding members.

According to a twenty-fifth aspect of the present invention, there is provided the apparatus for mounting an electronic component according to the twenty-fourth aspect, wherein the detection of a contact load is fulfilled by the control part by detecting that a load which is actually generated upon the contact between either the electrodes of the electronic component or the electrodes of the circuit board and the bonding members respectively interposed therebetween, and which is detected by the load detecting section, exceeds a contact load which is expected to be generated upon the contact.

According to a twenty-sixth aspect of the present invention, there is provided the apparatus for mounting an electronic component according to the twenty-fourth aspect, wherein the detection of the contact load is fulfilled by the control part by detecting that a load generated as a result of moving down the component holding member in very small steps by the up-and-down moving mechanism in response to a load actually generated upon the contact between either the electrodes of the electronic component or the electrodes of the circuit board and the bonding members respectively interposed therebetween, and which is detected by the load detecting section, exceeds a contact load which is expected to be generated upon the contact.

According to a twenty-seventh aspect of the present invention, there is provided the apparatus for mounting an electronic component according to the twenty-fourth aspect, wherein the control part performs: maintaining the suction and holding of the electronic component to the component holding member by the suction-and-holding mechanism even during the melting of the bonding members by the heating mechanism; and after the solidification by the cooling of the bonding members by the cooling mechanism, under control of the control part, releasing the electronic component from the suction and holding to the component holding member by the suction-and-holding mechanism.

According to a twenty-eighth aspect of the present invention, there is provided the apparatus for mounting an electronic component according to the twenty-fourth aspect, wherein during a period from when the electrodes of the electronic component and the electrodes of the circuit board are aligned with each other, with the bonding members interposed therebetween, until the component holding member sucking and holding the electronic component is moved down, the control part sets a load detected by the load detecting section to a load-zero point in the load detecting section.

According to a twenty-ninth aspect of the present invention, there is provided an apparatus for mounting an electronic component by sucking and holding an electronic component by a component holding member, putting a plurality of electrodes of the electronic component and a plurality of electrodes of a circuit board into contact with bonding members interposed therebetween, and heating and thereby melting the bonding members, thus bonding the electrodes of the electronic component and the electrodes of the circuit board with each other, respectively, via the bonding members interposed therebetween, the apparatus comprising:

a suction-and-holding mechanism for sucking and holding the electronic component onto the component holding member;

an up-and-down moving mechanism for moving up or down the component holding member;

a load detecting section for detecting a contact load generated between the electrodes of the electronic component and the electrodes of the circuit board upon contact between either the electrodes of the electronic component or the electrodes of the circuit board and the bonding members respectively interposed therebetween, with the contact resulting from moving down, by the up-and-down moving mechanism, the component holding member that is sucking and holding the electronic component by the suction-and-holding mechanism;

a heating mechanism for heating the bonding members; and a cooling mechanism for cooling the bonding members heated by the heating mechanism, wherein the component holding member comprises a component-holding-member tip portion and a component-holding-member body portion, the component-holding-member tip portion comprises the suction-and-holding mechanism, the heating mechanism, the cooling mechanism and a shaft portion, the component-holding-member body portion comprises a support portion for supporting the component-holding-member tip portion, and the load detecting section fitted to the support portion, centers of the suction-and-holding mechanism, the heating mechanism, the shaft portion and the load detecting section are placed coaxially on an identical axis, and their identical axis is placed parallel to an axis of up-and-down operations of the component holding member caused by the up-and-down moving mechanism, and the load detecting section is capable of detecting a load of the component-holding-member tip portion acting toward the shaft portion by an arrangement such that an end portion of the shaft portion in the component-holding-member tip portion is pressed against a load-detecting surface of the load detecting section by an elastic member fitted to the support portion and supporting the shaft portion.

According to a thirtieth aspect of the present invention, there is provided the apparatus for mounting an electronic component according to the twenty-ninth aspect, wherein the component holding member further includes a pressing mechanism for pressing the electronic component against the circuit board, the pressing mechanism has two pneumatic cylinders different in inner diameter from each other, out of the two pneumatic cylinders, one pneumatic cylinder is provided in the component-holding-member body portion and the other cylinder is provided in the component-holding-member tip portion, and wherein the component holding member is so constituted as to have a pressing function for pressing the electrodes of the electronic component sucked and held by the suction-and-holding mechanism and the electrodes of the circuit board against the bonding members interposed therebetween, by selecting and actuating one pneumatic cylinder of an inner diameter suited to a contact load, from among the two pneumatic cylinders, to move down the component-holding-member tip portion on the identical axis, at least one pneumatic cylinder, out of the two pneumatic cylinders, includes a restricting mechanism for mechanically restricting operations of the at least one pneumatic cylinder, and the restricting mechanism restricts operations of the at least pneumatic cylinder in a state that the at least one pneumatic cylinder presses the other pneumatic cylinder, thereby restricting operations of the pneumatic cylinders so that the pressing function of the component holding member is restricted.

According to a thirty-first aspect of the present invention, there is provided the apparatus for mounting an electronic component according to the thirtieth aspect, wherein the restricting mechanism provided in the at least one pneumatic cylinder includes a cylindrical guide and a columnar rod disposed inside the guide, is provided with a groove-like recessed portion formed on an outer circumference of a columnar side face of the rod, a hole formed on the cylindrical side face of the guide at a position that can be coincident with the recessed portion of the rod, and a bar member which extends through the hole of the guide and which is fittable inside the recessed portion of the rod, and wherein the restricting mechanism exerts an operational restriction on the at least one pneumatic cylinder by making the bar member extend from outside of the guide through the hole of the guide and further into the recessed portion of the rod.

According to a thirty-second aspect of the present invention, there is provided the apparatus for mounting an electronic component according to the twenty-fourth aspect, wherein out of the two pneumatic cylinders different in inner diameter from each other in the pressing mechanism, a large cylinder having a larger inner diameter is provided in the component-holding-member body portion, and a small cylinder having a smaller inner diameter is provided in the component-holding-member tip portion, and wherein centers of the large cylinder and the small cylinder are placed coaxially on an identical axis, the large cylinder includes the restricting mechanism, in the component-holding-member body portion, the guide of the large cylinder is fitted to an end portion of the support portion and the rod of the large cylinder is fitted to the load detecting section, and in the component-holding-member tip portion, the guide of the small cylinder is fitted to the end portion of the shaft portion and the rod of the small cylinder is set so as to be contactable with the load-detecting surface of the load detecting section.

BRIEF DESCRIPTION OF THE DRAWINGS

These and other aspects and features of the present invention will become clear from the following description taken in conjunction with the preferred embodiments thereof with reference to the accompanying drawings, in which:

FIGS. 2A-2F are views showing an electronic component mounting method according to the first embodiment, wherein FIG. 2A is a sectional view of a circuit board, FIG. 2B is a sectional view of an electronic component and the circuit board in a state that the electronic component is aligned with the circuit board, FIG. 2C is a sectional view of the electronic component and the circuit board in a state that the electronic component and the circuit board are associated with each other, FIG. 2D is a sectional view of the electronic component and the circuit board in a state that solder bumps of the electronic component and solder portions of the circuit board are being heated and melted, FIG. 2E is a sectional view of the electronic component and the circuit board in a state that molten solder is being cooled, and FIG. 2F is a sectional view of the circuit board in a state that the electronic component has been mounted thereon;

FIGS. 9A-9D are vibration operational pattern views of a shaping operation of the head tool in the electronic component mounting method according to the first embodiment, wherein FIG. 9A is a cross-shape operational pattern view, FIG. 9B is an O-shape operational pattern view, FIG. 9C is an 8-shape (longitudinal) operational pattern view, and FIG. 9D is an 8-shape (lateral) operational pattern view;

FIGS. 10A-10C are time charts showing operations of the head tool in the electronic component mounting method according to the first embodiment, wherein FIGS. 10A, 10B and 10C are time charts showing time-varying states of head tool control height, suction nozzle tip height and suction-nozzle temperature, respectively;

FIGS. 12A-12D are views showing an electronic component mounting method according to a second embodiment of the invention, wherein FIG. 12A is a sectional view of a circuit board in a state that a flux portion is being formed on the circuit board, FIG. 12B is a sectional view of the circuit board in a state that general-purpose electronic components are being temporarily bonded, FIG. 12C is a sectional view of the circuit board in a state that the general-purpose electronic components temporarily bonded to the circuit board are under collective reflow, and FIG. 12D is a sectional view of the circuit board in a state that the general-purpose electronic components have been mounted thereon;

FIGS. 13E-13H are views showing the electronic component mounting method according to the second embodiment, wherein FIG. 13E is a sectional view of a circuit board in a state that flux portions are being formed on the circuit board, FIG. 13F is a sectional view of a high-end electronic component and the circuit board in a state that the high-end electronic component is being aligned with the circuit board, FIG. 13G is a sectional view of the circuit board in a state that the high-end electronic component is associated with the circuit board while solder is being heated and melted, and FIG. 13H is a sectional view of the circuit board in a state that the general-purpose electronic components and the high-end electronic component have been mounted thereon;

FIGS. 24A-24E are views showing a modification example of the electronic component mounting method according to the first embodiment, wherein FIG. 24A is a sectional view of an electronic component and a circuit board in a state that the electronic component is aligned with the circuit board, FIG. 24B is a sectional view of the electronic component and the circuit board in a state that the electronic component and the circuit board are associated with each other, FIG. 24C is a sectional view of the electronic component and the circuit board in a state that the electronic component and the circuit board have been put into a stronger association state with each other by applying a further load thereto, FIG. 24D is a sectional view of the electronic component and the circuit board in a state that solder portions of the circuit board are being heated and melted, and FIG. 24E is a sectional view of the circuit board in a state that the electronic component has been mounted thereon.

DETAILED DESCRIPTION OF THE PREFERRED EMBODIMENTS

Figure 1:
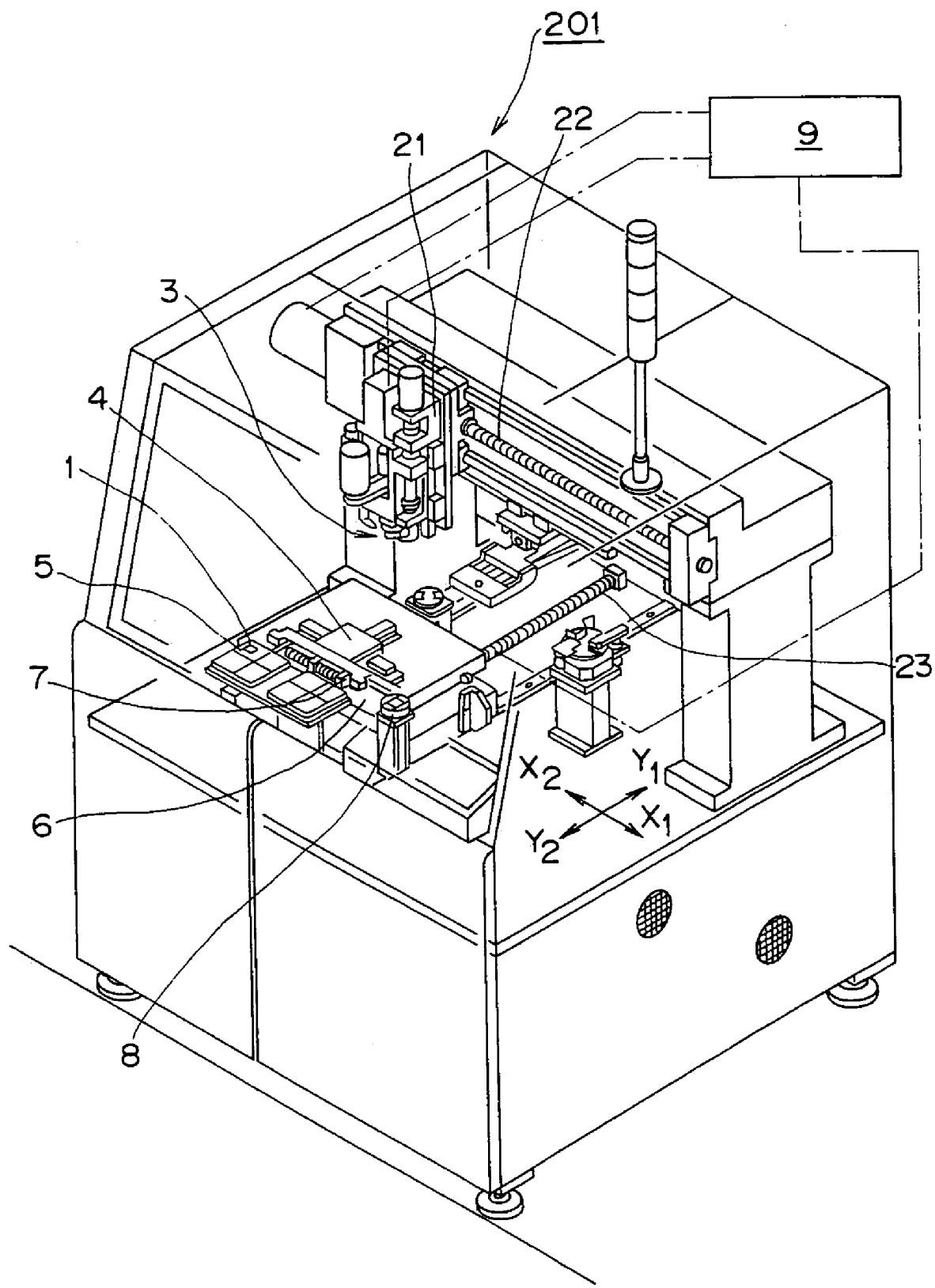
FIG. 1 is an overall perspective view of an electronic component mounting apparatus according to a first embodiment of the invention.

Before description of the present invention proceeds, it is to be noted that like parts are designated by like reference numerals throughout the accompanying drawings.

Hereinbelow, embodiments of the present invention are described in detail with reference to the accompanying drawings.

First Embodiment

An electronic component mounting method and apparatus according to the present invention relate to an electronic component mounting method and apparatus including steps of placing a plurality of electrodes of an electronic component and a plurality of electrodes of a circuit board into a state of contact with bonding members interposed therebetween, and causing the bonding members to be individually melted and solidified so that the electronic component is bonded to the circuit board via the bonding members therebetween. An electronic component mounting method and apparatus according to the first embodiment of the invention is described in detail with reference to the accompanying drawings.

Figure 3:
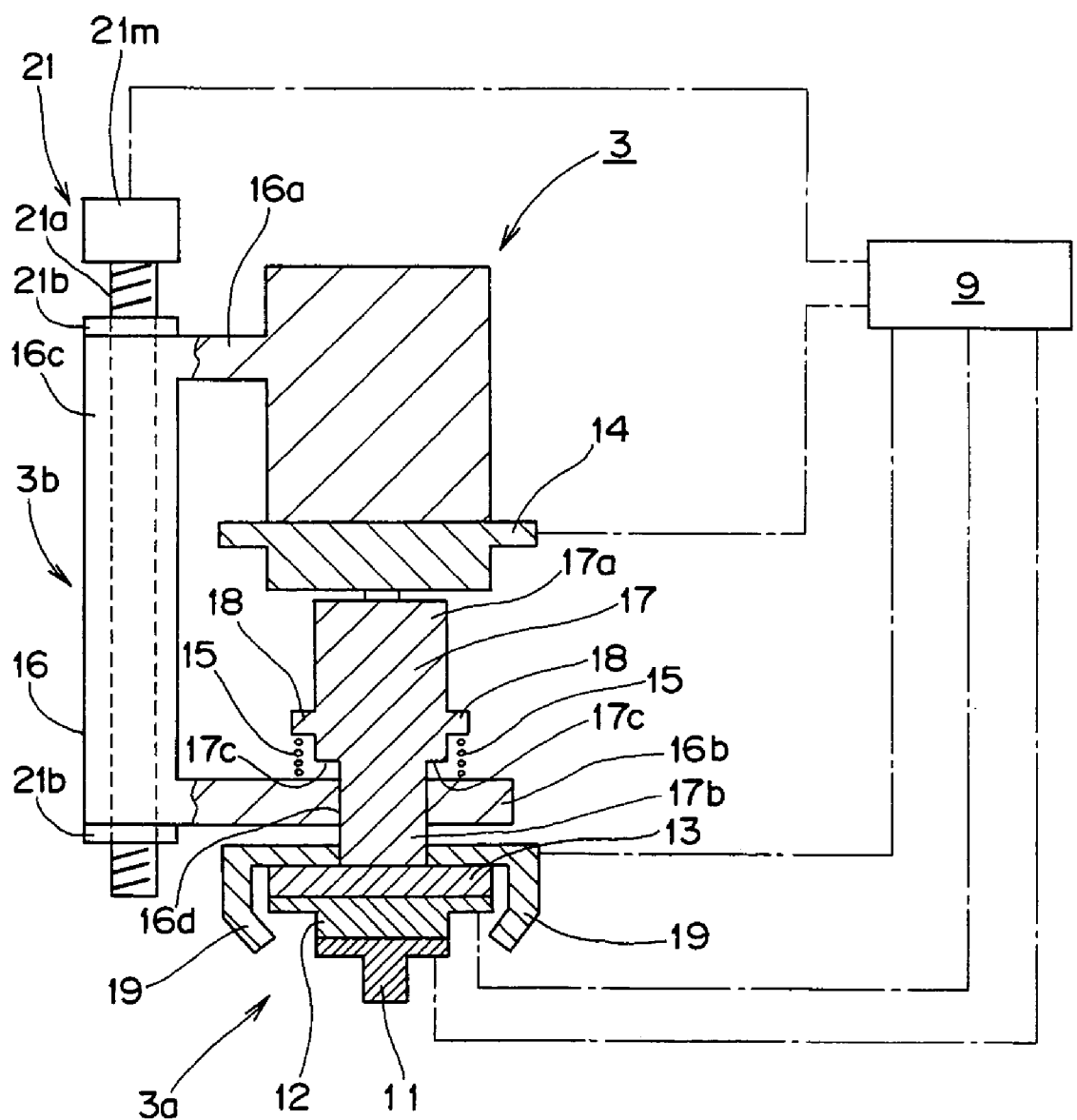
FIG. 3 is a sectional view of a head tool schematically showing a structure of the head tool in the electronic component mounting apparatus according to the first embodiment.

As shown in FIG. 1, referring to an electronic component mounting apparatus 201, a head tool 3, which is an example of a component holding member for performing electronic component mounting, is fixed to a nut portion of an X-direction moving mechanism 22. The X-direction moving mechanism 22 rotates a ball screw shaft by a motor so that the head tool 3 fixed to the nut portion, screwed to the ball screw shaft, is moved in an X1 direction rightward of an X direction shown in the figure or an X2 direction leftward thereof. Also, as shown in FIG. 3, which is a schematic sectional view of the head tool 3, the electronic component mounting apparatus 201 includes an up/down moving unit 21, which is an example of an up/down moving mechanism, for moving down or up the head tool 3. The head tool 3 further comprises: a suction nozzle 11, which is an example of a suction-and-holding mechanism, for sucking and holding an electronic component at its tip portion; a ceramic heater 12, which is an example of a heating mechanism, for heating the suction nozzle 11 to thereby heat the electronic component sucked and held by the suction nozzle 11; and a cooling blow nozzle 19, which is an example of a cooling mechanism, for cooling the electronic component heated by the ceramic heater 12. In this case, although the heating mechanism is given here by the ceramic heater 12 provided on the head tool 3 as an example, another case may be one in which the electronic component mounting apparatus includes, instead of the ceramic heater 12, a heating part provided on a frame section on which a circuit board is to be placed, or a heating part that performs heating by blowing hot air against an electronic component and the circuit board. It is noted that structure of the head tool 3 will be described in detail later.

Referring to FIG. 1, a slide base 6 is fixed to a nut portion of a Y-direction moving mechanism 23. The Y-direction moving mechanism 23 rotates a ball screw shaft by a motor so that the slide base 6 fixed to the nut portion, screwed to the ball screw shaft, is moved in a Y1 direction rightward of a Y direction shown in the figure or a Y2 direction leftward thereof. A plurality of electronic components 1 are fed to a component tray 5 fixed on the slide base 6, and a circuit board 4 is positioned and fixed to a stage 7, which is an example of a frame section fixed on the slide base 6. In addition, the X direction and the Y direction in FIG. 1 are perpendicular to each other.

The electronic component mounting apparatus 201 further includes a control part 9 which is a control part for performing control of individual constituent parts in the electronic component mounting apparatus 201. Moving operation of the up/down moving unit 21, moving operation of the X-direction moving mechanism 22, moving operation of the Y-direction moving mechanism 23, sucking and holding operation of the suction nozzle 11 of the head tool 3, and heating operation of the ceramic heater 12 of the head tool 3 are controlled by the control part 9.

Figure 2A:
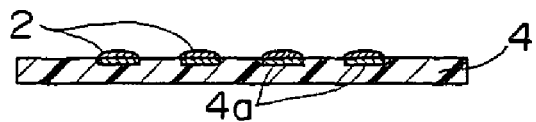
Figure 2B:
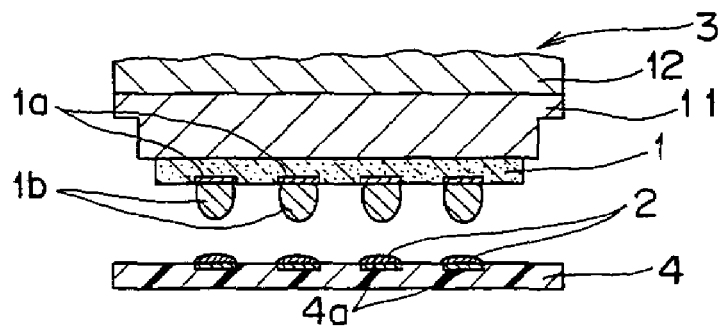

FIGS. 2A-2F are schematic sectional views of the electronic component 1 and the circuit board 4, schematically showing the electronic component mounting method according to the first embodiment. As shown in FIG. 2B, rectangular-plate like shaped electronic component 1 has a multiplicity of electrodes 1a on a bonding surface of the electronic component 1, and solder bumps 1b, which are bonding members, have preliminarily been formed on the electrodes 1a, respectively. Also, as shown in FIG. 2A, rectangular-plate like shaped circuit board 4 has pads 4a, which are a multiplicity of electrodes, on a top surface of the circuit board, and solder, which corresponds to bonding members, has preliminarily been fed by printing or the like so that solder portions 2 are formed on the pads 4a, respectively. The pads 4a of the circuit board 4 are placed at positions corresponding to the electrodes 1a of the electronic component 1, respectively, so that the electrodes 1a of the electronic component 1 and the pads 4a of the circuit board 4 can be bonded together. In this case, the electronic component 1 is, for example, a high-end electronic component to which high precision of a bonding position is required, such as a high-end IC chip having a 150 μm or less bump pitch, which is an interval pitch of the solder bumps 1b formed on the electrodes 1a of the electronic component. In addition, the circuit board 4 may be any one of such circuit boards as resin boards, paper-phenol boards, ceramic boards, glass epoxy boards and film boards, or such circuit blocks as single layer boards or multilayer boards, or such object articles having circuits formed thereon as component parts, casings or frames.

Next, the method for mounting the electronic component 1 onto the circuit board 4 by using the electronic component mounting apparatus 201 is explained.

First, referring to FIG. 1, the slide base 6, to which is fixed the component tray 5 with a multiplicity of electronic components 1 fed thereto and placed thereon, is moved in the Y1 or Y2 direction by the Y-direction moving mechanism 23, and moreover the head tool 3 is moved in the X1 or X2 direction by the X-direction moving mechanism 22, by which the head tool 3 is aligned with one electronic component 1 placed in the component tray 5 so that this electronic component 1 becomes suckable by the suction nozzle 11 provided at the tip portion of the head tool 3. Thereafter, the head tool 3 is moved down by the up/down moving unit 21, thereby sucking and holding the electronic component 1 at its rear surface, that has no electrodes 1a, by the suction nozzle 11 of the head tool 3. Then, the head tool 3 is moved up by the up/down moving unit 21, and the electronic component 1 is removed from the component tray 5. It is noted that although the electronic component 1 is placed with its rear surface up in the component tray 5 in the above-described case, a case may be that the electronic component 1 is placed with its rear surface down, in which case also, suction and holding of the electronic component 1 at its rear surface by the suction nozzle 11 is enabled by providing an inversion mechanism for inverting the electronic component 1 before the suction and holding of the electronic component 1 to the suction nozzle 11 of the head tool 3. In addition, a case may also be that with a wafer feed section provided, the electronic components 1 are fed from wafers instead of a feed of the electronic components 1 from the component tray 5.

Next, referring to FIG. 1, the slide base 6, to which is fixed the stage 7 with the circuit board 4 fixed thereon, is moved in the Y1 or Y2 direction by the Y-direction moving mechanism 23, and moreover the head tool 3 with the electronic component 1 sucked and held thereto is moved in the X1 or X2 direction by the X-direction moving mechanism 22, by which the electronic component 1 and the circuit board 4 are aligned with each other, as shown in FIG. 2B, so that the solder bumps 1b formed on the electrodes 1a of the electronic component 1 become bondable to the solder portions 2 on the pads 4a of the circuit board 4, respectively.

Figure 2C:
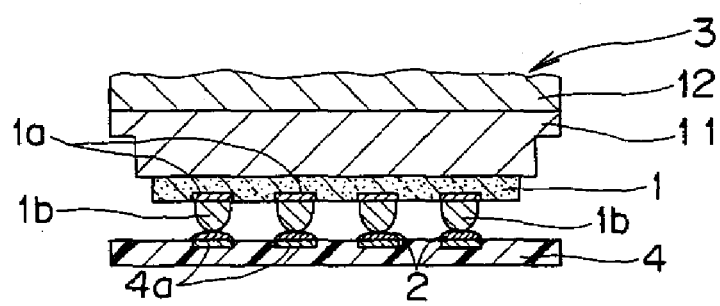

Thereafter, as shown in FIG. 2C, the head tool 3 is moved down by the up/down moving unit 21, by which the solder bumps 1b of the electronic component 1 sucked and held by the suction nozzle 11 are put into contact with the solder portions 2, respectively, of the circuit board 4 fixed to the stage 7.

Figure 2D:
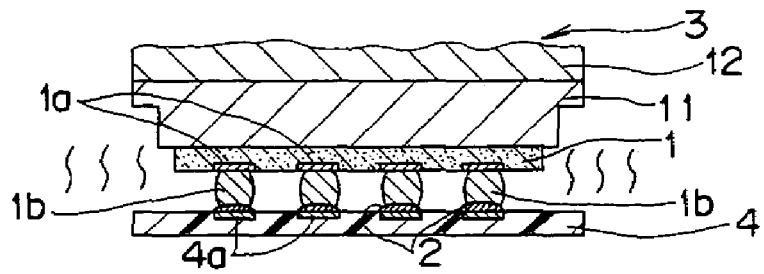

After this contact, as shown in FIG. 2D, the suction nozzle 11 is heated by the ceramic heater 12 of the head tool 3 so that the solder bumps 1b of the electronic component 1 sucked and held by the suction nozzle 11, as well as the solder portions 2 of the circuit board 4 kept in contact with these solder bumps, are heated. Further, a heating temperature for the suction nozzle 11 by the ceramic heater 12 is increased to a temperature not less than a melting point of solder forming the solder bumps 1b and not less than a melting point of solder forming the solder portions 2, and thus the solder bumps 1b and the solder portions 2 are melted. As to an atmosphere for such melting process, whereas the melting process is performed in air of an environment under which the electronic component mounting apparatus 201 is installed (e.g., clear air), a case may alternatively be that the atmosphere is an inert gas atmosphere (e.g., N2 atmosphere) to obtain a successful molten state.

Figure 2E:
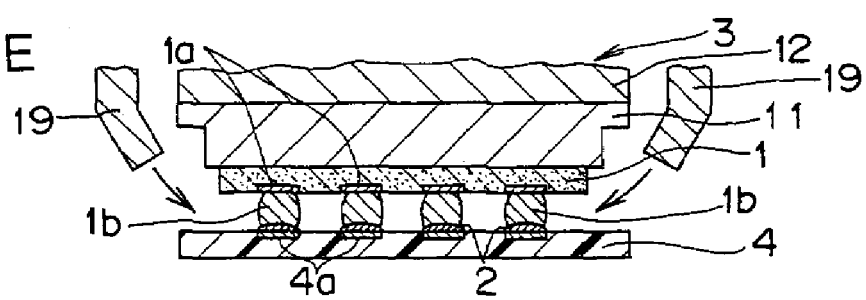

Thereafter, as shown in FIG. 2E, with the heating by the ceramic heater 12 stopped, molten solder is subjected to cooling by blows from the cooling blow nozzle 19, with the solder being thereby solidified so that the electrodes 1a of the electronic component 1 and the pads 4a of the circuit board 4 are bonded together, respectively, via the solder. Alternatively, the solder may also be solidified by natural cooling of the molten solder, instead of the forced cooling of the molten solder by the cooling blow nozzle 19.

Figure 2F:
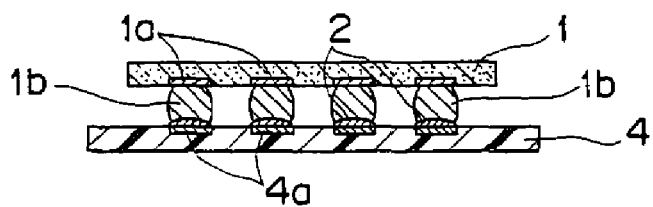

Thereafter, as shown in FIG. 2F, the sucking and holding of the electronic component 1 by the suction nozzle 11 at the tip portion of the head tool 3 is released, and the head tool 3 is moved up by the up/down moving unit 21. In addition, for mounting of a plurality of electronic components 1 onto the circuit board 4, these working steps are iteratively performed for each electronic component 1 so that respective electronic components 1 are mounted onto the circuit board 4.

Although the above description has been made for a case where the bonding members are the solder bumps 1b preliminarily formed on the electrodes 1a of the electronic component 1 as well as the solder portions 2 preliminarily formed on the pads 4a of the circuit board 4, the bonding members may also be only the solder bumps 1b preliminarily formed on the electrodes 1a of the electronic component 1.

Furthermore, flux that can remove surface oxide films at individual bonding portions and enhance wettability of molten solder may preliminarily be supplied by coating the flux onto the electrodes 1a of the electronic component 1 or onto the pads 4a of the circuit board 4, or onto the solder bumps 1b or the solder portions 2, which are both the bonding members. In addition, depending on a type of flux supplied by coating, there are some cases where the flux supplied by coating is removed by cleaning after mounting of the electronic component 1 onto the circuit board 4.

Next, the structure of the head tool 3 in the electronic component mounting apparatus 201 is explained in detail with reference to FIG. 3, which is a sectional view schematically showing the structure of the head tool 3.

Referring to FIG. 3, the head tool 3 includes a head-tool tip portion 3a for performing sucking and holding, and heating or other operations on the electronic component 1, and a head-tool body portion 3b for supporting the head-tool tip portion 3a and exercising up-and-down operations on the head tool 3.

The head-tool tip portion 3a includes, as viewed from its tip side, the suction nozzle 11 capable of sucking and holding the electronic component 1, the ceramic heater 12 for heating the electronic component 1 sucked and held by the suction nozzle 11, a water jacket 13 which is a cooling part for intercepting heat so that heat derived from the ceramic heater 12 is not transferred to the head-tool body portion 3b, and a shaft 17 which is an example of a shaft portion fitted to an upper portion of the water jacket 13. The cooling blow nozzle 19 for cooling by blowing the electronic component 1 heated by the ceramic heater 12 is further fitted around a periphery of a lower-portion of the shaft 17.

The head-tool body portion 3b includes a frame 16, which is an example of a support portion, for supporting the head-tool tip portion 3a and a load cell 14, which is an example of a load detector portion on the frame 16.

The frame 16, which is formed of a rigid body into a generally U shape, includes an upper frame 16a for supporting the load cell 14, a lower frame 16b for supporting the shaft 17 of the head-tool tip portion 3a via a self-weight balancing spring 15, which is an example of an elastic member, fitted to a lower portion of an annular-protrusion shaped spring holder portion 18 provided at a side portion of the shaft 17 so as to surround an outer periphery of the shaft 17, and a cylindrical-shaped intermediate frame 16c for supporting the upper frame 16a and the lower frame 16b. The lower frame 16b further serves for guiding up-and-down motions of the shaft 17.

The shaft 17 has a stepped portion 17c nearly intermediate of its axial direction, wherein with the stepped portion 17c serving as a boundary, the shaft 17 has a shaft lower portion 17b smaller in diameter than a shaft upper portion 17a. Further, this shaft lower portion 17b extends through a hole 16d formed in the lower frame 16b supporting the shaft 17 via the self-weight balancing spring 15, wherein the hole 16d of the lower frame 16b is formed so as to be capable of guiding up-and-down motions of the shaft 17, and is smaller in diameter than the shaft upper portion 17a. As a result of this, the shaft 17 can be guided by the hole 16d of the lower frame 16b to move up and down while supported by the lower frame 16b via the self-weight balancing spring 15. Also, even if the self-weight balancing spring 15 has become no longer capable of supporting the shaft 17 due to damage or the like, a peripheral portion of the hole 16d of the lower frame 16b can support the shaft 17 by the stepped portion 17c of the shaft 17 so that the shaft 17 is prevented from falling off.

Further, the shaft lower portion 17b has a ball-spline outer ring and a shaft, and the lower frame 16b has a bearing inside the hole 16d, wherein the ball-spline outer ring is fitted inside the bearing. Thus, the shaft 17 can be rotated about its axis while being supported by the lower frame 16b, and also be made to move up-and-down in an axial direction.

The intermediate frame 16c is cylindrical at both ends, which ends are fixed to nut portions 21b of the up/down moving unit 21. Rotating a ball screw shaft 21a, screwed to the nut portions 21b, by a motor 21m in the up/down moving unit 21 causes the intermediate frame 16c to be operated so as to move up and down, by which the frame 16 is operated to move up and down, by which the head tool 3 as a whole is operated to move up and down.

Also, the suction nozzle 11, the ceramic heater 12, the water jacket 13, the shaft 17 and the load cell 14 have their centers positioned coaxially on one axis that is positioned parallel to the axis of up/down operations. Thus, by the up/down operations performed by the up/down moving unit 21, the suction nozzle 11, the ceramic heater 12, the water jacket 13, the shaft 17 and the load cell 14 are up-and-down movable on the same axis.

Further, an upper end of the shaft 17 in the head-tool tip portion 3a is pressed into contact with a load-detecting surface, which is a lower surface of the load cell 14, by the self-weight balancing spring 15, which is fitted to the lower frame 16b to support the shaft 17 via the spring holder portion 18, thus making it possible for the load cell 14 to detect a load that acts upwardly of the shaft 17 of the head-tool tip portion 3a.

Also, the cooling blow nozzle 19 fitted to the periphery of the shaft lower portion 17b, which is a lower periphery of the shaft 17, is formed around both sides of the water jacket 13 and the ceramic heater 12, which are positioned under the shaft 17. Further, the tip of the cooling blow nozzle 19 is directed toward an electronic-component suction and holding surface, i.e. lower surface, of the suction nozzle 11, so that a blow from the cooling blow nozzle 19 can cool the electronic component 1 sucked and held by the suction nozzle 11.

The control part 9 controls sucking operation of the suction nozzle 11, heating operation of the ceramic heater 12 and moving operation of the up/down moving unit 21, and a load detected by the load cell 14 is outputted to the control part 9.

Figure 11:
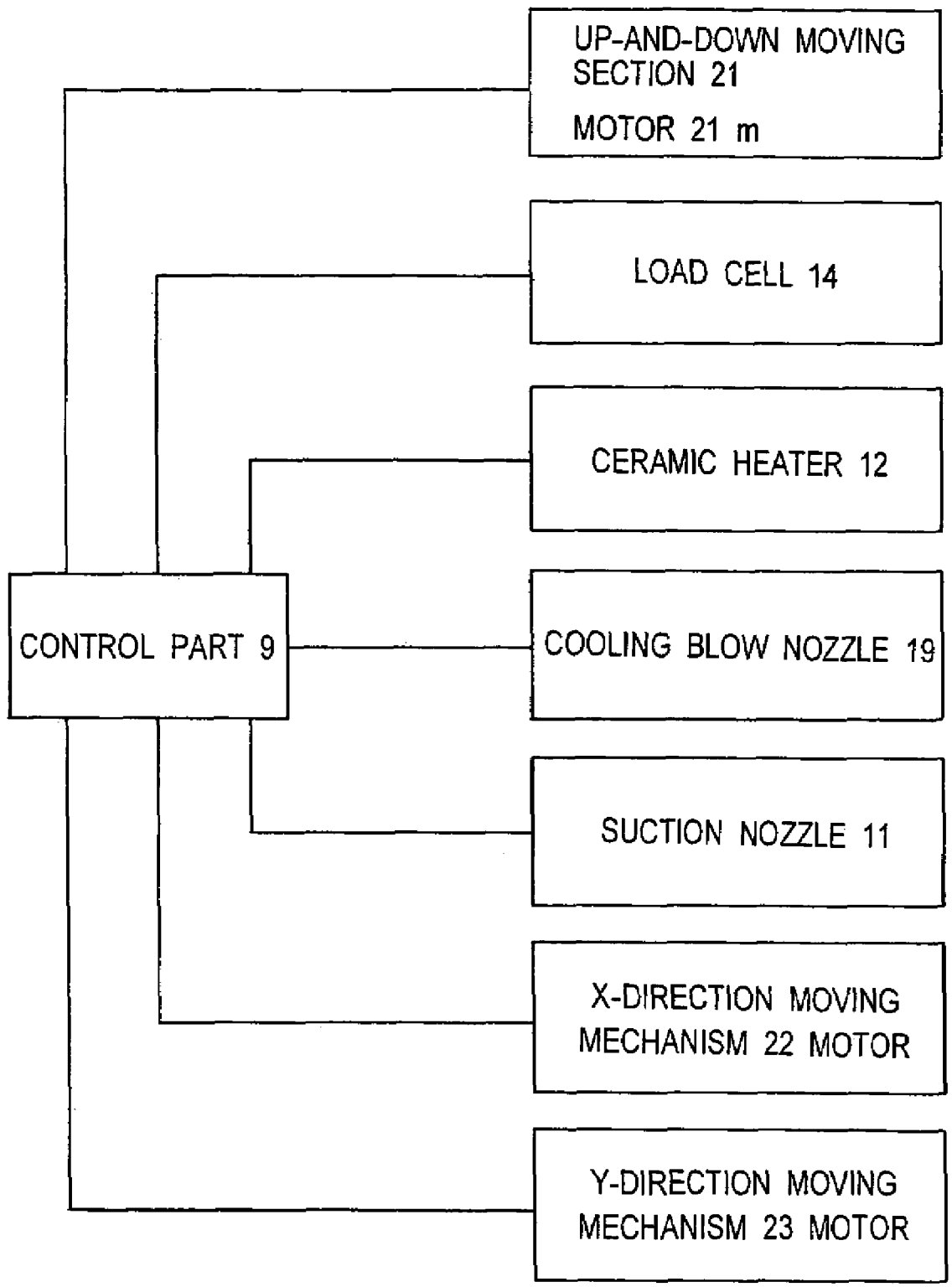
FIG. 11 is a control system diagram in the electronic component mounting apparatus according to the first embodiment.

Now a control system diagram for the electronic component mounting apparatus 201 is shown in FIG. 11. Referring to the electronic component mounting apparatus 201, the control part 9 controls operations of individual constituent parts of the electronic component mounting apparatus 201, i.e., up/down operations of the up/down moving unit 21 by the motor 21m, heating operation of the ceramic heater 12, cooling operation of the cooling blow nozzle 19, sucking operation of the suction nozzle 11, moving operation of the X-direction moving mechanism 22 by a motor, and moving operation of the Y-direction moving mechanism 23 by a motor, and further a load detected by the load cell 14 is outputted to the control part 9. As a result of this, the constituent parts, which are controlled parts for the control part 9, are controlled correlatively by the control part 9, by which mounting of the electronic components 1 onto the circuit board 4 is fulfilled in the electronic component mounting apparatus 201.

Next, a method for detecting a contact load generated upon contact between the electronic component 1 and the circuit board 4, by the load cell 14 in the head tool 3, is explained.

After alignment between the electronic component 1 and the circuit board 4, while the electronic component 1 is kept sucked and held by the suction nozzle 11, the head tool 3 is moved down by the up/down moving unit 21, by which the solder bumps 1b of the electronic component 1 are put into contact with the solder portions 2 of the circuit board 4, respectively. In this state, there arises a contact load between the solder bumps 1b of the electronic component 1 and the solder portions 2 of the circuit board 4, wherein this contact load causes the upper end of the shaft 17 of the head-tool tip portion 3a, in contact with the load-detecting surface of the load cell 14 of the head tool 3, to push up the load-detecting surface of the load cell 14, resulting in the contact load being detected by the load cell 14.

By detecting the contact load in the load cell 14 in this way, occurrence of contact between the solder bumps 1b of the electronic component 1 and the solder portions 2 of the circuit board 4 is detected. Moreover, the contact load detected by the load cell 14 is outputted to the control part 9, while the up/down moving unit 21 is controlled by the control part 9 so as to obtain a contact load preset in the control part 9, the head tool 3 is moved down to a small amount by the up/down moving unit 21, and the up/down moving unit 21 is controlled so that the contact load detected by the load cell 14 becomes a preset contact load.

As to the electronic component mounting method according to the first embodiment which is constituted and performed by the mounting procedure as described above (hereinafter, this method will be referred to as a local reflow mounting method of the first embodiment, since melting, i.e., reflow is performed individually for each electronic component), its mounting procedure is comprehensively given in a flowchart shown in FIG. 4. It is noted that operational instructions at individual steps are implemented by the control part 9.

Figure 4:
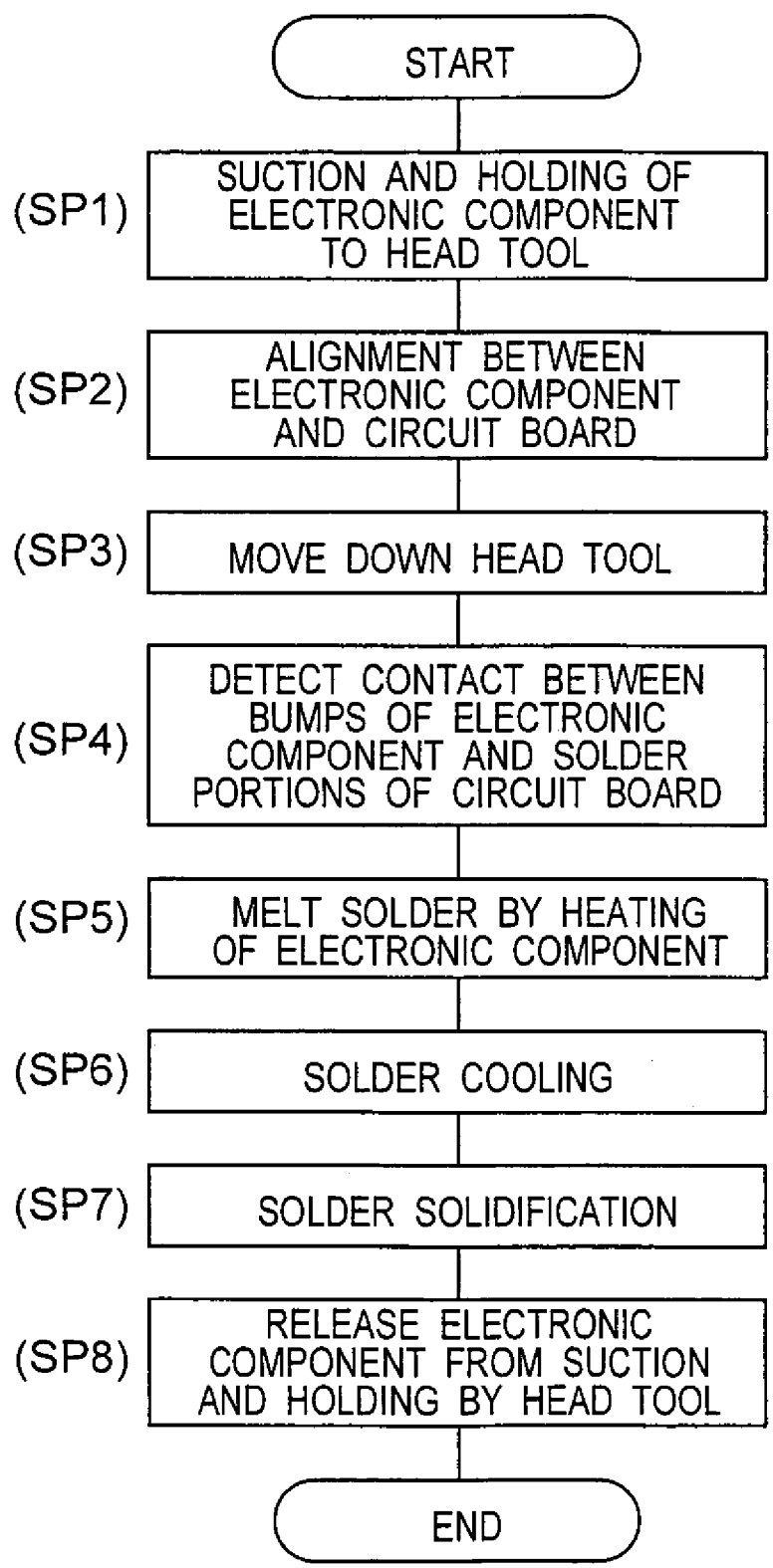
FIG. 4 is a flowchart showing a mounting procedure in the electronic component mounting method according to the first embodiment.

At step SP1 in FIG. 4, the electronic component 1 is sucked and held by the head tool 3. At step SP2, a positional alignment between the electronic component 1 and the circuit board 4 is performed so that the solder bumps 1b formed on the electrodes 1a of the electronic component 1 and the solder portions 2 formed on the pads 4a of the circuit board 4 become bondable with each other. Thereafter, at step SP3, the head tool 3 is moved down while maintaining sucking and holding of the electronic component 1. At step SP4, contact between the solder bumps 1b of the electronic component 1 and the solder portions 2 of the circuit board 4 is detected by the load cell 14 of the head tool 3. Further, at step SP5, by heating of the electronic component 1 with the ceramic heater 12 of the head tool 3, the solder bumps 1b of the electronic component 1 and the solder portions 2 of the circuit board 4 are melted. Subsequently, at step SP6, cooling by blow of the cooling blow nozzle 19 onto the molten solder is started. At step SP7, the molten solder is solidified so that the electrodes 1a of the electronic component 1 are bonded to the pads 4b of the circuit board 4, respectively, via the solder. Subsequently, at step SP8, suction and holding of the electronic component 1 by the head tool 3 is released. In addition, for mounting of a plurality of electronic components 1 onto the circuit board 4, these steps SP1 to SP8 as described above are iteratively performed for each electronic component 1 to fulfill mounting of these respective electronic components 1. Further, in other cases, cooling of the molten solder at step SP6 may be implemented by natural cooling instead of cooling by blow of the cooling blow nozzle 19.

Next, in a case where correction of an elongation amount and shrinkage amount of the head tool 3 due to heat is performed, this correction operation is explained.

After contact between the solder bumps 1b of the electronic component 1 and the solder portions 2 of the circuit board 4, when the suction nozzle 11 is heated by the ceramic heater 12 of the head tool 3 so that the solder bumps 1b and the solder portions 2 are melted, at least the head-tool tip portion 3a in the head tool 3 is elongated in the up/down direction under an effect of heat derived from the ceramic heater 12, and further, when heating by the ceramic heater 12 is stopped, the head-tool tip portion 3a is shrunk in the up/down direction with an effect of heat being eliminated. Because of such up/down elongation and shrinkage of the head-tool tip portion 3a, during a period from contact to bonding of the solder bumps 1b of the electronic component 1 and the solder portions 2 of the circuit board 4, it may become, in some cases, difficult to maintain generally constant a rear-face height of the electronic component 1 having the electrodes 1a kept in contact with the electrodes 4a of the circuit board 4 via the solder portions 2 and the solder bumps 1b. As a result, in some cases, there occur bump crushes or the like, making it difficult to achieve a stable bonding quality of electronic components depending on a required bonding precision.

With a view to fulfilling reliable rear-face height control for the electronic components 1, the elongation-amount and shrinkage-amount correction of the head-tool tip portion 3a is performed during the following procedure. That is, variation data of elongation amount and shrinkage amount due to heat of the head-tool tip portion 3a are preliminarily set to a memory in the control part 9, and the control part 9 performs control over the ceramic heater 12, the up/down moving unit 21 and the cooling blow nozzle 19. During heating by the ceramic heater 12, the head tool 3 is moved up gradually by the up/down moving unit 21 based on the variation data of elongation amount of the head-tool tip portion 3a due to the heating. After a stoppage of the heating by the ceramic heater 12, and during cooling by the cooling blow nozzle 19, the head tool 3 is moved down gradually by the up/down moving unit 21 based on the variation data of shrinkage amount of the head-tool tip portion 3a due to the cooling. Thus, the correction of elongation amount and shrinkage amount of the head-tool tip portion due to heat is fulfilled. As a result of this, the rear-face height of the electronic component 1 sucked and held by the suction nozzle 11 of the head tool 3 can be maintained constant during a period from contact to bonding between the solder bumps 1b of the electronic component 1 and the solder portions 2 of the circuit board 4. Otherwise, the correction of elongation amount or shrinkage amount of the head tool 3 due to heat may alternatively be a correction of only either one of the elongation-amount correction or the shrinkage-amount correction, wherein a decision as to whether the correction is performed or not is made depending on the required bonding precision of the electronic component 1 onto the circuit board 4, or a number of solder bumps 1b formed on the electrodes 1a of the electronic component 1.

Figure 5:
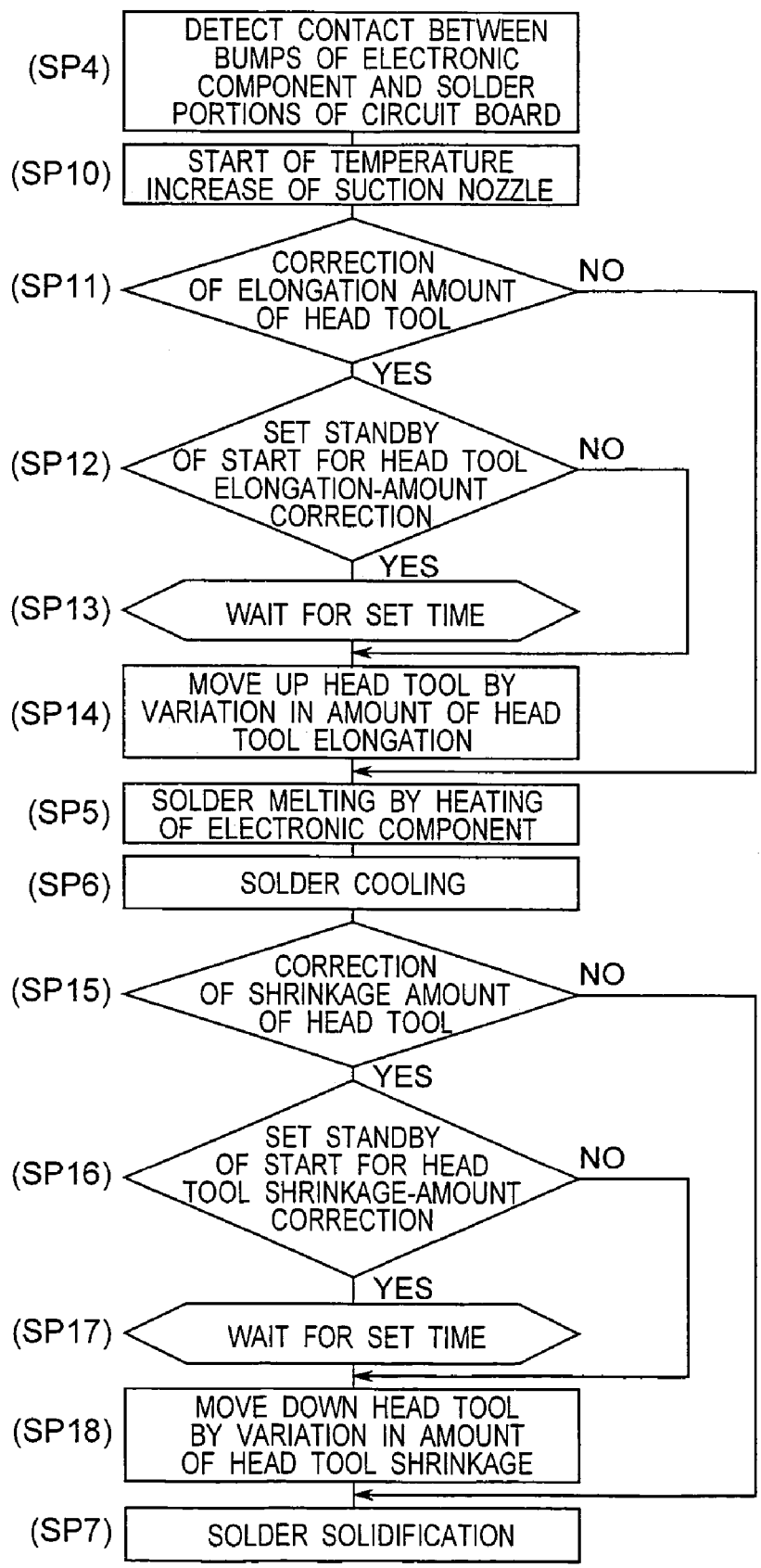
FIG. 5 is a flowchart showing a mounting procedure for performing correction of elongation-amount and shrinkage-amount of the head tool in the electronic component mounting method according to the first embodiment.

A procedure for the correction operation of elongation amount and shrinkage amount of the head tool 3 due to the heat constituted as shown above is comprehensively shown in FIG. 5. FIG. 5 is a flowchart showing the procedure of the correction operation in which steps associated with the correction operation of elongation amount and shrinkage amount of the head tool 3 due to heat are added between step SP4 and SP7 in the flowchart of FIG. 4 showing the mounting procedure of the electronic component mounting method according to the foregoing embodiment. It is noted that operational instructions and decisions at individual steps are implemented by the control part 9.

After contact between the solder bumps 1b of the electronic component 1 and the solder portions 2 of the circuit board 4 is detected at step SP4 in FIG. 5, temperature increase of the suction nozzle 11 is started by heating performed by the ceramic heater 12 at step SP10. Next, at step SP11, it is decided whether or not the correction of elongation amount of the head tool 3 due to heat is performed. If the elongation-amount correction is performed, it is decided at step SP12 whether or not a waiting for a start of the elongation-amount correction for the head tool 3 is performed. In a case where waiting for the start of the elongation-amount correction is performed, the start of the elongation-amount correction for the head tool 3 is kept in a standby state for a set time period at step SP13. In a case where waiting for the start of the elongation-amount correction is not performed, on the other hand, step SP13 is not performed and, subsequently, at step SP14, the head tool 3 is moved up gradually based on variation data of elongation amount of the head tool 3 due to heat. At step SP5, the solder bumps 1b of the electronic component 1 and the solder portions 2 of the circuit board 4 are melted by heating performed by the ceramic heater 12. Otherwise, the stand-by operation of the starting of the elongation-amount correction for the head tool 3 at step SP13 may alternatively be that the standby state is maintained until a temperature of the suction nozzle 11, heated by the ceramic heater 12, increases beyond a set temperature, instead of maintaining the standby state for a set time period as described above.

Meanwhile, if it is decided at step SP11 that the elongation-amount correction is not performed, then step SP5 is performed without performing steps SP12 to SP14.

Thereafter, at step SP6, cooling of the molten solder is started. Next, at step SP15, it is decided whether or not the correction of shrinkage amount of the head tool 3 due to the cooling is performed. If the shrinkage-amount correction is performed, it is decided at step SP16 whether or not waiting for a start of the shrinkage-amount correction for the head tool 3 is performed. In a case where waiting for the start of the shrinkage-amount correction is performed, the start of the shrinkage-amount correction for the head tool 3 is kept in a standby state for a set time period at step SP17. In a case where waiting for the start of the shrinkage-amount correction is not performed, on the other hand, step SP17 is not performed and, subsequently, at step SP18, the head tool 3 is moved down gradually based on variation data of shrinkage amount of the head tool 3 due to the cooling. At step SP7, the melted solder is solidified by the cooling. Otherwise, the stand-by operation of the starting of the shrinkage-amount correction for the head tool 3 at step SP17 may alternatively be that the standby state is maintained until a temperature of the suction nozzle 11, heated by the ceramic heater 12, decreases below a set temperature, instead of maintaining the standby state for a set time period as described above.

Meanwhile, if it is decided at step SP15 that the shrinkage-amount correction is not performed, then step SP7 is performed without performing steps SP16 to SP18.

Next described is a case where a constant contact load control by the head tool 3 is performed after detection of contact between the solder bumps 1b of the electronic component 1 and the solder portions 2 of the circuit board 4, and additionally, tip position control of the suction nozzle 11 is performed after melting of the solder bumps 1b and the solder portions 2.

After detection of contact between the solder bumps 1b of the electronic component 1 and the solder portions 2 of the circuit board 4, the up/down moving unit 21 is controlled by the control part 9 so that a contact load detected by the load cell 14 becomes a preset contact load, and a constant load is applied to the electronic component 1 and the circuit board 4 by the head tool 3, resulting in a constant-load control state by the head tool 3. However, in a state that the solder bumps 1b of the electronic component 1 and the solder portions 2 of the circuit board 4 have been melted by heating of the suction nozzle 11 by the ceramic heater 12, if the head tool 3 remains in the constant-load control state as described above, then a tip position of the suction nozzle 11 would lower, giving rise to a problem in that molten solder bumps 1b and solder portions 2 would be excessively crushed.

In order to solve these and other problems, with a view to reliable achievement of a rear-face height control for the electronic component 1 after melting of respective solder pieces, i.e., positional control for a contact height of the electronic component 1 with the circuit board 4, several steps are performed, including: effectuating the constant-load control state by the head tool 3 after the start of temperature increase of the suction nozzle 11 by heating performed by the ceramic heater 12; performing load detection by the load cell 14; and, upon a decision that a detection of decrease of this detected load is regarded as a start of melting of the respective solder pieces, switching from the constant-load control of the head tool 3 to the positional control for making a tip-height position of the suction nozzle 11 constant, by which even in a molten state of the respective solder pieces, the tip height position of the suction nozzle 11 can be made constant, thus allowing the rear-face height control for the electronic component 1 to be achieved reliably.

Figure 6:
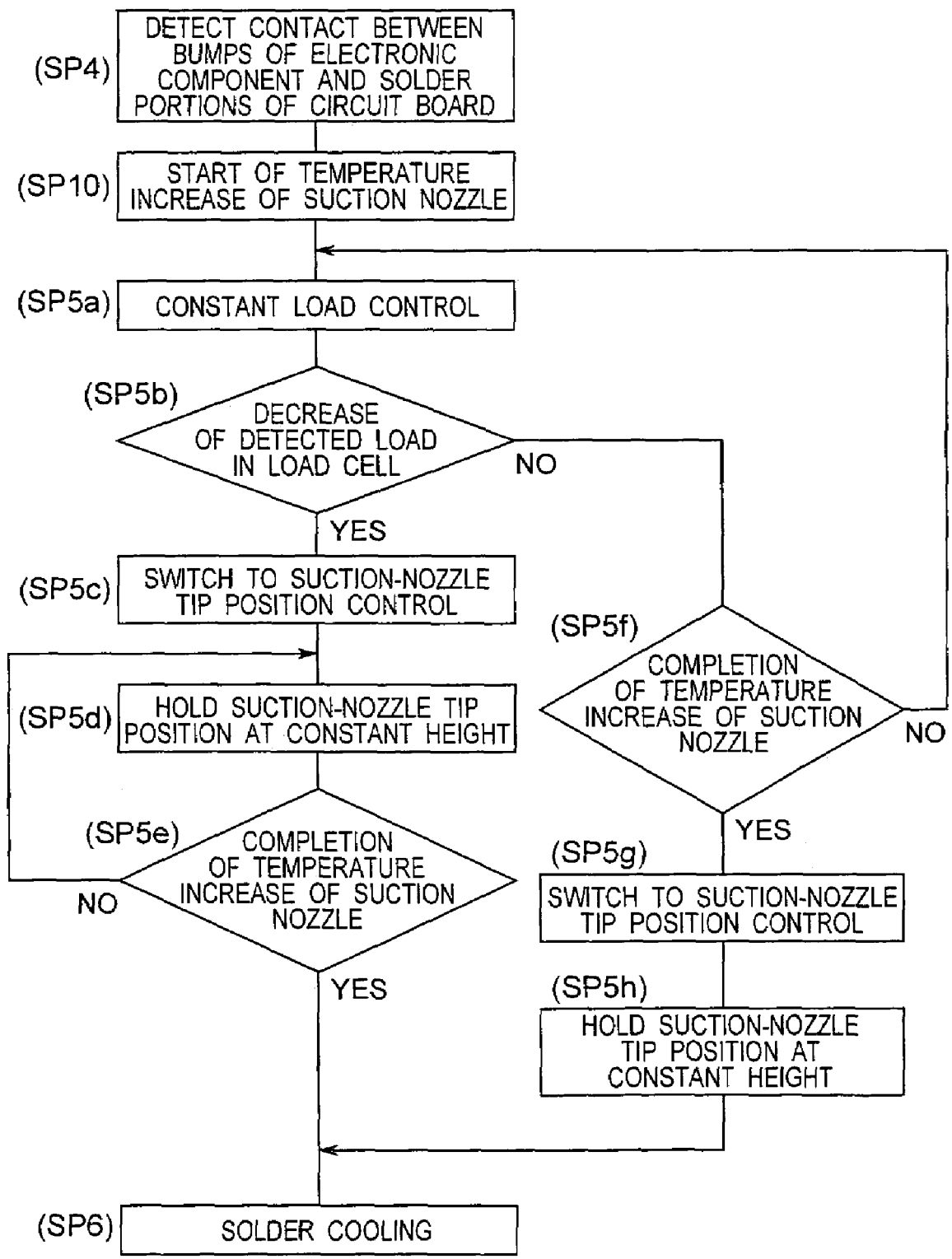
FIG. 6 is a flowchart showing a procedure for performing constant load control of the head tool and tip position control of a suction nozzle in the electronic component mounting method according to the first embodiment.

A procedure for the constant-load control of the head tool 3 and the tip-height-position control operation of the suction nozzle 11 constituted as shown above is comprehensively shown in FIG. 6. FIG. 6 is a flowchart showing a procedure for operations of the constant-load control of the head tool 3 and the tip-height-position control of the suction nozzle 11 between step SP4 and SP6 in the flowchart of FIG. 4 showing the mounting procedure of the electronic component mounting method according to the foregoing embodiment. It is noted that operational instructions and decisions at individual steps are implemented by the control part 9.

After contact between the solder bumps 1b of the electronic component 1 and the solder portions 2 of the circuit board 4 is detected at step SP4 in FIG. 6, temperature increase of the suction nozzle 11 is started by heating performed by the ceramic heater 12 at step SP10. Next, at step SP5a, move-down operation of the up/down moving unit 21 is controlled in small steps, by which constant-load control of the head tool 3 is performed, resulting in a state that a constant load is applied to the electronic component 1 and the circuit board 4 by the head tool 3. During this constant-load control, a load actually generated in the load cell 14 is detected, wherein if a decrease of the detected load is detected at step SP5b as a result of the decrease of the load detected in the load cell 14, then it is decided that the melting of the solder pieces has been started, and a control mode is switched from the constant-load control of the head tool 3 to the constant tip-height-position control of the suction nozzle 11 at step SP5c. At step SP5d, up/down operation of the up/down moving unit 21 is limited, by which a rear-face height of the electronic component 1 sucked and held by the suction nozzle 11, whose tip height position has been made constant, is made constant. At step SP5*e*, the constant tip-height-position control of the suction nozzle 11 is performed until temperature increase of the suction nozzle 11, due to a stopping of heating of the ceramic heater 12, is completed. If the temperature increase of the suction nozzle 11 is completed at step SP5*e*, cooling of the molten solder pieces is started at step SP6.

Meanwhile, if a decrease of the load detected in the load cell 14 is not detected at step SP5*b*, then it is decided that melting of the solder pieces has not yet been started. It is decided at step SP5*f* whether or not the temperature increase of the suction nozzle 11 has been completed due to a stopping of heating by the ceramic heater 12, wherein if it has not yet been completed, the program returns again to step SP5*a* and the constant-load control of the head tool 3 is continued. If it is decided at step SP5*f* that the temperature increase of the suction nozzle 11 has been completed, due to a stopping of heating by the ceramic heater 12, then a control mode is switched from the constant-load control of the head tool 3 to the constant tip-height-position control of the suction nozzle 11 at step SP5*g*. The rear-face height of the electronic component 1 sucked and held by the suction nozzle 11, whose tip height position has been made constant, comes to a specified height at step SP5*h*, and cooling of the molten solder pieces is started at step SP6.

During step SP4, upon detection of contact between the solder bumps 1*b* of the electronic component 1 and the solder portions of the circuit board 4, there are some cases where some of the solder bumps 1*b* and the solder portions 2 are not in contact with one another because of variations in a formation height of the solder bumps 1*b* and the solder portions 2. An example is an electronic component 1 on which as many as one thousand or more bumps are formed. In such a case, when the electronic component 1 is heated as it is, there would occur a problem in that non-contacted solder portions 2 do not conduct heat from the solder bumps 1*b*, and therefore are not melted.

With respect to such a problem, in the constant-load control of the head tool 3 at step SP5*a*, the constant load is set to a load not less than a contact load for contact detection, and the set load is, under constant control, applied to the electronic component 1 and the circuit board 4. By so doing, even if some of the solder bumps 1*b* and the solder portions 2 are not in contact with one another because of variations in a formation height of the solder bumps 1*b* and the solder portions 2 as described the above, upon detection of contact between the solder bumps 1*b* of the electronic component 1 and the solder portions of the circuit board 4, it is implementable to enhance contactability between the solder bumps 1*b* and the solder portions 2 by applying the above-mentioned constant load, by which all the solder pieces can be melted reliably.

Next described is a case where a load zero setting of the load cell 14 of the head tool 3 is performed.

Heat generated by heating of the ceramic heater 12 of the head tool 3 is transferred by heat conduction from individual constituent parts of the head tool 3 or heat conduction through ambient air of the head tool 3, so that the self-weight balancing spring 15 fitted to the spring holder portion 18 of the shaft 17 at the head-tool tip portion 3*a* changes in its spring characteristics under influence of this heat. This results in a change of a pressing load in the load cell 14 generated by the self-weight balancing spring 15, which has changed in its spring characteristics, pressing the shaft 17 against the load-detecting surface of the load cell 14. Further, this pressing load in the load cell 14 by the self-weight balancing spring 15 also changes due to secular changes in the spring characteristics of the self-weight balancing spring 15 depending on duration of use of the head tool 3. By this change in the pressing load in the load cell 14 due to the change in the spring characteristics of the self-weight balancing spring 15, there occurs a difference between an actual pressing load upon contact between the solder bumps 1*b* of the electronic component 1 and the solder portions 2 of the circuit board 4 and a contact-load value detected by the load cell 14, resulting in a problem that an actual contact load cannot be controlled in accordance with a preset contact load.

In such a case, after the electronic component 1 sucked and held by the head tool 3 is aligned so as to be bondable with the circuit board 4, a pressing load, with which the shaft 17 at the head-tool tip portion 3*a* is pressed against the load-detecting surface of the load cell 14 by the self-weight balancing spring 15 in a noncontact state of the electronic component 1 and the circuit board 4, is detected by the load cell 14, and this detected pressing load is outputted to the control part 9. In the control part 9, this pressing load is set as a load-zero point in the load cell 14. Subsequently, the head tool 3 is moved down, so that mounting of the electronic component 1 onto the circuit board 4 is performed. All these steps are performed under control of the control part 9.

Therefore, even in a case where a pressing load by the shaft 17 at the head-tool tip portion 3*a* changes in the load cell 14 because of changes of the spring characteristics of the self-weight balancing spring 15 under influence of heat or secular changes, a pressing load detected in the control part 9 is set to a load-zero point in the load cell 14 each time alignment between the electronic component 1 and the circuit board 4 is performed, which eliminates any difference between an actual contact load upon contact between the solder bumps 1*b* of the electronic component 1 and the solder portions 2 of the circuit board 4, and a detected value of a load detected by the load cell 14, thus allowing control of the actual contact load in accordance with a preset contact load to be achieved.

Figure 7:
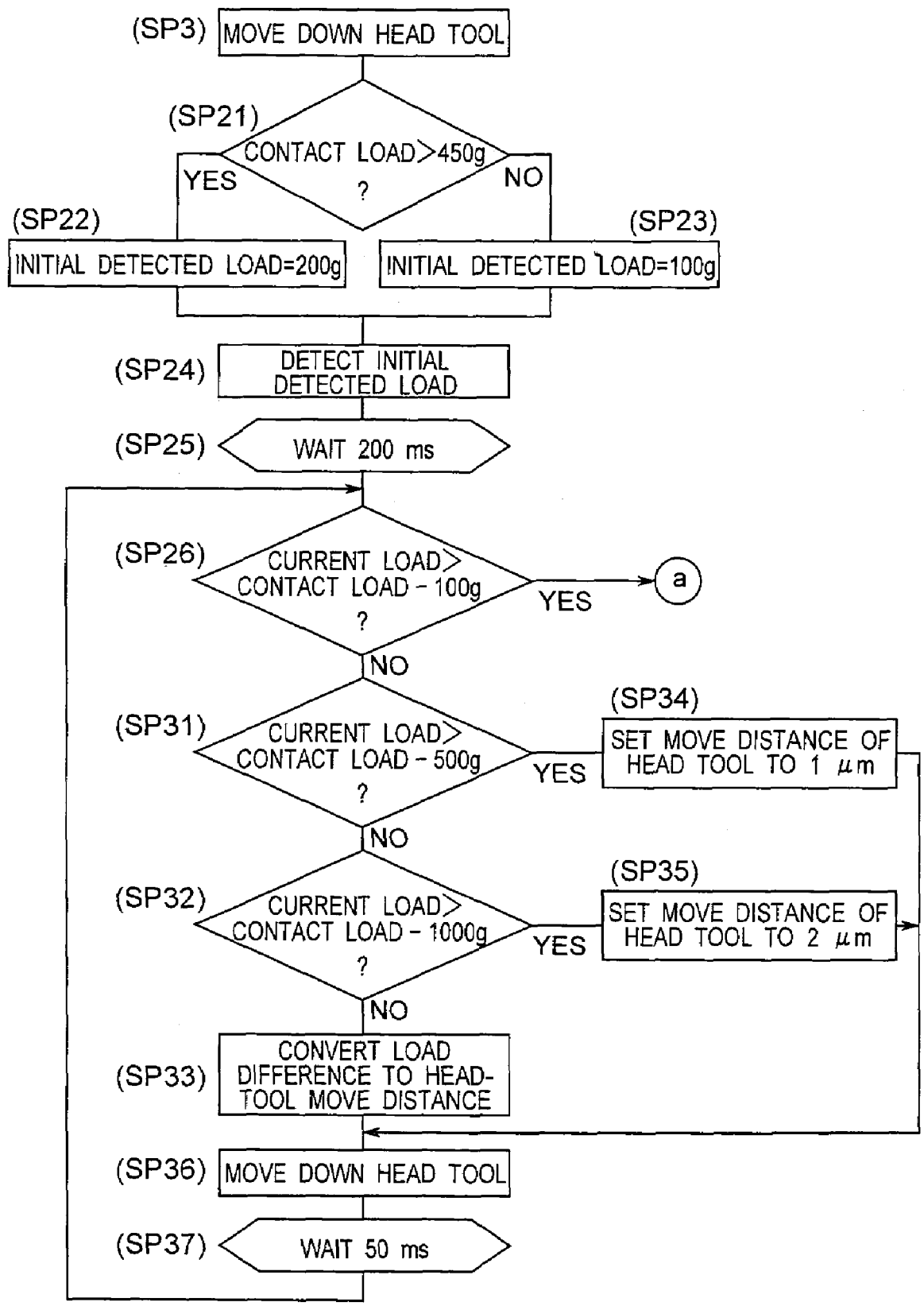
FIG. 7 is a flowchart showing a procedure of a contact-load control operation of the head tool in the electronic component mounting method according to the first embodiment.
Figure 8:
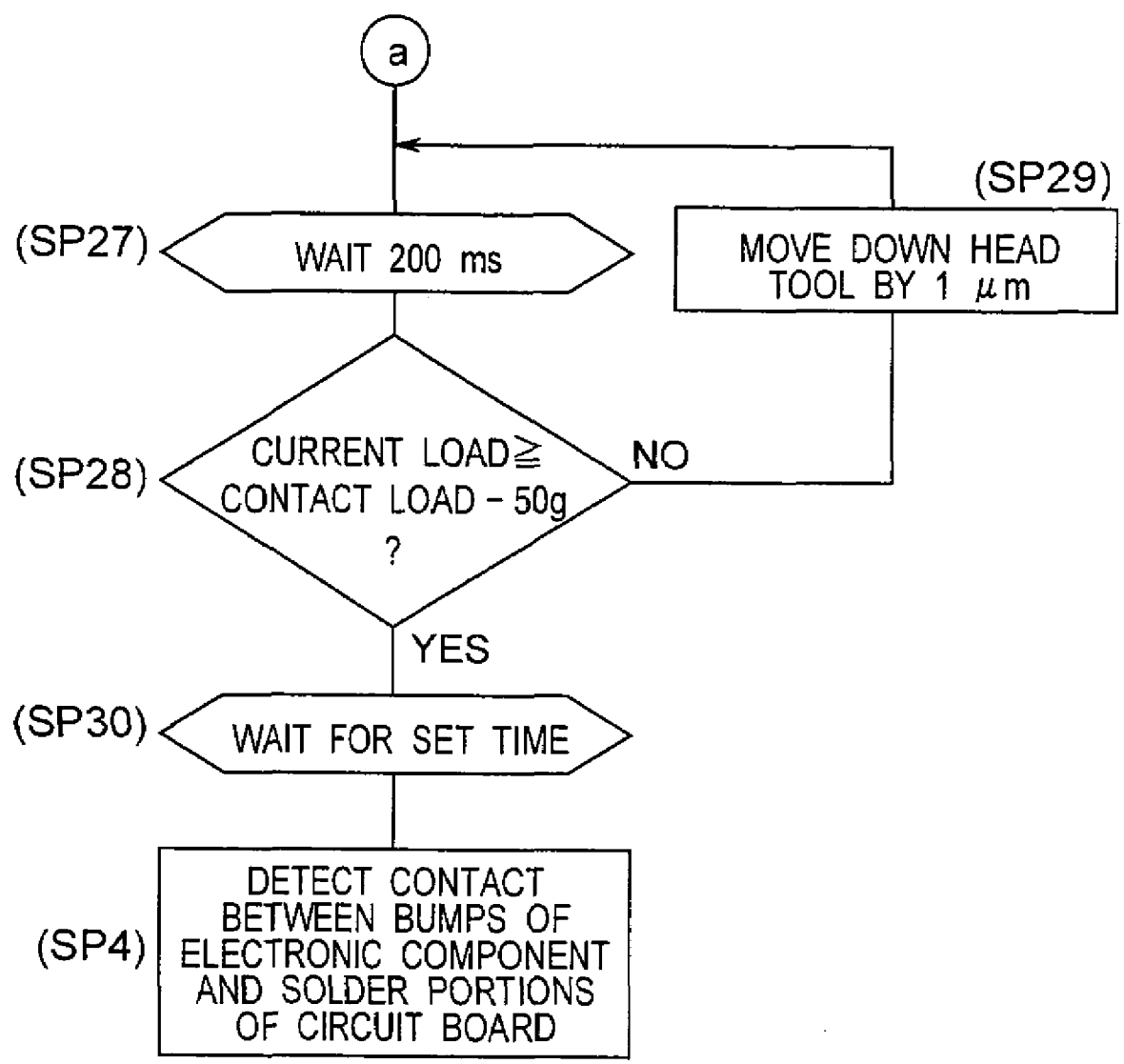
FIG. 8 is a flowchart showing a procedure of contact-load control operation of the head tool in the electronic component mounting method according to the first embodiment.
Figure 9A:
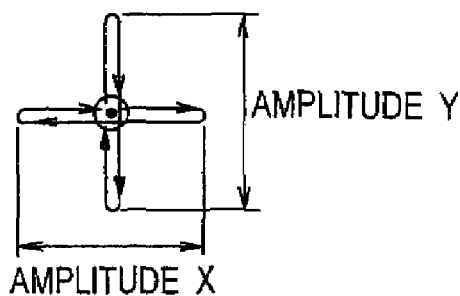
Figure 9B:
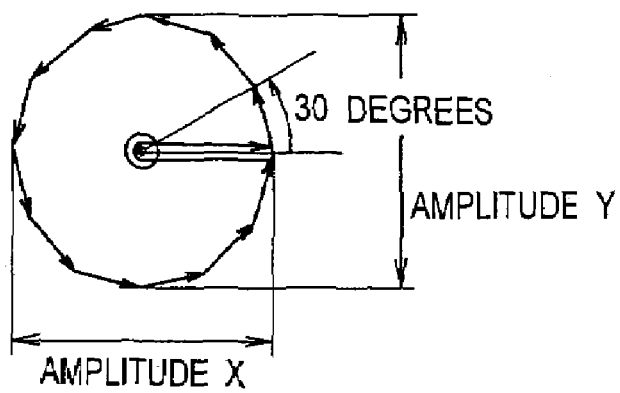
Figure 9C:
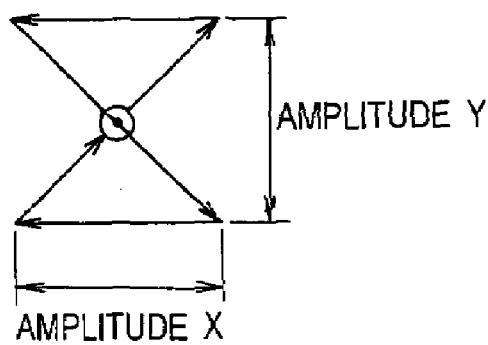
Figure 9D:
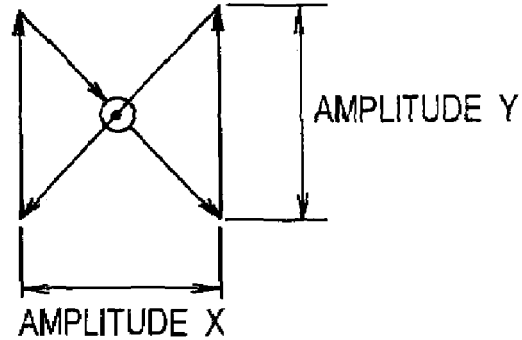

Next described is a method for controlling up/down movement operations of the head tool 3 to thereby control a contact load to a preset contact load, based on detection of a contact load due to the head tool 3 upon contact between the solder bumps 1*b* of the electronic component 1 and the solder portions 2 of the circuit board 4 by virtue of the load cell 14 of the head tool 3, with reference to contact-load control operation flowcharts shown in FIGS. 7 and 8 on a basis of a working example. It is noted that operational instructions and decisions at individual steps are implemented by the control part 9.

After alignment between the electronic component 1 and the circuit board 4, the head tool 3 sucking and holding the electronic component 1 starts to be moved down by the up/down moving unit 21 at step SP3. During this downward movement of the head tool 3, it is decided at step SP21 whether or not a preset contact load is beyond 450 g. If the preset contact load is beyond 450 g, an initial detected load due to contact is set to 200 g at step SP22. If the preset contact load is not more than 450 g, the initial detected load due to the contact is set to 100 g at step SP23. Next, at step SP24, the solder bumps 1*b* of the electronic component 1 and the solder portions 2 of the circuit board 4 come into contact with each other, wherein a set initial detected load is detected by the load cell 14. Then, at step SP25, the head tool 3 that has been moving down is stopped so as to be kept in an operation standby state for 200 ms; that is, kept in a static state so as to eliminate any effects on the detected load of the load cell 14 by the head tool 3 moving down by a small overshoot after a stop operation of the head tool 3, i.e., by the head tool 3 moving down by a small amount after a move-down operational instruction from the control part 9 to over a period from deceleration of a move-down speed of the head tool 3 until its stopping.

Next, it is decided at step SP26 whether or not a current load detected by the load cell 14 is beyond the preset contact load −100 g, wherein it is decided how close the current load is to the preset contact load.

If it has been determined at step SP26 that the current load is over the preset contact load −100 g, the head tool 3 is subjected to a static state for 200 ms at step SP27. Further, at step SP28, it is decided whether or not the current load is not less than the preset contact load −50 g. If the current load is less than the preset contact load −50 g, the head tool 3 is moved down by 1 µm by the up/down moving unit 21 at step SP29, and the head tool 3 is subjected to a static state for 200 ms at step SP27. Thereafter, it is decided again at step SP28 whether or not the current load is not less than the preset contact load −50 g. This operational loop is iteratively performed until the current load becomes not less than the preset contact load −50 g.

If the current load is not less than the preset contact load −50 g at step SP28, then the head tool 3 is kept in a static state for a preset time period at step SP30, wherein control of a contact load between the solder bumps 1b of the electronic component 1 and the solder portions 2 of the circuit board 4 toward the preset contact load is completed. Then, a result at step SP4 is that contact between the solder bumps 1b of the electronic component 1 and the solder portions 2 of the circuit board 4 has been detected. It is noted here that the preset contact load −50 g, which is a decision criterion in step SP28, is a contact load which is expected to occur upon contact between the solder bumps 1b of the electronic component 1 and the solder portions 2 of the circuit board 4. When a current load, which is a load that actually occurs upon contact, becomes not less than a contact load that is expected to occur upon contact, generally all of the solder bumps 1b of the electronic component 1 and generally all of the solder portions 2 of the circuit board 4 come into a contact state, thus resulting in detection of contact.

Otherwise, if the current load is not more than the preset contact load −100 g at step SP26, it is further decided at step SP31 whether or not the current load is beyond the preset contact load −500 g, wherein if not, it is further decided at step SP32 whether or not the current load is beyond the preset contact load −1000 g in a stepwise manner. If the current load is not more than the preset contact load −1000 g at step SP32, a load difference between the current load and the preset contact load is converted into a movement distance of the head tool 3 at step SP33. Also, in a case where the current load has satisfied the condition of step SP31, the movement distance of the head tool 3 is set to 1 µm at step SP34. In a case where the current load has satisfied the condition of step SP32, the movement distance of the head tool 3 is set to 2 mm at step SP35. Thereafter, at step SP36, the head tool 3 is moved down by the up/down moving unit 21 to an extent corresponding to movement distance of the head tool 3 in either case as shown above. At step SP37, the head tool 3 is stopped and kept in a static state for 50 ms. Thereafter, it is decided again at step SP26 whether or not the current load is beyond the preset contact load −100 g. The loop of these operations is iteratively performed until this condition of step SP26 is satisfied.

In the contact-load control method performed by the operations as described above, the head tool 3 is controlled for its minute move-down operation. Respective movement distances of the head tool 3 under respective operational conditions are set based on a relationship between an up/down minimum movable distance of the head tool 3 by the up/down moving unit 21 and a load per head-tool unit movement that can be generated by this minimum movable distance. In the above working example, the minimum movable distance is 1 µm, and the load per head-tool unit movement is 100 g/µm. Accordingly, for example, the difference of 100 g between preset contact load and current load, which is the condition of step SP26, is set based on the load per head-tool unit movement. Also at step SP29, step SP34 and step SP35, movement distances of the head tool 3, 1 µm and 2 µm, are set based on minimum movable distances, respectively.

It is noted that loads, times, distances or other numerical values in the above description are those as an example in this embodiment, and this embodiment is not limited to these numerical values.

Next described is a case including a step of performing a reshaping operation of the solder bumps 1b of the electronic component 1 by the head tool 3.

After contact between the solder bumps 1b of the electronic component 1 and the solder portions 2 of the circuit board 4, when the suction nozzle 11 is heated by the ceramic heater 12 of the head tool 3 so that the solder bumps 1b and the solder portions 2 are melted, the head tool 3 sucking and holding the electronic component 1 is subjected to micro-vibrational operations in the up/down or sideways directions so that solder wettability between these molten solder bumps 1b and solder portions 2 can be improved and that quality of bonding for the electronic component 1 and the circuit board 4 can be made successful. As a pattern of this vibrational operation in the reshaping operation performed by the head tool 3, as shown in FIGS. 9A-9D, such patterns are available as a cross type (see FIG. 9A), an O type (see FIG. 9B), and 8-letter types (see FIGS. 9C and 9D) ones as have been used in conventional electronic component mounting methods. Further, as parameters to be used for respective vibrational operations in the reshaping operation performed by the head tool 3, a number of reshaping-operation up/down moves for moving up and down the head tool 3 during the reshaping operation is 0 to 20 times as an example, an operating speed for moving up and down the head tool 3 during the reshaping operation is 0.1 to 9.9 seconds as an example, an operating amount, that is a movement amount for moving up and down the head tool 3 in the reshaping operation, is −99 to 99 µm as an example, and a number of reshaping vibrational operations for vibrating the head tool 3 in the X and Y directions during the reshaping operation is 0 to 200 times as an example.

Figure 10A:
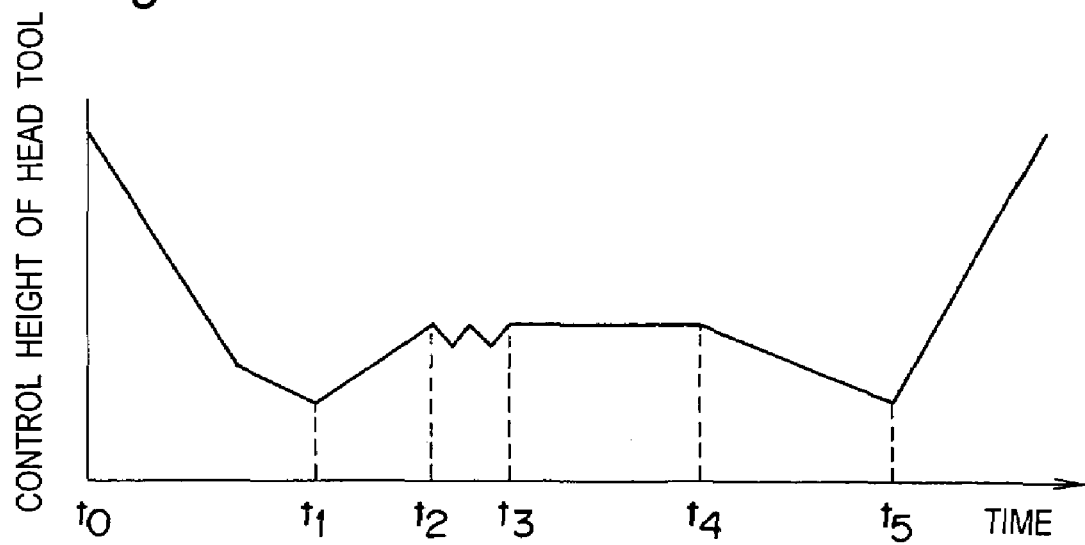
Figure 10B:
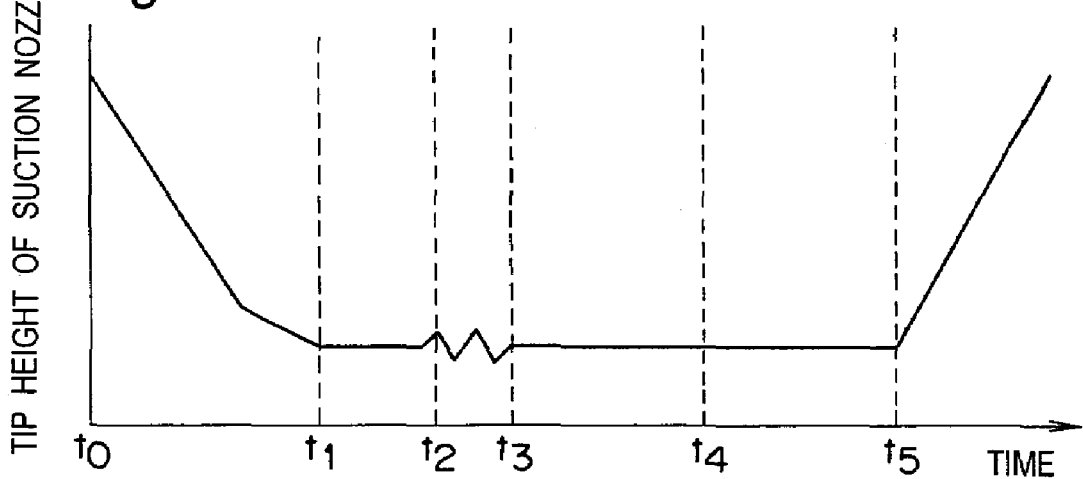
Figure 10C:
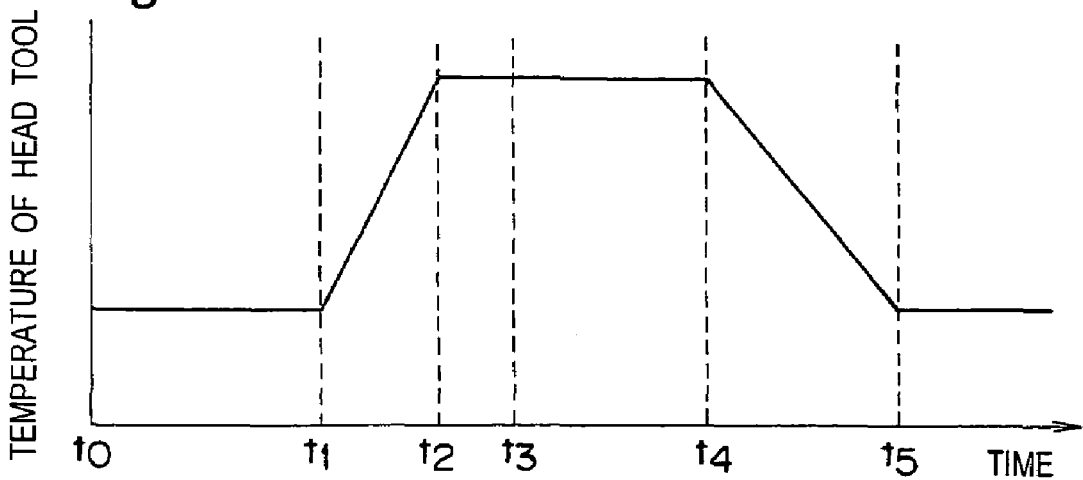

Next, with regard to a case where electronic components are mounted onto a circuit board by compositely performing individual operations of the head tool 3 as described above, time charts showing time-varying states of a control height of the head tool 3, tip height of the suction nozzle 11 of the head tool 3 and temperature of the suction nozzle 11 of the head tool 3 are shown in FIGS. 10A, 10B and 10C, respectively. It is noted here that the control height of the head tool 3 refers to a relative height position of up/down movement control of the head tool 3 by the up/down moving unit 21, and the tip height of the suction nozzle 11 of the head tool 3 refers to a relative tip height of the suction nozzle 11. It is also noted that time axes, which are the horizontal axes in FIGS. 10A-10C, are given as the same time axis so as to allow comparisons among respective variation states.

First, during a period from time origin t0 to t1 in FIGS. 10A-10C, the control height of the head tool 3 as well as the tip height of the suction nozzle 11 fall in similar variation states along with downward movement of the head tool 3 by the up/down moving unit 21. In this case, since heating by the ceramic heater 12 has not yet been started, temperature has been maintained in a constant state.

Subsequently, during a period from time t1 to t2, the electronic component 1 and the circuit board 4 come into contact with each other at time t1, and heating of the suction nozzle 11 is started by the ceramic heater 12, by which temperature of the suction nozzle 111 is increased. Since a correction operation of elongation amount of the head tool 3 due to this temperature increase is performed, the control height of the head tool 3 is increased as previously set. The head tool 3 that has been subjected to the elongation-amount correctional operation becomes constant in the tip height of the suction nozzle 11. During this period from time t1 to t2, solder melting is started.

Subsequently, during a period from t2 to t4, the temperature of the suction nozzle 11 is controlled by heating of the ceramic heater 12 so as to be maintained at a constant temperature. Also, the control height of the head tool 3 as well as the tip height of the suction nozzle 11 are both maintained at a constant level. However, during the period from time t2 to t3, since a reshaping operation of the solder bumps 1b of the electronic component 1 by the head tool 3 is performed, the head tool 3 performs micro-vibrational operations, so that both the control height of the head tool 3 and the tip height of the suction nozzle 11 of the head tool 3 move up and down in micro steps.

Subsequently, during the period from time t4 to t5, cooling of molten solder is started, and the temperature of the suction nozzle 11 falls. Since a correctional operation of shrinkage amount of the head tool 3 due to this cooling is performed, the control height of the head tool 3 is lowered as previously set. The head tool 3 that has been subjected to the shrinkage-amount correctional operation becomes constant in the tip height of the suction nozzle 11. During this period from time t4 to t5, the molten solder is solidified.

Finally, at time t5, suction and holding of the electronic component 1 by the suction nozzle 11 of the head tool 3 is released, and thereafter the head tool 3 is moved up by the up/down moving unit 21, so that the control height of the head tool 3 as well as the tip height of the suction nozzle 11 go up in similar variation states.

Further, a working example which is more concretely embodied according to a modification example of the embodiment of operations of the head tool 3 as described above is described below. Also, time charts showing time-varying states of the tip height of the suction nozzle 11 of the head tool 3, temperature of the suction nozzle 11, and load detected by the load cell 14 under loading by the electronic component 1 and the circuit board 4 due to downward movement of the head tool 3, respectively, are shown in FIG. 25. Further, schematic explanatory views showing states of the electronic component 1 and the circuit board 4 at singular time points of the time charts of FIG. 25 are shown in FIGS. 24A-24E, respectively. In addition, in FIG. 25, the horizontal axis is given as a time axis, wherein times Ta-Th are shown as respective singular time points in the above-mentioned varying states, while the vertical axis shows the tip height of the suction nozzle 11, the temperature of the suction nozzle 11 and the load detected by the load cell 14, in an order from above to below.

Figure 24A:
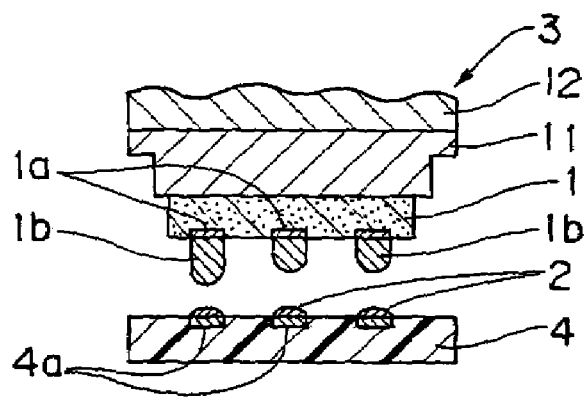
Figure 25:
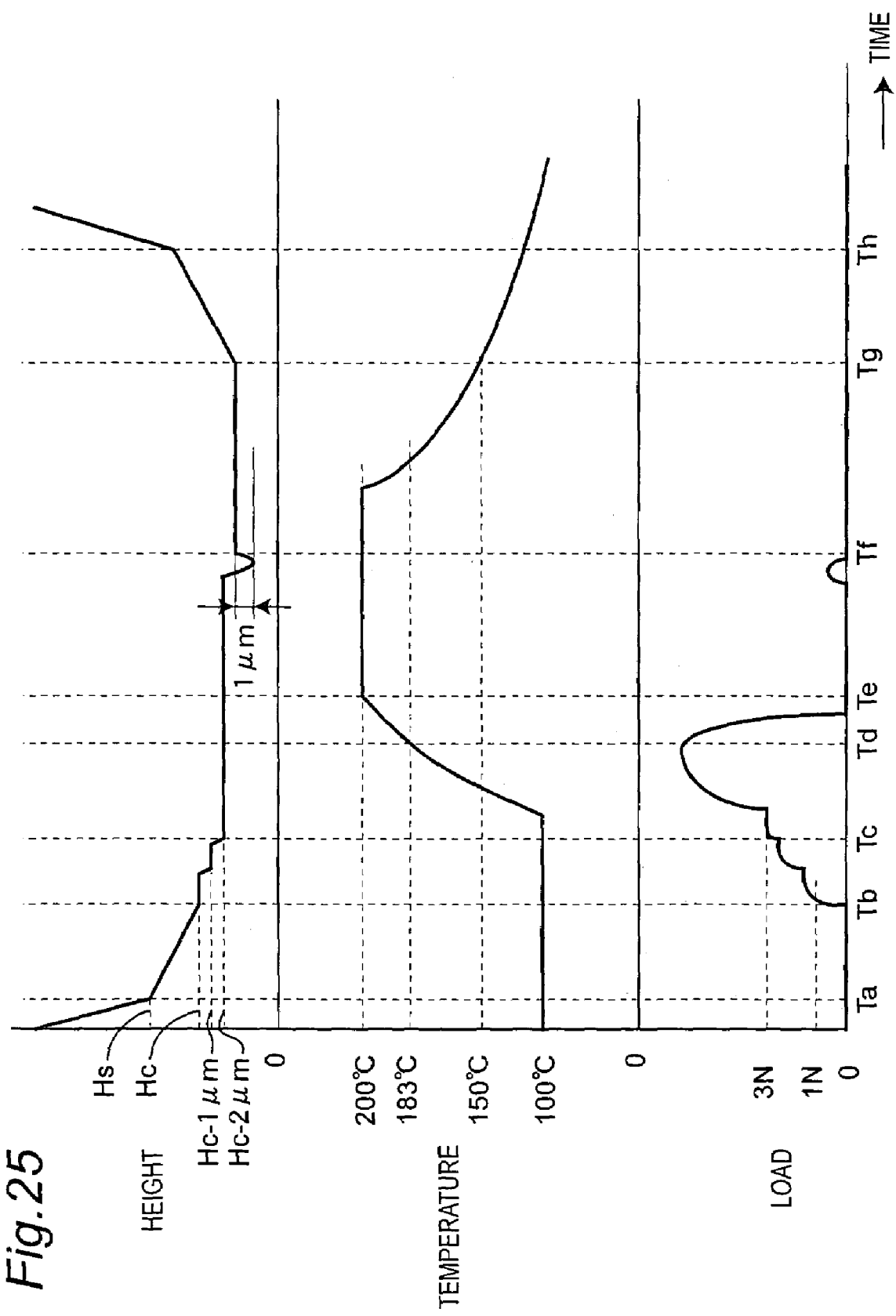
FIG. 25 is a time chart showing operations of the head tool in the electronic component mounting method shown in FIGS. 24A-24E.

First, as shown in FIG. 24A, after the electronic component 1 sucked and held by the suction nozzle 11 is aligned with a mounting position of the circuit board 4, the head tool 3 is moved down so that the suction nozzle 11 is moved down to a search start height as its tip height (time Ta in FIG. 25). It is noted here that the term "search start height" refers to a height at which detection of contact between individual solder bumps 1b of the electronic component 1 and individual solder portions 2 of the circuit board 4, respectively, is started by load detection of the load cell 14. Also, the temperature of the suction nozzle 11 is maintained at a temperature of, for example, about 100° C. by being heated by the ceramic heater 12 so that temperatures that do not cause melting of the individual solder bumps 1b of the electronic component 1 can be maintained with a view to reducing as much as possible a temperature increase time for later solder melting. Thereafter, the head tool 3 is moved down at a move-down speed previously set in the control part 9 or the like, by which the suction nozzle 11 is moved down.

Figure 24B:
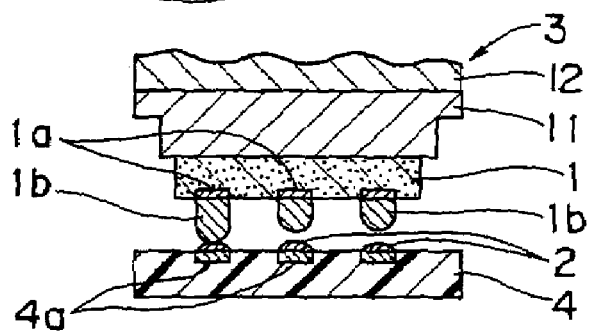

When the suction nozzle 11 is moved down, some of the solder bumps 1b of the electronic component 1 come into contact with the solder portions 2 of the circuit board 4, as shown in FIG. 24B, wherein a load due to this contact is detected in the load cell 14. When this detected load has reached a preset contact load (e.g., 1 N), it is decided that contact between the solder bumps 1b and the solder portions 2 has been detected, wherein contact load detection is ended (time Tb in FIG. 25). This occurrence of contact between some of the solder bumps 1b and some of the solder portions 2 is due to the fact that, for example, the individual solder bumps 1b of the electronic component 1 are formed of high-temperature solder, varying in their formation height in some cases. Further, since the individual solder portions 2 are formed by plating with, for example, eutectic solder on the pads 4a of the circuit board 4, respectively, the solder portions 2 may also vary in their formation height in some cases. Otherwise, another case may be one in which the individual solder portions 2 are formed by printing with solder paste, instead of being formed by plating as shown above. Accordingly, in a state that contact has been detected, this case is not that all the solder bumps 1b and all the solder portions 2 are necessarily in contact with each other, but that, for example, only some solder portions 2b that are highest in formation height are in contact, as shown in FIG. 24B.

Figure 24C:
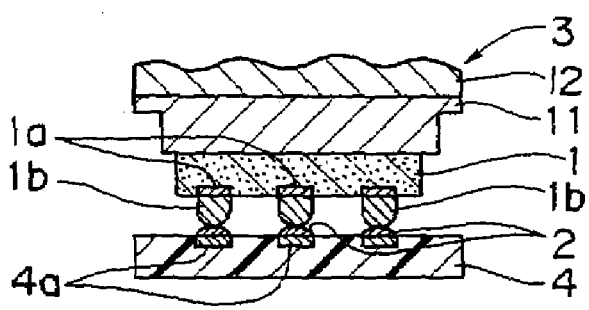

Subsequently, a temperature of the suction nozzle 11 is increased so that the individual solder portions 2 are melted. However, if the temperature of the suction nozzle 11 is increased in such a contact-detected state, heat would not be transferred to solder portions 2 that should be put into contact with solder bumps 1b other than the above-mentioned some solder bumps 1b, wherein this solder is not melted, thereby causing higher positionability of occurrence of defective bonding. Therefore, after contact detection, the suction nozzle 11 is further moved down so that a further load generated by this downward movement is added to the foregoing contact load, as shown in FIG. 24C, by which the solder bumps 1b of higher formation heights that have previously been in contact are plastically deformed by the load so that all the solder bumps 1b are put into contact with the solder portions 2, respectively (time Tb-Tc). A load value necessary in further adding a load as shown above depends on a number of the solder bumps 1b. For example, assuming that the number of solder bumps 1b is one hundred and that a load of 0.03 N is applied to each one solder bump 1b, then a total load of 3 N is set as a target load for increasing of the load. Also in performing this load increase, the head tool 3 is moved down by a minimum movable distance for move-down of the head tool 3, and moreover while a resulting load increment is being measured by the load cell 14, the head tool 3 is moved down by a specified amount so as to reach a target load. For example, with a minimum resolution of 1 µm as the minimum movable distance and with a load increment of 1 N corresponding thereto, the head tool 3 is moved down in steps of 1 µm while a detected load is checked. In the case of FIG. 25, with a setting that the tip height position of the suction nozzle 11 upon a detection of contact is Hc, the tip height position is first lowered and positioned to Hc-1 µm, and further lowered and positioned to Hc-2 µm, thus stepwise downward movement is performed. Further, during a period from a downward movement of the head tool 3 to a check of the load value, a wait time of a certain time interval is provided. This is intended to stabilize the load value by a certain time lapse, since plastic deformation of the individual solder bumps 1b is not completed instantaneously but needs a certain time lapse for the plastic deformation to be stabilized. Further, the load is checked again after the elapse of the specified time period even after the target load is reached, wherein if it is verified that the detected load has reached the target load, then a temperature increase of the suction nozzle 11 by heating of the ceramic heater 12 is performed.

Thereafter, the individual solder portions 2 of the circuit board 4 are heated by the temperature increase of the suction nozzle 11 via the individual solder bumps 1b, by which melting of the individual solder portions 2 is started (time Tc-Td). In this case, if the solder portions 2 are formed of a eutectic solder having a melting point of 183° C., the temperature increase of the suction nozzle 11 is performed with a target temperature (e.g., 200° C.) which is slightly higher than a melting point and which is lower than a melting point of high-temperature solder from which the individual solder bumps 1b of the electronic component 1 are formed. Also, in a case where the tip height of the suction nozzle 11 is maintained as it is during this temperature increase, the tip of the suction nozzle 11 would be elongated along with the temperature increase, thus causing the load detected in the load cell 14 to be increased. In this connection, elongation amount of the suction nozzle 11 depends on its material and temperature increments, and therefore effects of elongation on the load can be reduced by selecting a material hard to elongate due to heat as the material, or by setting the temperature upon contact detection to a highest possible temperature so that a temperature variation against a melting temperature is reduced. Furthermore, a case may be another one in which a load upon contact detection is set to a somewhat lower one in view of a load increase due to elongation of the suction nozzle 11 during temperature increase. Still also, a case may be another one including a controlling step in which the tip height position of the suction nozzle 11 is moved up according to a temperature of the suction nozzle 11 with a view to suppressing any load increases, due to such temperature increases, as much as possible. In such a case, an elongation amount of the suction nozzle 11 corresponding to an incremental temperature of 1° C. is preliminarily set in the control part 9 or the like as data, and the suction nozzle 11 is moved up according to a temperature increment from the temperature at contact detection (e.g., 100° C.), thus allowing a load increase due to a temperature increase to be suppressed.

Further, since the suction nozzle 11 is under the control of holding its tip height position, the height position of the electronic component 1 remains as it is at the moment of the melting of the solder portions 2, wherein the solder portions 2 are melted so that no solid substances are present between the individual pads 4a of the circuit board 4 and the individual solder bumps 1b, thus the load detected by the load cell 14 abruptly decreases toward zero (time Td-Te). In this case, since the circuit board 4 or the electronic component 1 is more or less flexed by a load effectuated just before melting of the individual solder portions 2, the electronic component 1 is moved (lowered) in such a direction as to slightly sink toward the circuit board 4 side at the moment that the load has become zero. Accordingly, not that a gap is left by an extent corresponding to a formation thickness of the solder portions 2 which has been present between the individual pads 4a of the circuit board 4 and the individual solder bumps 1b, but that tips of the individual solder bumps 1b are sunk into their corresponding solder portions 2, respectively, so that the above-noted gap is reduced. Further, the more the load that has been present just before the melting of the solder portions 2 becomes larger, the more the gap tends to become smaller. With the load too large, sinkage larger than the gap may occur, so that the solder bumps 1b and the pads 4a of the circuit board 4 are kept in direct contact with each other even after melting of the solder portions 2, leading to occurrence of a phenomenon that the detected load does not become zero. Also, with too large a load and with the melting of the solder portions 2 in rapid progress, the electronic component 1 may sink as if it were struck against the circuit board 4 at the moment when the solder portions 2 have been melted, which may then cause molten solder to spatter, giving rise to short-circuiting faults. Even for prevention of occurrence of such various problems due to abrupt decreases in load caused by melting of the solder portions 2, maintaining at a proper value the load that exists just before the melting of the solder portions 2 is a significantly important factor in terms of bonding stability between the electronic component 1 and the circuit board 4.

Figure 24D:
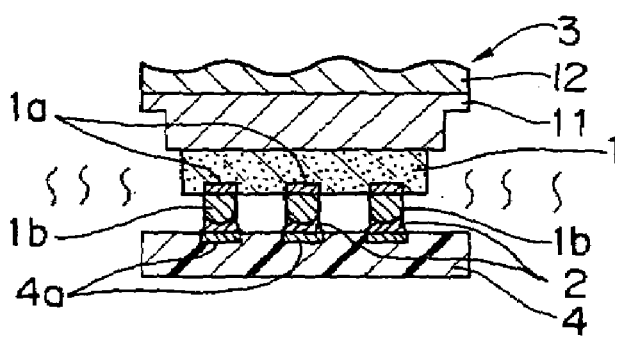

Thereafter, melting of the solder portions 2 is started. When a temperature of the suction nozzle 11 has reached a target temperature (time Te), this state is maintained for a specified time period. As a result of this, as shown in FIG. 24D, molten solder portions 2 are formed into fillets by their surface tension between the individual solder bumps 1b and the individual pads 4a of the circuit board 4 so as to partly cover outer peripheries of the individual solder bumps 1b.

In a case where the above-noted gap has occurred between the solder portions 2 and the pads 4a as a result of melting of the solder portions 2, the suction nozzle 11 is moved down so that tips of the solder bumps 1b and the pads 4a are put into contact with each other, respectively. This is so as to achieve that the gap between the surface of the circuit board 4 and the electronic component 1 becomes equal to a formation height of the individual solder bumps 1b as much as possible at a time of completion of bonding. By performing such an operation, bonding strength of the electronic component 1 onto the circuit board 4 can also be enhanced. In more detail, in a state that the load has become zero as a result of melting of the individual solder portions 2, the suction nozzle 11 is moved down until a load is detected by the load cell 14, and then, conversely, the suction nozzle 11 is moved up to an extent corresponding to the above-noted minimum resolution (e.g., 1 µm) from a position where the load is detected, so that a load to be detected again is returned to zero (time Tf). After performing such an operation, a time period required for stabilizing re-melted individual solder portions 2 is awaited, and then a heating temperature of the suction nozzle 11 by the ceramic heater 12 is lowered (time Tf-Tg).

Thereafter, when a temperature of the suction nozzle 11 has become lower than the melting point of the eutectic solder, the molten solder portions 2 begin to solidify. Once the temperature has lowered to a secure-solidification temperature (e.g., 150° C.), suction and holding of the electronic component 1 by the suction nozzle 11 is released (time Tg). In addition, before this solidification of the solder portions 2, elongation of the suction nozzle 11 due to heat would restore along with a temperature drop of the suction nozzle 11, thereby giving rise to a force that would peel off the electronic component 1 from the circuit board 4 by the suction nozzle 11. In order to prevent an occurrence of such force, it is also possible to perform a control operation for moving down the suction nozzle 11 along with a temperature decrease of the suction nozzle 11 so that a tip height position of the suction nozzle 11 is maintained at a fixed height position. It is yet also that suction and holding of the electronic component 1 is released at a point in time when the temperature of the suction nozzle 11 has become slightly lower than the melting point of the eutectic solder, in which state the temperature of the suction nozzle 11 is lowered to a temperature at which the solder portions 2 are securely solidified.

Figure 24E:
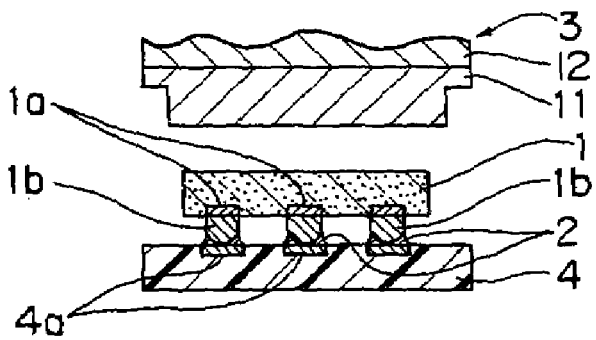

Thereafter, as shown in FIG. 24E, the head tool 3 is moved up so that the suction nozzle 11 is moved up (time Th), wherein bonding of the electronic component 1 onto the circuit board 4 is completed.

Next described is a case which includes a step of performing a leveling operation such that solder bumps 1b of electronic component 1 are made uniform in their height with one another before the electronic component 1 is put into association with circuit board 4.

With nonuniformities of their height included in the solder bumps 1b bonded to electrodes 1a of the electronic component 1, when the solder bumps 1b of the electronic component 1 and solder portions 2 of the circuit board 4 are put into contact with each other, a contact load control would be affected by these nonuniformities of height of the solder bumps 1b, so that suction and holding to a predetermined rear-face height of the electronic component 1 could not be achieved by head tool 3. If solder is melted in a state as it is and the electronic component 1 is bonded to the circuit board 4, there would arise a problem in that individual electronic components 1 of the circuit board 4 could not be made uniform in their height.

In order to solve such a problem, before a mounting operation of the electronic component 1 onto the circuit board 4 by the head tool 3, a leveling operation for making uniform a height of the solder bumps 1b of the electronic component 1 is performed, and thereafter the mounting operation of the electronic component 1 onto the circuit board 4 is performed.

In the electronic component mounting apparatus 201 of FIG. 1, a leveling stage 8 is fixed to the slide base 6 that can be moved by the Y-direction moving mechanism 23 in the Y1 or Y2 direction as viewed in this figure. After an electronic component 1 is sucked and held by the suction nozzle 11 of the head tool 3, and before a positional alignment is performed so that the solder bumps 1b of the electronic component 1 can be bonded with the solder portions 2 of a circuit board 4, respectively, the slide base 6, to which the leveling stage 8 is fixed, is moved in the Y1 or Y2 direction by the Y-direction moving mechanism 23, and moreover the head tool 3 is moved in the X1 or X2 direction by the X-direction moving mechanism 22, by which the electronic component 1 sucked and held by the suction nozzle 11 of the head tool 3 is aligned with a top surface of the leveling stage 8. Thereafter, the head tool 3 is moved down by the up/down moving unit 21 so that the solder bumps 1b of the electronic component 1 sucked and held by the suction nozzle 11 of the head tool 3 are put into contact with the top surface of the leveling stage 8. It is noted that this top surface of the leveling stage 8 is formed of a glass plate or the like having a smooth flat surface. In this state, a contact load generated by this contact is detected by the load cell 14 of the head tool 3, and further the up/down moving unit 21 is controlled according to this detected contact load so that the head tool 3 is moved down in small steps by the up/down moving unit 21, by which the contact load is controlled so as to become a preset contact load. The solder bumps 1b of the electronic component 1 are pressed against the top surface of the leveling stage 8 with the above controlled contact load, by which the solder bumps 1b are made uniform in height. Thereafter, the head tool 3 is moved up by the up/down moving unit 21, by which a positional alignment between the electronic component 1 and the circuit board 4 is performed so that the solder bumps 1b of the electronic component 1 sucked and held by the suction nozzle 11 of the head tool 3 become bondable with the solder portions 2 of the circuit board 4, respectively. Then, a mounting operation of the electronic component 1 onto the circuit board 4 is performed.

According to this first embodiment, various effects as shown below can be obtained.

First of all, according to the first embodiment, after the solder bumps 1b of the electronic component 1 are put into contact with the solder portions 2 of the circuit board 4, respectively, the solder bumps 1b and the solder portions 2 are melted by heating, while kept in that contact state, and thereafter solidified by cooling, by which the electrodes 1a of the electronic component 1 and the pads 4a of the circuit board 4 are bonded together with bonding members interposed therebetween. That is, working processes from contact to bonding between the solder bumps 1b of the electronic component 1 and the solder portions 2 of the circuit board 4 are performed at the same place. Thus, it can be made unnecessary to perform a step of conveying a circuit board to a reflow soldering working section with an electronic component temporarily bonded thereto, which is a step that would conventionally be performed after temporary bonding of the electronic component to the circuit board, and before primary bonding of the electronic component to the circuit board by collectively melting solder bumps and solder portions, as would be involved in a conventional collective reflow mounting method. Therefore, occurrence of any bonding-position shifts of the electronic component relative to the circuit board, as would occur during this conveyance, can be eliminated, making it possible to enhance a bonding quality of the electronic component onto the circuit board.

Also, after the solder bumps 1b of the electronic component 1 sucked and held by the suction nozzle 11 of the head tool 3 and the solder portions 2 of the circuit board 4 are put into contact with each other, a timing for melting the solder bumps 1b and the solder portions 2 by heating and for releasing the electronic component 1 from suction and holding by the suction nozzle 11 of the head tool 3 is set not to such a timing that this releasing is performed during melting of solder as in the conventional local reflow mounting method, but to a timing that the releasing is performed after the solder is melted, cooled and solidified. That is, electronic-component mounting is not performed based on obtainment of a self alignment effect by surface tension of molten solder as in the conventional local reflow mounting method, but mounting of the electronic component 1 onto the circuit board 4 is performed at a contact position positioned by the head tool 3. As a result of this, there can be eliminated any bonding position shifts of the electronic component 1 due to a vacuum break blow occurring to the suction nozzle 11 when the electronic component 1 is released from suction and holding by the suction nozzle 11 of the head tool 3. Consequently, it becomes possible to achieve mounting onto a circuit board of such electronic components as high-end IC chips of narrowed bump pitches, for example as narrow as 150 µm or less bump pitches, in which case bonding position shifts of an electronic component due to a vacuum break blow at the suction nozzle would matter rather than obtainment of the self alignment effect.

Also, in the head tool 3, by the arrangement that the upper end of the shaft 17 at the head-tool tip portion 3a is pressed in contact against the lower surface, i.e. load-detecting surface, of the load cell 14 by the self-weight balancing spring 15 fitted to the lower frame 16b and the spring holder portion 18 of the shaft 17 to support the shaft 17, it becomes possible to detect a load that acts upwardly of the head-tool tip portion 3a in the load cell 14.

As a result, by a contact load generated between the solder bumps 1b of the electronic component 1 sucked and held by the head tool 3 and the solder portions 2 of the circuit board 4 upon contact therebetween, the upper end of the shaft 17 of the head-tool tip portion 3a pushes up the load-detecting surface of the load cell 14, thus making it possible to reliably detect the load by the load cell 14.

Consequently, by this detection of the contact load, it becomes possible to detect in the control part 9 the fact that the solder bumps 1b of the electronic component 1 and the solder portions 2 of the circuit board 4 have come into contact with each other. Furthermore, the up/down moving unit 21 is controlled based on the detected contact load, and the head tool 3 is moved down in small steps by the up/down moving unit 21, so that an actual contact load can be more accurately controlled so as to meet a preset contact load. Thus, in a case where mounting to the circuit board is iteratively performed for a plurality of electronic components, individual electronic components can be put into contact with the circuit board constantly with the preset contact load, so that a stable bonding quality of electronic components to the circuit board can be achieved.

Here are described working effects based on embodiments in a case where both an elongation-amount correction and a shrinkage-amount correction of the head tool 3 are performed, a case in which either one of the elongation-amount correction or the shrinkage-amount correction is performed, and a case in which neither the elongation-amount correction nor the shrinkage-amount correction is performed.

After contact between the solder bumps 1b of the electronic component 1 and the solder portions 2 of the circuit board 4, the head-tool tip portion 3a is elongated in the up/down direction under an effect of heat derived from the ceramic heater 12, by which a contact load generated between the electronic component 1 and the circuit board 4 is affected. An influence load on the contact load by this elongation of the head-tool tip portion 3a is about 3 kg. Based on this influence load, working effects by the above-mentioned various combinations of the elongation-amount correction and the shrinkage-amount correction of the head-tool tip portion 3a are explained below.

First, in a case where the electronic component 1 is an IC chip having electrodes 1a of not less than 1000 bumps, and where neither an elongation-amount correction nor a shrinkage-amount correction of the head tool 3 is performed, if the electronic component 1 is an IC chip having electrodes 1a of 2000 bumps as an example, then an influence load of about 3 kg due to elongation of the head-tool tip portion 3a is equivalent to about 1.5 g per bump. After contact between the solder bumps 1b of the electronic component 1 and the solder portions 2 of the circuit board 4, the influence load due to the head-tool tip portion 3a is taken as a contact load by using the elongation amount of the head-tool tip portion 3a, where a proper contact load of about 1.5 g per bump can be generated, thus making it possible to reduce nonuniformities in melting height of the solder bumps 1b and the solder portions 2.

Next, in a case where the electronic component 1 is an IC chip having a gap width as narrow as 50 µm or less between adjacent solder bumps 1b formed at the electrodes 1a, and where only an elongation-amount correction of the head-tool tip portion 3a is performed and a shrinkage-amount correction is not performed, the solder bumps 1b of the electronic component 1 and the solder portions 2 of the circuit board 4, which are pressed into contact with each other at a preset proper contact load resulting from an elongation-amount correction of the head-tool tip portion 3a, are melted and thereafter these molten solder pieces are solidified by cooling while the head tool 3 is shrinking. That is, the molten solder is solidified by being elongated to an extent corresponding to a shrinking amount of the head-tool tip portion 3a due to the cooling. Therefore, the solder bumps 1b and the solder portions 2 after the melting and the solidification can be formed into a Japanese hand drum shape, thus making it possible to prevent contact between adjacent solder bumps.

Next, in a case where the electronic component 1 is an IC chip having electrodes 1a of not less than 1000 bumps and where an elongation-amount correction of the head-tool tip portion 3a is not performed and only a shrinkage-amount correction is performed, if the electronic component 1 is an IC chip having electrodes 1a of 2000 bumps as an example, then an influence load of about 3 kg due to elongation of the head-tool tip portion 3a is equivalent to about 1.5 g per bump. After contact between the solder bumps 1b of the electronic component 1 and the solder portions 2 of the circuit board 4, the influence load due to the head-tool tip portion 3a is taken as a contact load by using an elongation amount of the head-tool tip portion 3a, where a proper contact load of about 1.5 g per bump can be generated. By this contact load, the IC chip is pushed in to a specified extent, and further shrinkage-amount correction of the head tool 3 is performed. Thus, solder of the IC chip can be solidified while a tip position of the suction nozzle 11 of the head tool 3 is kept constant, thereby making it possible to enhance control precision for a final IC-chip rear-face height after solder cooling.

Furthermore, in a case where the electronic component 1 is an IC chip having electrodes 1a of less than 1000 bumps, and where both an elongation-amount correction and a shrinkage-amount correction of the head-tool tip portion 3a are performed, if the electronic component 1 is an IC chip having electrodes 1a of 100 bumps as an example, then an influence load of about 3 kg due to elongation of the head-tool tip portion 3a is equivalent to about 30 g per bump. In this case, without performing the elongation-amount correction, an excessive load would be applied to the solder bumps 1b, thereby causing bump crushes to occur. Thus, elongation-amount correction and shrinkage-amount correction of the head-tool tip portion 3a are performed so as to enable bonding free from bump crushes.

Consequently, from the individual cases as described the above, it becomes possible to obtain required bonding qualities of electronic components, depending on whether both an elongation-amount correction and a shrinkage-amount correction of the head-tool tip portion 3a are performed, or whether only either one of the elongation-amount correction or the shrinkage-amount correction is performed, or whether neither the elongation-amount correction nor the shrinkage-amount correction is performed, according to a number of solder bumps 1b formed at the electrodes 1a of the electronic component 1 to be mounted, or to bonding precision required for the electronic component 1.

Also, in a case where a standby operation for start of an elongation-amount correction operation is performed during a time period from a start of temperature increase of the suction nozzle 11 at step SP10 until a start of an elongation-amount correction operation of the head tool 3 at step SP14, even if an elongation amount of the head tool 3 is affected by, for example, nonuniform heat transfer or thermal disturbance or the like, during an initial stage of heating, to the suction nozzle 11, such effects during this initial stage can be eliminated by the standby operation, and thereafter the elongation-amount correction operation of the head tool 3 can be performed. In addition, working effects similar to the foregoing can be obtained also with a shrinkage-amount correction of the head tool 3.

It is noted that numerical values of various loads in the above description are those as an example in this embodiment, and this embodiment is not limited to these numerical values.

Furthermore, after start of temperature increase of the suction nozzle 11 by heating by the ceramic heater 12, a load detection is performed by the load cell 14 as a constant-load control state by the head tool 3. By deciding a decrease of this detected load as a start of solder melting, a control mode is switched from a constant-load control state of the head tool 3 to a positional control in which a tip height position of the suction nozzle 11 is maintained constant, thus making it possible to maintain the tip height position of the suction nozzle 11 even during melting of solder. As a result of this, when the solder bumps 1b of the electronic component 1 and the solder portions 2 of the circuit board 4 are melted, molten solder bumps 1b and solder portions 2 can be prevented from crushing due to lowering of the tip position of the suction nozzle 11. Thus, it becomes possible to reliably perform rear-face height control of an electronic component even during solder melting.

Further, during constant-load control of the head tool 3 as described above, with a constant load set to a load higher than a contact load upon contact detection, this load is controlled so as to be constant, and applied to the electronic component 1 and the circuit board 4. Thus, even in such a case where some of the solder bumps 1b and the solder portions 2 are in a noncontact state due to nonuniformities in a formation height of the solder bumps 1b and the solder portions 2 upon detection of contact between the solder bumps 1b of the electronic component 1 and the solder portions of the circuit board 4, applying the constant load as described above makes it possible to enhance contactability between the solder bumps 1b and the solder portions 2, respectively, so that all solder pieces can be securely melted, and thus that bonding reliability between the electronic component and the circuit board can be enhanced.

Furthermore, after the electronic component 1 sucked and held by the suction nozzle 11 of the head tool 3 is aligned so as to be bondable to the circuit board 4, a pressing load, with which the shaft 17 at the head-tool tip portion 3a is pressed against the load-detecting surface of the load cell 14 by the self-weight balancing spring 15, is detected by the load cell 14, and this detected pressing load is outputted to the control part 9. In the control part 9, this pressing load is set as a load-zero point in the load cell 14. Thus, even in a case where the pressing load by the head-tool tip portion 3a changes in the load cell 14 because of changes of spring characteristics of the self-weight balancing spring 15 under influence of heat or the like, there are no differences between an actual contact load upon contact between the solder bumps 1b of the electronic component 1 and the solder portions 2 of the circuit board 4, and a detected value of a contact load detected by the load cell 14, thus allowing control of the actual contact load according to the preset contact load to be achieved. Thus, in a case where mounting to a circuit board is iteratively performed for a plurality of electronic components, individual electronic components can be put into contact with the circuit board constantly with the preset contact load, so that a stable bonding quality of electronic components to the circuit board can be achieved.

Furthermore, after contact between the solder bumps 1b of the electronic component 1 and the solder portions 2 of the circuit board 4, and during melting of the solder bumps 1b and the solder portions 2, the head tool 3 performs a reshaping operation of the solder bumps 1b of the electronic component 1, by which mutual wettability of the solder bumps 1b of the electronic component 1 and the solder portions 2 of the circuit board 4 in a molten state can be improved. Thus, solderability onto the electrodes 1a of the electronic component 1 and the pads 4a of the circuit board 4 can be made successful, and bonding reliability between an electronic component and the circuit board can be enhanced.

Furthermore, before the electronic component 1 is put into contact with the circuit board 4, a leveling operation for making uniform a height of the solder bumps 1b of the electronic component 1 is performed. By so doing, even in a case where the solder bumps 1b of the electronic component 1 have nonuniformities in terms of formation height, these nonuniformities can be eliminated so that the solder bumps 1b can be made uniform in height. As a result, upon contact between the solder bumps 1b of the electronic component 1 and the solder portions 2 of the circuit board 4, influences on a contact load control due to nonuniformities of the formation height of the solder bumps 1b can be eliminated, so that controllability on the contact load can be made successful, and so that the contact load can be applied to the solder bumps 1b more uniformly. Consequently, the electrodes 1a of the electronic component 1 and the pads 4a of the circuit board 4 can be bonded together with solder interposed therebetween reliably with a more uniform contact load, and a stabler bonding quality between the electronic components and the circuit board can be achieved.

Furthermore, in such a case as a rear-face height precision of the electronic component 1, after bonding of the electronic component 1 to the circuit board 4, is required, a leveling operation is performed so that the solder bumps 1b of the electronic component 1 are made uniform in formation height. By so doing, it becomes possible to stabilize a rear-face height of the electronic component 1 after its mounting onto the circuit board 4. It is noted that this leveling operation, when applied to electronic components 1 having, for example, at least 1000 solder bumps 1b, allows a stabler bonding quality to be achieved, and hence be effective.

Second Embodiment

It is noted that the present invention is not limited to the above-described embodiment and may be embodied in other various modes. For example, an electronic component mounting method according to a second embodiment of the invention is an electronic component mounting method for mixedly mounting a plurality of types of electronic components onto a circuit board during different methods.

A first electronic component, which is one type of an electronic component from among the plurality of types of electronic components, is a general-purpose electronic component which is unlikely to incur defective bonding of the electronic component onto a circuit board due to a bonding position shift by virtue of its large bump pitch at which solder bumps are formed at electrodes of the electronic component, respectively, in the conventional collective reflow mounting method even if the bonding position shift of the electronic component with respect to the circuit board has occurred during a process in which the circuit board with the electronic component temporarily bonded thereon is conveyed to the reflow soldering working section. The first electronic component is, for example, a general-purpose electronic component 31 having a bump pitch of at least 150 μm of bumps formed on individual electrodes of the general-purpose electronic component. Further, a second electronic component, which is another type of electronic component, is a high-end electronic component which is required to meet such a high precision for a bonding position that the above-mentioned bonding position shift would incur defective bonding of the electronic component onto a circuit board in the conventional collective reflow mounting method. The second electronic component is, for example, a high-end electronic component 41 such as a high-end IC chip having a bump pitch of at most 150 μm or less required to meet a bonding position precision of 5 μm. With these electronic components, a plurality of general-purpose electronic components 31 are mounted onto the circuit board by a collective reflow mounting method, and thereafter the high-end electronic components 41 are mounted onto the circuit board by a local reflow mounting method of the foregoing first embodiment.

The electronic component mounting method according to the second embodiment of the invention is described in detail below with reference to FIGS. 12A to 12D and FIGS. 13E to 13H.

Figure 12A:
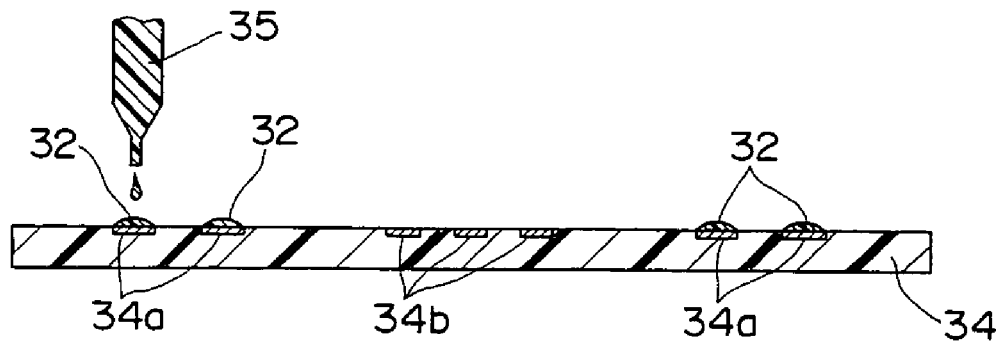

As shown in FIG. 12A, a rectangular-plate shaped circuit board 34 has a plurality of electrodes, pads 34a and 34b, on its top surface, wherein the pads 34a are bondable to general-purpose electronic components 31 and the pads 34b are bondable to high-end electronic components 41. Flux is fed by a feed nozzle 35 onto the pads 34a of the circuit board 34, which are bondable to the general-purpose electronic components 31, so that flux portions 32 are formed on the pads 34a, respectively.

Figure 12B:
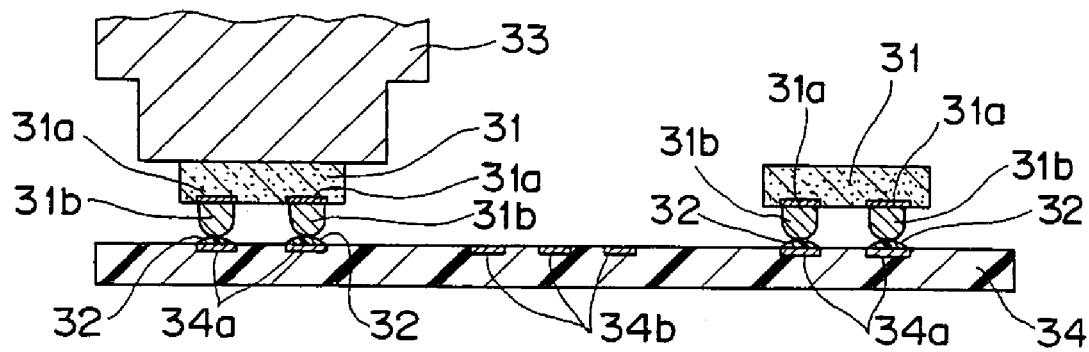

Next, in FIG. 12B, general-purpose electronic component 31, on which solder bumps 31b, serving as bonding members, are formed on the plurality of electrodes 31a and which has a rectangular-plate shape, is sucked and held at its rear surface which has no electrodes by a tool 33 as an example of a component holding member. Then, the general-purpose electronic component 31 is aligned with the circuit board 34 so that the solder bumps 31b of the general-purpose electronic component 31 becomes bondable to the flux portions 32 formed on the pads 34a of the circuit board 34, respectively. Thereafter, the tool 33 sucking and holding the general-purpose electronic component 31 is moved down so that the solder bumps 31b of the general-purpose electronic component 31 are pressed against the pads 34a of the circuit board 34 via the flux portions 32, and thus are temporarily bonded. For each of the general-purpose electronic components 31, these working steps are iteratively performed, by which the general-purpose electronic components 31 are temporarily bonded to the circuit board 34.

Figure 12C:
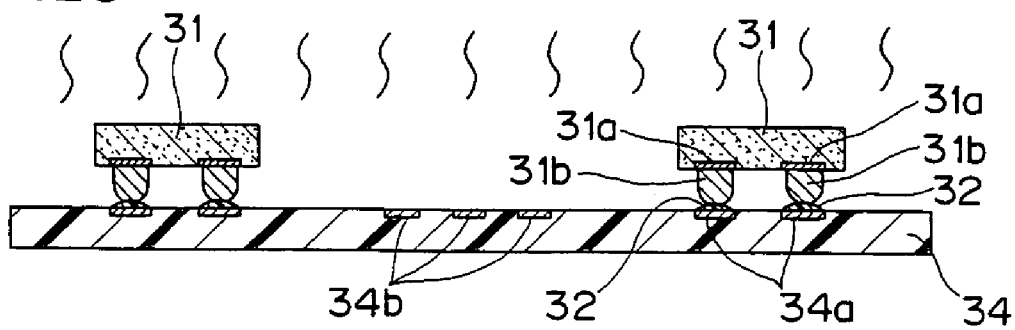

Next, the circuit board 34, to which the general-purpose electronic components 31 are temporarily bonded, is conveyed to a reflow soldering working section, where as shown in FIG. 12C, the general-purpose electronic components 31 and the circuit board 34 are heated by a heat source in the reflow soldering working section, by which the solder bumps 31b of the respective general-purpose electronic components 31 are melted.

Figure 12D:
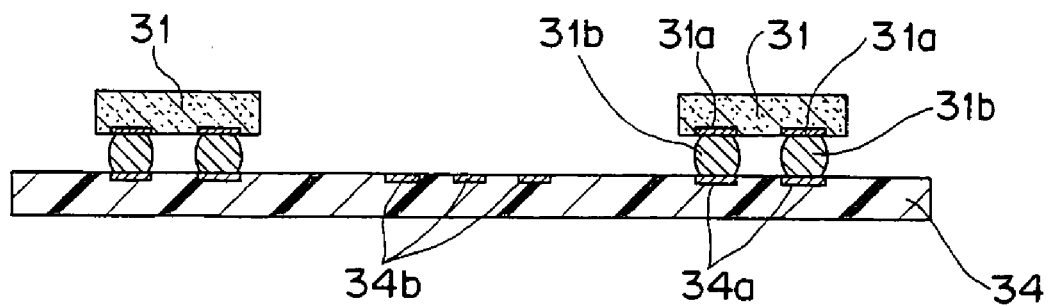

Thereafter, as shown in FIG. 12D, the heated general-purpose electronic components 31 and circuit board 34 are cooled, by which the molten solder bumps 31b of the general-purpose electronic components 31 are solidified, so that the electrodes 31a of the general-purpose electronic components 31 are finally bonded to the pads 34a of the circuit board 34, respectively, via the solder bumps 31b; thus the general-purpose electronic components 31 are collectively mounted onto the circuit board 34.

Figure 13E:
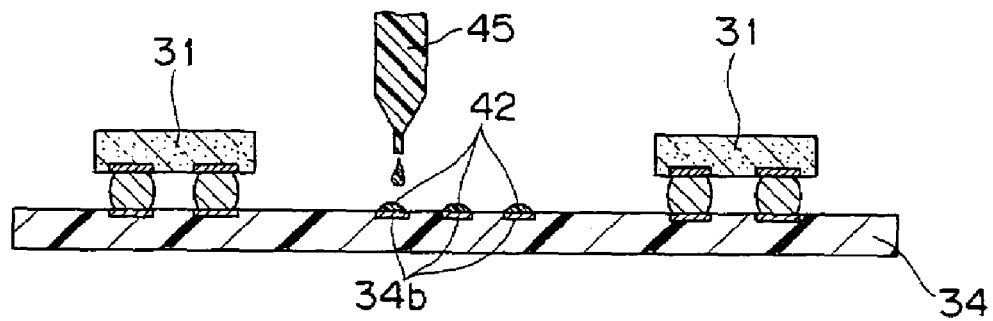

Next, as shown in FIG. 13E, flux is fed by a nozzle 45 onto the pads 34b, that are bondable to high-end electronic component 41, in the circuit board 34 with the general-purpose electronic components 31 mounted thereon, by which flux portions 42 are formed on the pads 34b.

Figure 13F:
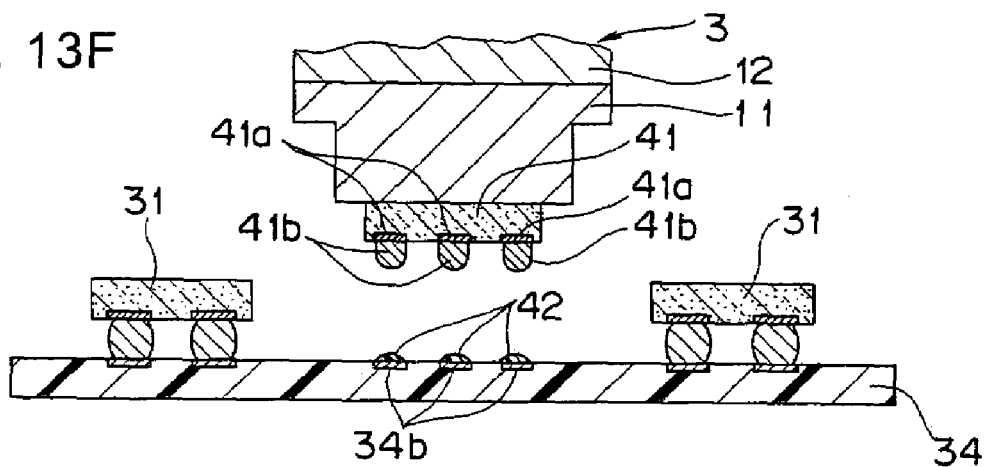

Next, as shown in FIG. 13F, the rectangular-plate shaped high-end electronic component 41, on which solder bumps 41b are formed on the plurality of electrodes 41a and which has a rectangular-plate shape, is sucked and held at its rear surface which has no electrodes 41a by a suction nozzle 11 of head tool 3. Then, the high-end electronic component 41 is aligned with the circuit board 34 so that the solder bumps 41b of the high-end electronic component 41 becomes bondable to the pads 34b of the circuit board 34 via the flux portions 42, respectively.

Figure 13G:
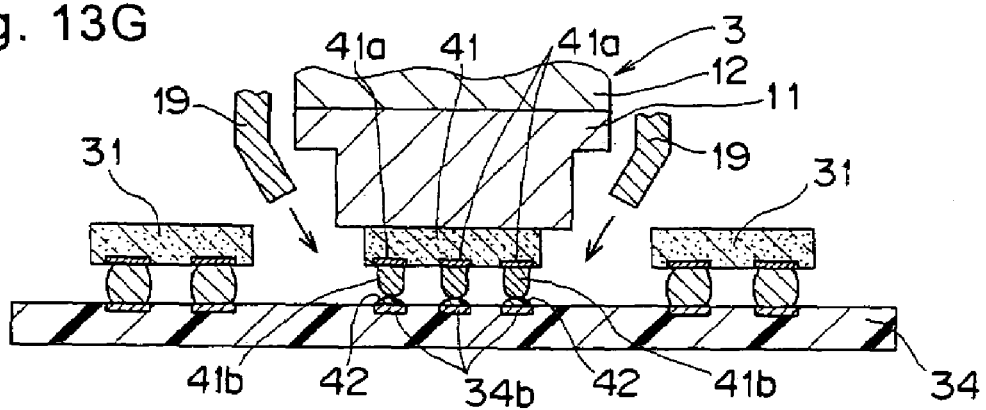

Thereafter, as shown in FIG. 13G, the suction nozzle 11 of the head tool 3 sucking and holding the high-end electronic component 41 is moved down so that the solder bumps 41b of the high-end electronic component 41 are put into contact with the pads 34a of the circuit board 34 via the flux portions 42. After this contact, the solder bumps 41b of the high-end electronic component 41, which are in contact with the flux portions 42 of the circuit board 34, respectively, are heated and thereby melted by ceramic heater 12 of the head tool 3. Thereafter, heating by the ceramic heater 12 is stopped, and then the molten solder is subjected to cooling by blows from cooling blow nozzle 19, thereby the molten solder bumps 41b are solidified, so that the electrodes 41a of the high-end electronic component 41 and the pads 34b of the circuit board 34 are bonded to the solder bumps 41b, respectively. Otherwise, the solder may also be solidified by natural cooling of the molten solder instead of the forced cooling of the molten solder by the cooling blow nozzle 19.

Figure 13H:
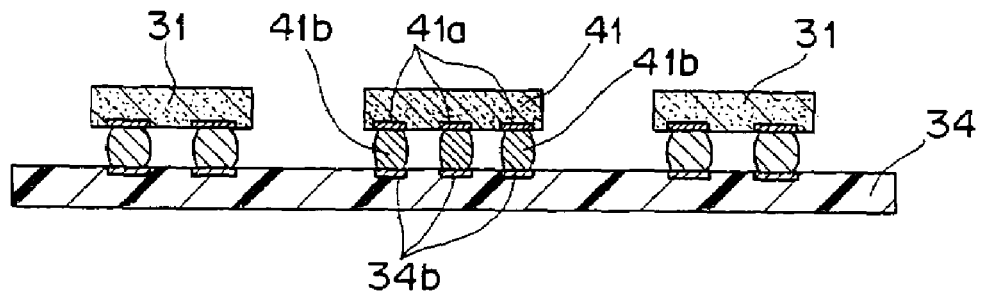

Thereafter, as shown in FIG. 13H, the sucking and holding of the high-end electronic component 41 by the suction nozzle 11 of the head tool 3 is released, and the head tool 3 is moved up.

Through the electronic component mounting method as described the above, the general-purpose electronic components 31 and the high-end electronic component 41 are mixedly mounted onto the circuit board 34.

Although the above description has been made for a case where the bonding members are the solder bumps 1b preliminarily formed on the electrodes 31a of the general-purpose electronic components 31 as well as the solder bumps 41b preliminarily formed on the electrodes 41a of the high-end electronic component 41, the bonding members may also be only the solder bumps preliminarily formed on the electrodes 31a of the general-purpose electronic components 31, the solder bumps preliminarily formed on the electrodes 41a of the high-end electronic component 41, and the solder portions preliminarily formed on the pads 34a and 34b of the circuit board 34.

Furthermore, the flux may also be fed onto the electrodes 31a of the general-purpose electronic components 31, or onto the electrodes 41a of the high-end electronic component 41, or onto the pads 34a and 34b of the circuit board 34, or onto the solder bumps or solder portions, which are the bonding members, whichever the case may be, and otherwise, in another case flux is not fed. In addition, depending on the type of the flux supplied by coating, there are some cases where the flux supplied by coating is removed by cleaning after mounting of the general-purpose electronic components 31 and the high-end electronic component 41 onto the circuit board 34.

According to the second embodiment as described above, in such cases as the general-purpose electronic components 31 having a bump pitch of at least 150 μm of bumps formed on individual electrodes of the electronic components, and the high-end electronic component 41 having a pitch of at most 150 μm of its bumps, are mixedly mounted on the circuit board 34, the general-purpose electronic components 31, for which high precision for a bonding position is not required, are first mounted onto the circuit board 34 by the conventional collective reflow mounting method, and thereafter the high-end electronic component 41, for which high precision for a bonding position is required, is mounted by the local reflow mounting method of the first embodiment onto the circuit board 34, on which the general-purpose electronic components 31 have been mounted.

In the mounting method of the general-purpose electronic components 31 onto the circuit board 34, even in a case where a bonding position shift of the general-purpose electronic components 31 with respect to the circuit board 34 has occurred during conveyance of the circuit board 34, with the general-purpose electronic components 31 temporarily bonded thereon, to the reflow soldering working section, since the solder bumps 31b formed on the electrodes 31a of the general-purpose electronic components 31 are formed so as to be have a bump pitch not less than 150 μm, a bonding position shift is unlikely to incur defective bonding of the general-purpose electronic components 31 to the circuit board 34. Further, in the mounting method of the general-purpose electronic components 31 onto the circuit board 34, it is not required to enhance bonding position precision, but rather to suppress mounting costs.

Accordingly, the general-purpose electronic components 31, after being temporarily bonded onto the circuit board 34, can be finally bonded and mounted onto the circuit board 34 by collectively melting their solder, thus allowing mounting work to be performed efficiently. Thus, costs associated with mounting of the general-purpose electronic components 31 onto the circuit board 34 can be suppressed.

On the other hand, the high-end electronic component 41 is sucked and held by the suction nozzle 11 of the head tool 3 from contact between the solder bumps 41b of the high-end electronic component 41 and the flux portions 42 of the circuit board 34 until solidification of the solder after its melting; thus the high-end electronic component 41 is prevented from occurrence of bonding position shifts, so that the high-end electronic component 41 can be mounted onto the circuit board 34 with high precision for its bonding position.

Consequently, in the electronic component mounting method for cases in which the general-purpose electronic components 31 and the high-end electronic component 41 are mixedly mounted onto the circuit board 34, it becomes possible to obtain successful results in both productivity and quality by switching a method for individual electronic components depending on a bonding position precision required for the individual electronic components.

Third Embodiment

Further, the mounting apparatus to be used for the electronic component mounting method according to a third embodiment of the invention is an electronic component mounting apparatus in which the head tool further includes a pressing mechanism for pressing an electronic component against a circuit board, wherein the electronic component mounting apparatus employs a head tool that has two large-and-small pneumatic cylinders as an example of the pressing mechanism and that is usable also for local reflow mounting apparatuses, and wherein electronic component mounting can be performed by the local reflow mounting method according to the first embodiment with the electronic component mounting apparatus having this head tool, and moreover the electronic component mounting apparatus is adaptable to local reflow mounting methods.

Figure 14:
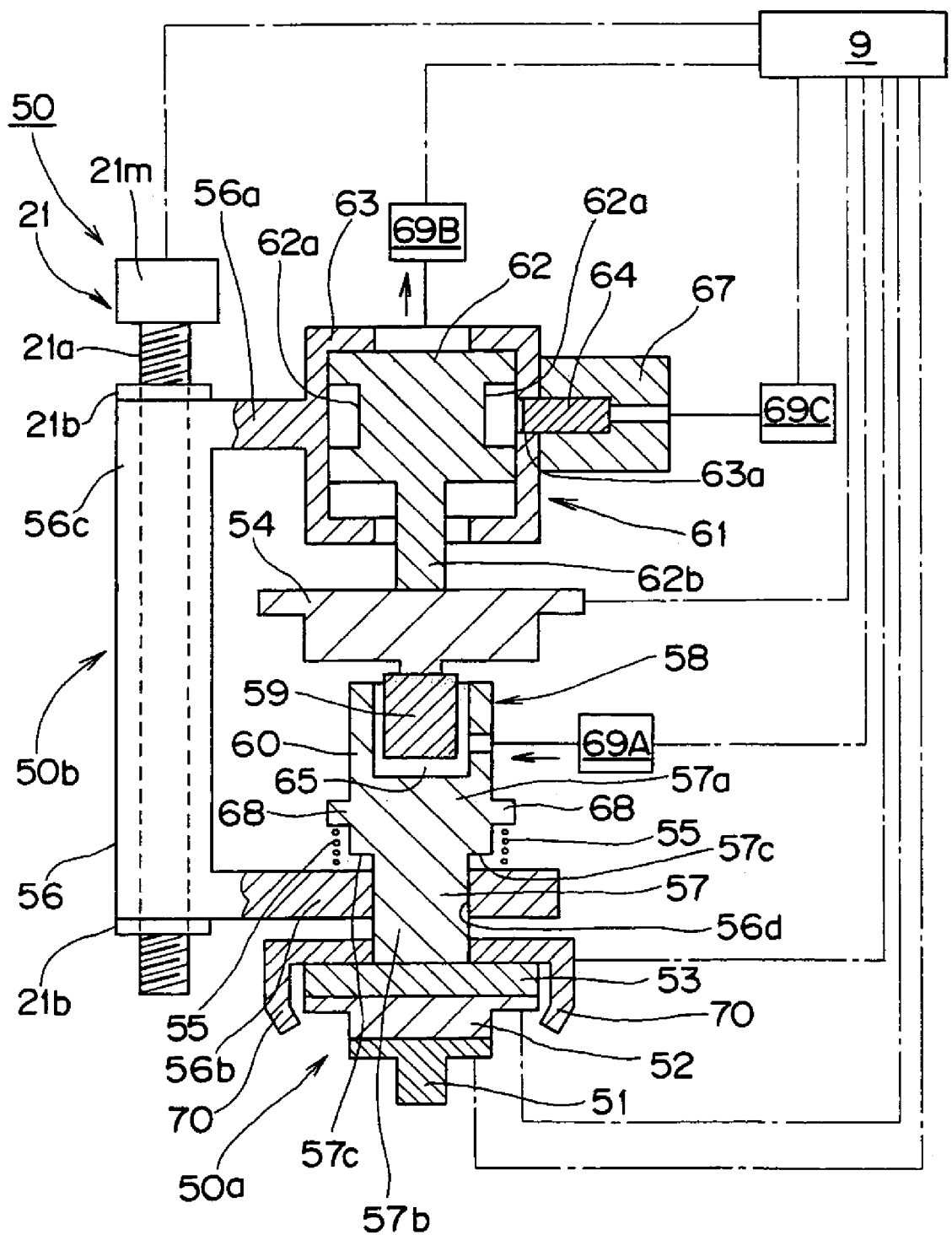
FIG. 14 is a sectional view of a head tool schematically showing structure of the head tool in an electronic component mounting apparatus according to a third embodiment of the invention.

Structure of this head tool is explained in detail. Referring to FIG. 14, a head tool 50 comprises a head-tool tip portion 50a for performing suction and holding, heating or other operations on electronic component 1, and a head-tool body portion 50b for supporting the head-tool tip portion 50a and exercising up-and-down operations on the head tool 50, wherein the head-tool tip portion 50a has a small cylinder 58 and the head-tool body portion 50b has a large cylinder 61, respectively, coaxially.

In FIG. 14, the head-tool tip portion 50a includes, as viewed from its tip side, a suction nozzle 51 capable of sucking and holding the electronic component 1, a ceramic heater 52 for heating the electronic component 1 sucked and held by the suction nozzle 51, a water jacket 53 for performing thermal interception so that heat derived from the ceramic heater 52 is not transferred to the head-tool body portion 50b, a shaft 57 fitted to an upper portion of the water jacket 53, and the small cylinder 58 provided at an upper portion of the shaft 57, wherein the cooling blow nozzle 70, for cooling the electronic component 1 heated by the ceramic heater 52, is further fitted at a lower-portion periphery of the shaft 57.

Also in FIG. 14, the head-tool body portion 50b comprises a frame 56 for supporting the head-tool tip portion 50a, the large cylinder 61 provided at an upper portion of the frame 56, and a load cell 54 fitted to a lower portion of the large cylinder 61.

The frame 56, which is formed of rigid body into a generally U shape, comprises an upper frame 56a where the large cylinder 61 is provided, a lower frame 56b for supporting the shaft 57 of the head-tool tip portion 50a via a self-weight balancing spring 55 which is an elastic member fitted to a lower portion of an annular-protrusion shaped spring holder portion 68 provided at a side portion of the shaft 57 so as to surround an outer periphery of the shaft 57. The lower frame 56b further serves for guiding up-and-down motions of the shaft 57, and the frame 56 further comprises a cylindrical-shaped intermediate frame 56c for supporting the upper frame 56a and the lower frame 56b.

The shaft 57 has a stepped portion 57c nearly intermediately of its axial direction, wherein with the stepped portion 57c serving as a boundary, the shaft 57 has a shaft lower portion 57b smaller in diameter than a shaft upper portion 57a. Further, this shaft lower portion 57b extends through a hole 56d formed in the lower frame 56b supporting the shaft 57 via the self-weight balancing spring 55, wherein the hole 56d of the lower frame 56b is formed so as to be capable of guiding up-and-down motions of the shaft 57 and is smaller in diameter than the shaft upper portion 57a of the shaft 57. As a result of this, the shaft 57 can be guided by the hole 56d of the lower frame 56b to move up and down via the self-weight balancing spring 55. Also, even if the self-weight balancing spring 55 has become no longer capable of supporting the shaft 57 due to damage or the like, a peripheral portion of the hole 56d of the lower frame 56b can support the shaft 57 by the stepped portion 57c of the shaft 57 so that the shaft 57 is prevented from falling off.

Further, the shaft lower portion 57b has a ball-spline outer ring and a shaft, and the lower frame 56b has a bearing inside the hole 56d, wherein the ball-spline outer ring is fitted inside the bearing. Thus, the shaft 57 can be rotated about its axis while being supported by the lower frame 56b, and also moved up-and-down in an axial direction.

The intermediate frame 56c is cylindrical at both ends, which are fixed to nut portions 21b of up/down moving unit 21. Rotating a ball screw shaft 21a, screwed to the nut portions 21b, by a motor 21m in the up/down moving unit 21 causes the intermediate frame 56c to be operated to move up and down, by which the frame 56 is operated to move up and down, by which the head tool 50 as a whole is operated to move up and down.

Also, the small cylinder 58 includes a cylindrically-shaped guide 60 formed at the shaft upper portion 57a of the shaft 57, and a columnar-shaped rod 59 disposed inside the guide 60 and guided by an interior of the guide 60 to move up and down within the guide 60, wherein compressed air can be supplied and exhausted to a compressed air supply chamber 65 surrounded by an inner surface of the guide 60 and a lower surface of the rod 59.

Also, the large cylinder 61 includes a cylindrically-shaped guide 63 formed at an end portion of the upper frame 56a, and a columnar-shaped rod 62 disposed inside the guide 63 and guided by an interior of the guide 63 to move up and down within the guide 63, and further the rod 62 has a lower end of a narrow-neck portion 62b, i.e., its lower portion, fitted to an upper surface of the load cell 54. The large cylinder 61 further includes a compressed air supply chamber 66 surrounded by the inner surface of the guide 63 and the upper surface of the rod 62, so that compressed air can be supplied and exhausted to the compressed air supply chamber 66.

Also, the suction nozzle 51, the ceramic heater 52, the water jacket 53, the shaft 57, the guide 60 of the small cylinder 58, the rod 59, the load cell 54, the guide 63 of the large cylinder 61 and the rod 62 are positioned coaxially on one axis, so that the rod 62 of the large cylinder 61 and the rod 59 of the small cylinder 58 move up and down on this same axis. Further, since this axis is positioned so as to be parallel to an axis of up/down operations of the up/down moving unit 21, individual constituent parts of the head tool 50 positioned coaxially as described above are up-and-down movable on the same axis by the up/down operations of the up/down moving unit 21.

Further, an upper end of the rod 59 of the small cylinder 58 in the head-tool tip portion 50a can be put into contact with a load-detecting lower surface of the load cell 54 at the head-tool tip portion 3a which is supported on the lower frame 56b via the self-weight balancing spring 55. Thus, when the upper end of the rod 59 of the small cylinder 58 makes contact with the load cell 54, this contact enables the load cell 54 to detect a load that acts upwardly on the load-detecting lower surface of the load cell 54.

Further, in the large cylinder 61, the rod 62 has a trench-like recess portion 62a in an outer periphery of its columnar-shaped side face, which is an axially central portion of the rod 62, while the guide 63 has on its cylindrical-shaped side face a hole 63a at a position where the guide 63 is fittable into the recess portion 62a of the rod 62. Further, a bar-shaped stopper 64, which is an example of a bar member that can pass through this hole 63a of the guide 63, is formed so as to be fittable into the recess portion 62a of the rod 62 through the hole 63a of the guide 63 from outside of the guide 63 by a stopper driving cylinder 67, which is an example of a bar-member drive mechanism provided outside the guide 63. The rod 62 of the large cylinder 61 can be restricted in its up-and-down motions by a driving operation of the stopper driving cylinder 67 for making the stopper 64 pass through the hole 63a of the guide 63 and thereby fitted into the recess portion 62a of the rod 62, and an example of a restricting mechanism for restricting operations of the rod 62 of the large cylinder 61 is constituted as described above. It is noted that an inner axial width of the recess portion 62a of the rod 62 is set slightly larger than an axial width of the stopper 64, so that the rod 62 having the recess portion 62a, in a state that the stopper 64 is fitted inside the recess portion 62a, i.e., in a state that the rod 62 is restricted in its up-and-down motions, is enabled to move up and down to a little extent corresponding to an extent by which the inner axial width of the recess portion 62a is larger than that of the stopper 64.

Also, the large cylinder 61, the small cylinder 58 and the stopper driving cylinder 67 are connected respectively to compressed-air supply and exhaust sections 69A, 69B and 69C, each of which is an example of a compressed-air supply and exhaust mechanism. Each of the compressed-air supply and exhaust sections 69A, 69B and 69C is made up of an air supply portion for supplying compressed air, an air exhaust portion for exhausting compressed air, a switching valve for switching between air supply from the air supply portion and air exhaust from the air exhaust portion, and an air supply-and-exhaust line for compressed air connected from the switching valve to the cylinders, respectively.

Also, the cooling blow nozzle 70 fitted on the periphery of the shaft lower portion 57b, which is a lower periphery of the shaft 57, is formed so as to surround both sides of the water jacket 53 and the ceramic heater 52, which are positioned under the shaft 57. Further, a tip of the cooling blow nozzle 70 is directed toward an electronic-component suction and holding surface, i.e. lower surface, of the suction nozzle 51, so that a blow from the cooling blow nozzle 70 can cool electronic component 1 sucked and held by the suction nozzle 51.

Control part 9 controls a sucking operation of the suction nozzle 51, a heating operation of the ceramic heater 52, supply-and-exhaust operations of the compressed-air supply and exhaust sections 69A to 69C connected to the large cylinder 61, the small cylinder 58 and the stopper driving cylinder 67, respectively, and a moving operation of the up/down moving unit 21, and a load detected by the load cell 54 is outputted to the control part 9.

Next, operation of the head tool 3 in this third embodiment is explained with reference to FIGS. 14 and 15.

First, in a case where the head tool 3 is used in the local reflow mounting method of the first embodiment, referring to FIG. 14, compressed air is supplied to the compressed air supply chamber 65 in the small cylinder 58 by the compressed-air supply and exhaust section 69A, so that the rod 59 is moved within the guide 60 upwardly along the inner surface of the guide 60 by pressure of this supplied compressed air, thereby bringing the upper end of the rod 59 into contact with the lower surface of the load cell 54. Further, the rod 62 in the large cylinder 61 is pushed up via the load cell 54, so that the rod 62 is moved within the guide 63 upwardly along the inner surface of the guide 63. When this is done, the stopper 64 for restriction of the up-and-down motions of the rod 62 of the large cylinder 61 is not fitted inside the recess portion 62a of the rod 62; thus the stopper 64 is in the OFF state, and the rod 62 is in a state that the rod 62 is freely up-and-down movable within the guide 63 along the inner surface of the guide 63.

Figure 15:
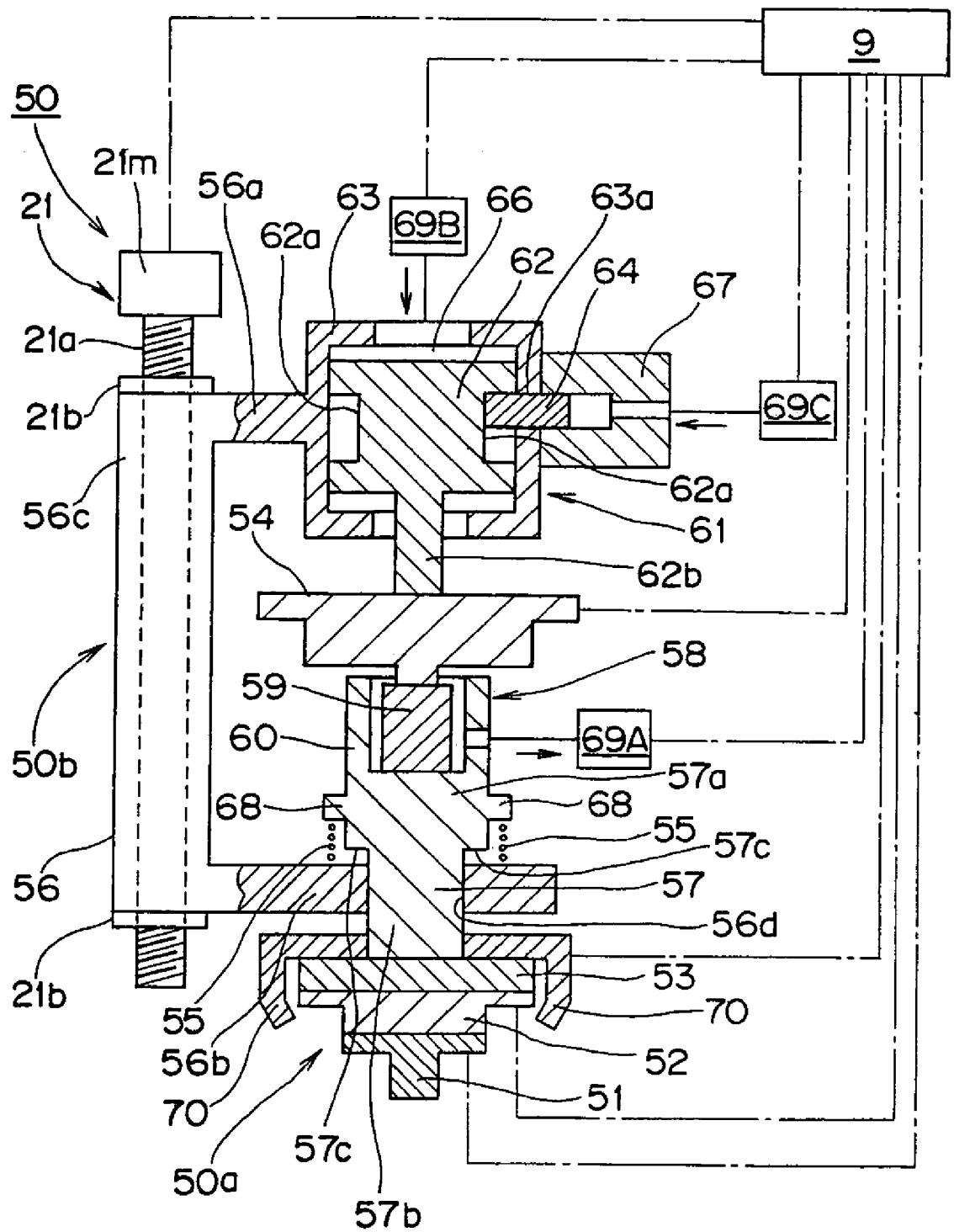
FIG. 15 is a sectional view of the head tool schematically showing the structure of the head tool in the electronic component mounting apparatus according to the third embodiment of the invention.

Next, after the upper surface of the rod 62 of the large cylinder 61 pushed up and moved upwardly is brought into contact with an inner upper surface of the guide 63, and the rod 62 having reached an upper end of its up-and-down motion along the inner surface of the guide 63, OFF-state stopper 64 for restriction of the up-and-down motions of the rod 62 of the large cylinder 61 is fitted into the recess portion 62a of the rod 62 while made to pass through the hole 63a of the guide 63 by supplying compressed air to the stopper driving cylinder 67 by the compressed-air supply and exhaust section 69C, as shown in FIG. 15; thus causing the stopper 64 to be brought into the ON state.

Thereafter, supply of the compressed air to the compressed air supply chamber 65 in the small cylinder 58 by the compressed-air supply and exhaust section 69A is stopped, compressed air is exhausted from the compressed air supply chamber 65 in the small cylinder 58 by the compressed-air supply and exhaust section 69A while compressed air is supplied to the compressed air supply chamber 66 in the large cylinder 61 by the compressed-air supply and exhaust section 69B. Thus, by pressure of the compressed air supplied to the compressed air supply chamber 66, the rod 62 of the large cylinder 61 is pushed down, so that the load cell 54 fitted to the lower end of the narrow-neck portion 62b, which is a lower portion of the rod 62, is moved downwardly, by which the rod 59 of the small cylinder 58 with its upper end in contact with the lower surface of the load cell 54 is pushed down via the load cell 54 and moved downwardly.

Thereafter, the lower end of the rod 59 of the small cylinder 58 comes into contact with an inner lower end of the guide 60, so that the rod 59 comes into a structure integrated with the shaft 57 forming the guide 60 as a result of this contact. Further, by the rod 59 being pressed downwardly, the head-tool tip portion 50a in its entirety supported by the lower frame 56b via the self-weight balancing spring 55 is pushed down, resulting in a state that the self-weight balancing spring 55 is compressed by this press-down load. Then, in the large cylinder 61, the inner upper surface of the recess portion 62a of the pushed-down rod 62 comes into contact with the upper portion of the stopper 64, and in this contact position, the rod 62 is pressed downwardly and fixed by pressure of the compressed air supplied to the compressed air supply chamber 66. It is noted that for relaxation of impact upon contact between the rod 62 and the stopper 64, a quantity of compressed air supplied to the compressed air supply chamber 66 in the compressed-air supply and exhaust section 69B is controlled stepwise by a load detected by the load cell 54.

Now a relationship between the inner axial width of the recess portion 62a of the rod 62 and the axial width of the stopper 64 is explained here in further detail. The relationship of these two widths is as follows. That is, after performing steps such that the rod 59 of the small cylinder 58 is pushed up and moved upwardly within the guide 60 along the inner surface of the guide 60, by which the rod 62 of the large cylinder 61 is pushed up via the load cell 54 and moved upwardly within the guide 63 along the inner surface of the guide 63, and when the rod 62 has been moved until the upper surface of the rod 62 comes into contact with the inner upper surface of the guide 63, the stopper 64 is fittable within the recess portion 62a of the rod 62. Moreover, after that, the rod 62 of the large cylinder 61 is pushed down and moved downwardly within the guide 63 along the inner surface of the guide 63, by which the rod 59 of the small cylinder 58 is pushed down via the load cell 54 and moved downwardly within the guide 60 along the inner surface of the guide 60 until the lower end of the rod 59 comes into contact with the inner lower end of the guide 60, and the rod 59 is further pressed, by which it becomes possible to obtain a state that the self-weight balancing spring 55 is compressed by this pressing force with which the self-weight balancing spring 55 is pressed, in which state the inner upper surface of the recess portion 62a of the rod 62 is brought into contact with the upper portion of the stopper 64.

In the head tool 50 in such a state as described above, the electronic component 1 is sucked and held to the suction nozzle 51, and positional alignment between the electronic component 1 and the circuit board 4 is performed. Thereafter, while the electronic component 1 is kept sucked and held by the suction nozzle 51, the head tool 50 is moved down by the up/down moving unit 21, by which the solder bumps 1b of the electronic component 1 are put into contact with the solder portions 2 of the circuit board 4, respectively. In this state, by a contact load that occurs, the upper end of the rod 59 of the small cylinder 58 formed into an integral structure with the shaft 57 at the upper portion of the head-tool tip portion 50a presses the load-detecting surface of the load cell 54, so that a contact load is detectable in the load cell 54.

By detecting the contact load in the load cell 54 in this way, occurrence of contact between the solder bumps 1b of the electronic component 1 and the solder portions 2 of the circuit board 4 is detected. Moreover, the contact load detected by the load cell 54 is outputted to the control part 9, while the up/down moving unit 21 is controlled by the control part 9 so as to obtain a contact load preset in the control part 9. Thus, the up/down moving unit 21 is controlled so that the contact load detected by the load cell 54 becomes a preset contact load.

Next, in a case where the head tool 50 is used in the local reflow mounting method of the prior art, referring to FIG. 15, in the head tool 50 in a state of use in the local reflow mounting method of the first embodiment, the stopper 64 is turned ON, and compressed air is supplied to the compressed air supply chamber 66 in the large cylinder 61 by the compressed-air supply and exhaust section 69B.

First, a quantity of compressed air supplied to the compressed air supply chamber 66 is decreased stepwise by the compressed-air supply and exhaust section 69B so that this supply of the compressed air is stopped, and thereafter supply of compressed air to the compressed air supply chamber 65 in the small cylinder 58 is started by the compressed-air supply and exhaust section 69A. As a result of this, as shown in FIG. 14, the rod 59 of the small cylinder 58 is pushed up and moved upwardly within the guide 60 along the inner surface of the guide 60, by which the upper end of the rod 59 is brought into contact with the lower surface of the load cell 54. Further, the rod 62 in the large cylinder 61 is pushed up via the load cell 54 and moved upwardly within the guide 63 along the inner surface of the guide 63.

Thereafter, the stopper 64 fitted within the recess portion 62a of the rod 62 is withdrawn from the recess portion 62a of the rod 62 by exhausting compressed air that has been supplied to the stopper driving cylinder 67 by the compressed-air supply and exhaust section 69C, by which the stopper 64 that has been turned ON is turned OFF.

In the head tool 50 in such a state as described above, the electronic component 1 is sucked and held to the suction nozzle 51, and positional alignment between the electronic component 1 and the circuit board 4 is performed. Thereafter, while the electronic component 1 is kept sucked and held by the suction nozzle 51, the head tool 50 is moved down by the up/down moving unit 21, and compressed air is supplied to the compressed air supply chamber 66 of the large cylinder 61 or the compressed air supply chamber 65 of the small cylinder 58 by the compressed-air supply and exhaust section 69A or 69B, by which the head-tool tip portion 50a is pushed down, so that the solder bumps 1b of the electronic component 1 are pressed against the solder portions 2 of the circuit board 4. In this case, a load with which the suction nozzle 51, sucking and holding the electronic component 1, presses against the circuit board 4 is generated by an operation in which a pressing load detected by the load cell 54 via the rod 62 or rod 59 is transferred to the suction nozzle 51 via the shaft 57 by pressure of the compressed air that has been supplied to the compressed air supply chamber 66 in the large cylinder 61 or the compressed air supply chamber 65 in the small cylinder 58 by the compressed-air supply and exhaust section 69A or 69B. It is noted that, in this case, a product of the pressure of the compressed air and an upper-surface area of the rod 62 or rod 59 is a pressing load. The large cylinder 61 is used when a larger pressing load is required, and the small cylinder 58 is used when a smaller pressing load is required.

The above description has been made for a case where the head tool 50 has two large-and-small cylinders. However, when a required pressing load is limited to within a range of some extent, electronic component mounting can be fulfilled as in the above-described case by a head tool having only one cylinder.

According to the third embodiment as described above, the head tool 3 having pneumatic cylinders of a type used in the local reflow mounting apparatus has structure for fixing the pneumatic cylinders, for example, the recess portion 62a of the rod 62 of the large cylinder 61 and the stopper 64 as described above, and the electronic component mounting apparatus includes such a head tool 3; thus making it possible to mount the electronic component 1 onto the circuit board 4 both by the local reflow mounting method of the prior art and by the local reflow mounting method of the first embodiment.

Therefore, for example, in a case where the electronic component 1 is a general-purpose electronic component for which high bonding precision is not required and where this general-purpose electronic component is mounted onto the circuit board 4, the stopper 64 in the rod 62 of the large cylinder 61 is turned OFF so that the rod 62 is made free to move up and down within the guide 63. Thereafter, compressed air is supplied to the compressed air supply chamber 66 of the large cylinder 61 or the compressed air supply chamber 65 of the small cylinder 58. Thus, by making use of pressure of the supplied compressed air, a pressing load detected by the load cell 54 via the rod 62 or rod 59 is transferred to the suction nozzle 51 via the shaft 57, so that the suction nozzle 51 is pushed down, thus making it possible to mount the electronic component by the local reflow mounting method of the prior art at a high mounting speed.

Moreover, for example, in a case where the electronic component 1 is a high-end electronic component for which high bonding precision is required, and where the high-end electronic component is mounted onto the circuit board 4, the stopper 64 inside the recess portion 62a of the rod 62 in the large cylinder 61 is turned ON, and compressed air is supplied to the compressed air supply chamber 66 of the large cylinder 61, by which the rod 62 is pushed down so that the inner upper surface of the recess portion 62a of the pushed-down rod 62 is put into contact with the upper portion of the stopper 64, thereby making the load cell 54, the rod 62, the guide 63 and the upper frame 56a formed into an integral structure. Furthermore, the rod 59 of the small cylinder 58 is pushed down by the rod 62 of the large cylinder 61 via the load cell 54, by which the lower end of the rod 59 is put into contact with an inner lower end of the guide 60, thereby making the head-tool tip portion 50a in its entirety into an integral state, and the rod 59 is further pushed down so that the head-tool tip portion 50a in its entirety is pushed down via the self-weight balancing spring 55; thus allowing the head tool 50 to be of a structural state similar to that of the head tool 3 of the first embodiment. In the head tool 50 of such a state, by performing a move-down operation of the head tool 50 by the up/down moving unit 21, contact between an electronic component and a circuit board is detected by the load cell 54, and the up/down moving unit 21 is controlled by the control part 9 so that this detected contact load becomes a preset contact load. Thus, it becomes possible to mount the electronic component by the local reflow mounting method of the first embodiment with high bonding precision. Consequently, it becomes possible to change a mounting method as required depending on bonding precision required for mounting an electronic component to a circuit board, thus allowing both productivity and quality to be satisfied at the same time.

Further, in the head tool 50 in which the stopper 64 has been turned ON so that the head tool 50 is ready for performing the local reflow mounting method of the first embodiment, a tip height of the suction nozzle 51 can be maintained constant by controlling a contraction height of the self-weight balancing spring 55 to a constant height, by which a stable contact load control can be achieved when electronic component 1 is put into contact with circuit board 4, thus making it possible to stabilize a bonding quality of the electronic component.

Therefore, in the above third embodiment, in the head tool 50, dimensional precision of the recess portion 62a provided at the rod 62 of the large cylinder 61 and the stopper 64 is enhanced besides dimensional precision of individual constituent parts constituting the large cylinder 61; and moreover, a fitting position of the stopper 64 within the recess portion 62a of the rod 62 is made adjustable exteriorly of the guide 63 of the large cylinder 61, thus making it possible to control a contraction height of the self-weight balancing spring 55 to a constant height.

Fourth Embodiment

Figure 16:
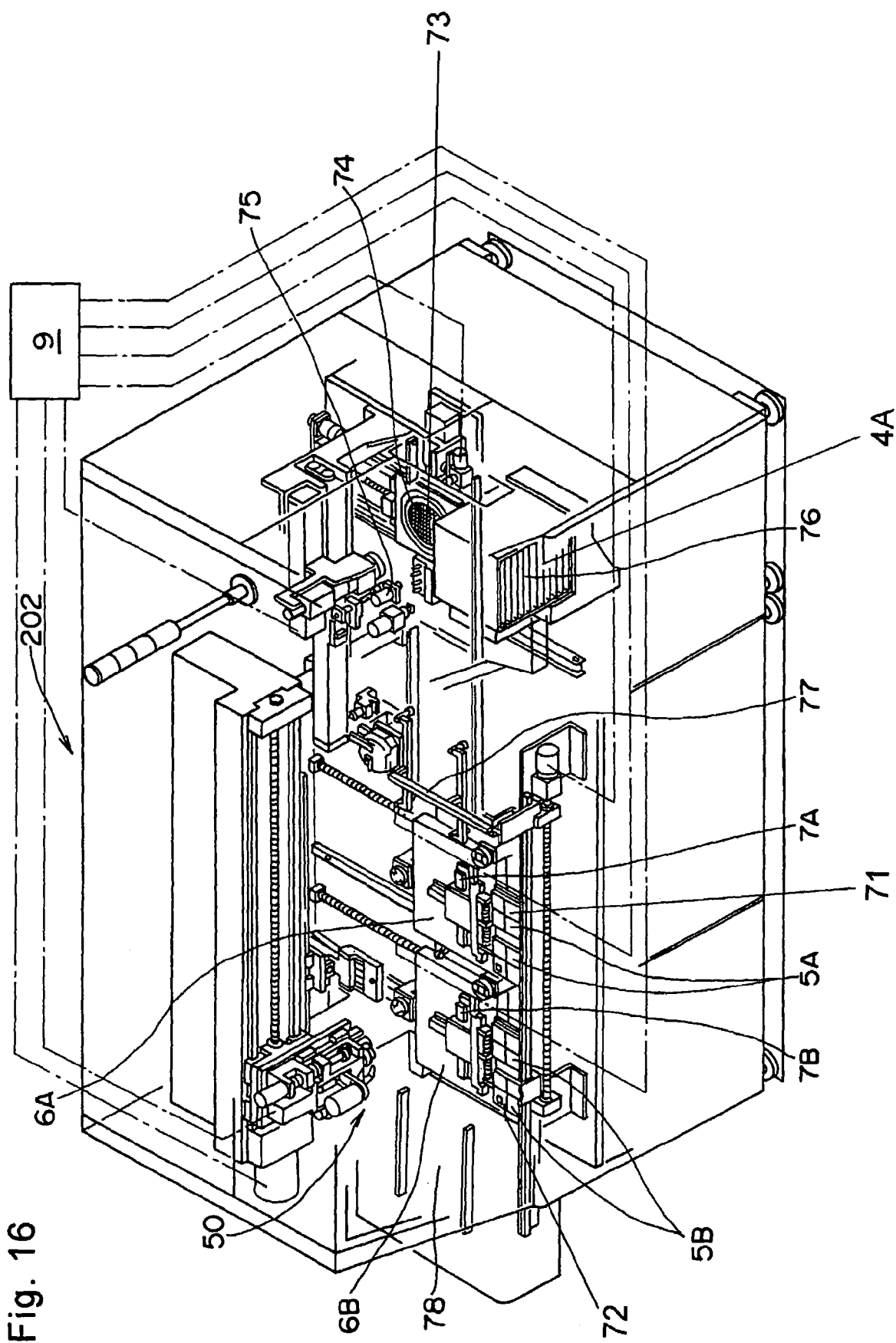
FIG. 16 is an overall perspective view of an electronic component mounting apparatus of dual stage specifications, which is an electronic component mounting apparatus according to a fourth embodiment of the invention.

Further, the mounting apparatus to be used for the electronic component mounting method according to a fourth embodiment of the invention is an electronic component mounting apparatus 202 which further includes the head tool 50 of the third embodiment for sucking-and-holding and mounting of an electronic component onto a circuit board, and which is of a dual-stage specification in that the mounting apparatus has two stages 7 for setting thereon a circuit board onto which electronic components, in the electronic component mounting apparatus 201 of the first embodiment, are to be mounted, as shown in FIG. 16.

As shown in FIG. 16, in the electronic component mounting apparatus 202, a plurality of IC chips 73 formed in a grid-like form on a wafer are fed and set to an IC chip feed section 74, a plurality of high-end electronic components 71 is fed and set to a component tray 5A, and a plurality of general-purpose electronic components 72 are fed and set to a component tray 5B. Also, the component tray 5A and the component tray 5B are fixed on slide bases 6A and 6B on which a stage 7A and a stage 7B are fixed, respectively. It is noted that the high-end electronic components 71 and the general-purpose electronic components 72 are similar to the high-end electronic components 41 and the general-purpose electronic components 31 of the foregoing second embodiment, respectively, and the IC chips 73 are an example of electronic components to which high precision for a bonding position is required, as with the high-end electronic components 71.

Further, a plurality of circuit boards 4A onto which the IC chips 73, the high-end electronic components 71 and the general-purpose electronic components 72 are to be mounted is fed to a circuit board feed section 76, where a loader 77, which performs moving operations by suction and holding of the circuit boards 4A, makes it possible to remove the circuit boards 4A from the circuit board feed section 76 and to feed the circuit boards 4A to the stages 7A and 7B, and also makes it possible to remove the circuit boards 4A with the electronic components mounted thereon from the stages 7A and 7B and to discharge the circuit boards 4A to a circuit board discharge section 78.

Further, as in the case of the electronic component mounting apparatus 201 of the first embodiment, the head tool 50 is movable by X-direction moving mechanism 22 and the up/down moving unit 21, and the slide bases 6A and 6B are movable by their respective Y-direction moving mechanisms 23, respectively.

Also, the IC chips 73 fed to the IC chip feed section 74 are so positioned that their face having electrodes is up, and the face having the electrodes is sucked and held by a suction-and-inversion section 75, which is an example of an inversion device. Then, while IC chip 73 is sucked and held, the suction-and-inversion section 75 is rotated so that a rear face of the IC chip 73 having no electrodes is up, thus making it possible to suck and hold the rear face of the IC chip 73 by head tool 50.

Next, a case is explained where the IC chip 73, the high-end electronic components 71 and the general-purpose electronic components 72 are mounted onto the circuit boards 4A in the electronic component mounting apparatus 202 having the above-described constitution.

First, from the circuit board feed section 76, circuit boards 4A are sucked and held and removed by the loader 77, and the circuit boards 4A are fed and fixed to the stages 7A and 7B, respectively. Then, the suction-and-inversion section 75 is moved and, after performance of positional alignment of the suction-and-inversion section 75 with one IC chip 73 set in the IC chip feed section 74, so that the IC chip 73 becomes suckable and holdable by the suction-and-inversion section 75, the suction-and-inversion section 75 is lowered, thereby sucking and holding the IC chip 73, and elevated, thereby removing the IC chip 73 from the IC chip feed section 74. Along with this, a high-end electronic component 71 is sucked and held, and removed, from the component tray 5A by the head tool 50, and the high-end electronic component 71 is mounted onto the circuit board 4A fixed on the stage 7A. When this is done, stopper 64 has been turned ON inside recess portion 62a of rod 62 in large cylinder 61 of the head tool 50 so that head-tool body portion 50b and head-tool tip portion 50a are each in an integrated-structure state, where the head tool 50 is in a state of the foregoing third embodiment ready for management with the local reflow mounting method of the first embodiment.

Thereafter, the IC chip 73 sucked and held by the suction-and-inversion section 75 is inverted by rotating the suction-and-inversion section 75 so that a rear face of the IC chip 73 faces upwardly. Along with this, a high-end electronic component 71 is sucked and held, and removed, from the component tray 5A by the head tool 50, and the high-end electronic component 71 is mounted onto the circuit board 4A fixed on the stage 7B. Thereafter, the head tool 50 is moved upwardly of the suction-and-inversion section 75, and the rear face of the IC chip 73 sucked and held by the suction-and-inversion section 75 is sucked and held by the head tool 50, and moreover, with the IC chip 73 released from the suction and holding by the suction-and-inversion section 75, the IC chip 73 is delivered from the suction-and-inversion section 75 to the head tool 50. After that, the IC chip is mounted by the head tool 50 onto the circuit board 4A fixed on the stage 7A.

Further after that, a general-purpose electronic component 72 is sucked and held, and removed, from the component tray 5B by the head tool 50, and the general-purpose electronic component 72 is mounted onto the circuit board 4A fixed on the stage 7A. Along with this, performed is sucking and holding of IC chip 73 by the suction-and-inversion section 75, and removing the IC chip 73 from the IC chip feed section 73. When this is done, the stopper 64 has been turned OFF inside the recess portion 62a of the rod 62 in the large cylinder 61 of the head tool 50 so that the head tool 50 is in a state of the foregoing third embodiment ready for management with the local reflow mounting method of the prior art.

Thereafter, general-purpose electronic component 72 is sucked and held, and removed, from the component tray 5B by the head tool 50, and the general-purpose electronic component 72 is mounted onto the circuit board 4A fixed on the stage 7B. Along with this, the IC chip 73 sucked and held by the suction-and-inversion section 75 is inverted by rotating the suction-and-inversion section 75 so that a rear face of the IC chip 73 faces upwardly. Thereafter, same as described the above, the head tool 50 is moved upwardly of the suction-and-inversion section 75, and a rear face of the IC chip 73 sucked and held by the suction-and-inversion section 75 is sucked and held by the head tool 50, and moreover, with the IC chip 73 released from the suction and holding by the suction-and-inversion section 75, the IC chip 73 is delivered from the suction-and-inversion section 75 to the head tool 50. After that, this IC chip is mounted by the head tool 50 onto the circuit board 4A fixed on the stage 7B. When this is done, the stopper 64 has been turned ON inside the recess portion 62a of the rod 62 in the large cylinder 61 of the head tool 50 again so that the head tool 50 is in a state of the foregoing third embodiment ready for management with the local reflow mounting method of the first embodiment.

Further after that, the circuit board 104 with the IC chip 101 and the electronic component 111 mounted thereon is removed from the stage 7 by the loader 77, and discharged to the circuit board discharge section 78.

These working steps as described above are iteratively performed for each circuit board 4A of a plurality of circuit boards 4A, by which the IC chips 73, the high-end electronic components 71 and the general-purpose electronic components 72 are mounted.

According to the fourth embodiment as described above, even in cases where electronic components to be mounted onto circuit board 4A are multiple types of electronic components such as the IC chips 73, the high-end electronic components 71 and the general-purpose electronic components 72, the electronic component mounting apparatus 202, by virtue of its including the head tool 50 of the third embodiment, can be ready for management with both the local reflow mounting method of the prior art and the local reflow mounting method of the first embodiment, by this electronic component mounting apparatus 202 alone. Therefore, electronic components can be mounted onto the circuit boards 4A with high bonding precision by performing the local reflow mounting method of the first embodiment for the high-end electronic components 71 and the IC chips 73 to which high bonding precision is required, and with high mounting speed by performing the local reflow mounting method of the prior art for the general-purpose electronic components 72 to which high bonding precision is not required. Consequently, it becomes possible to provide an electronic component mounting apparatus capable of satisfying both productivity and bonding quality at the same time by changing a mounting method for respective electronic components as required depending on required bonding precision of the respective electronic components.

Further, the electronic component mounting apparatus 202, by virtue of its including a plurality of stages for fixing thereon the circuit boards 4A, e.g. two stages 7A and 7B, is capable of mounting electronic components, for which an identical mounting method is required, onto the circuit boards 4A, and thereafter mounting other electronic components, for which another mounting method is required, onto the circuit boards 4A. As a result, it becomes possible to reduce a number of operations of turning ON and OFF the stopper 64 so as to insert the stopper into the recess portion 62a of the rod 62 of the head tool 50, which are operations necessary for changing the mounting method required for the respective electronic components. Thus, time loss during mounting work of electronic components by performing the turning-ON and -OFF operations of the stopper 64 can be reduced, so that time required for performing electronic-component mounting work can be shortened.

Fifth Embodiment

Next, a fifth embodiment of the invention is to perform mounting of various kinds of electronic components by compositely adopting the local reflow mounting method of the first embodiment and an ultrasonic mounting method, which is an electronic component mounting method of the prior art. It is noted here that the terms, ultrasonic mounting method, refer to an electronic component mounting method in which ultrasonic vibrations are applied to surfaces of bonding base materials, i.e., to surfaces of respective electrodes of electronic components or electrodes of a circuit board or the like, thereby causing friction to occur between contact surfaces of the electrodes of the electronic components and the electrodes of the circuit board, wherein resultant frictional heat serves for bonding. This fifth embodiment of the invention is explained by way of working examples as shown below.

First, a first working example of the fifth embodiment of the invention is to perform mounting of electronic components through steps of mounting high-end electronic components onto a circuit board by the local reflow mounting method of the first embodiment, and thereafter mounting electronic components onto the circuit board, on which the high-end electronic components have been mounted, by the ultrasonic mounting method.

An electronic component mounting apparatus 203 for performing the electronic component mounting method in the first working example is first described.

Figure 17:
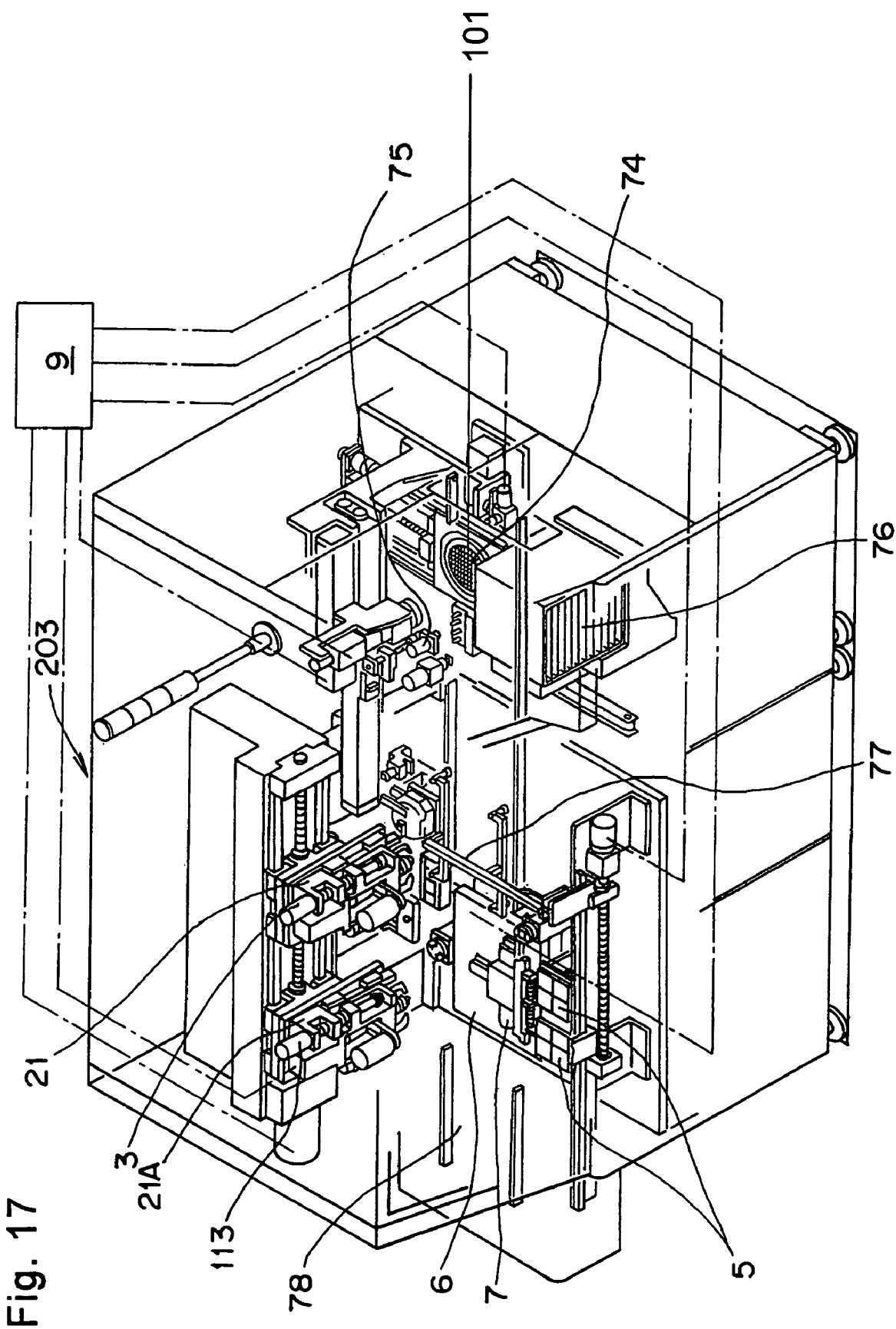
FIG. 17 is an overall perspective view of an electronic component mounting apparatus according to a fifth embodiment of the invention.

As shown in FIG. 17, the electronic component mounting apparatus 203 includes the head tool 3 of the first embodiment for sucking and holding a high-end electronic component and mounting it onto a circuit board, and an ultrasonic tool 113 for mounting electronic components by the ultrasonic mounting method, wherein a circuit board 104 is fixed on a stage 7 fixed on a slide base 6. Also, a plurality of IC chips 101 formed in a grid-like form on a wafer, which are an example of the high-end electronic component, is fed to an IC chip feed section 74, and a plurality of electronic components 111 to be mounted onto the circuit board 104 by the ultrasonic mounting method is fed and set to a component tray 5.

Further, a plurality of circuit boards 104 onto which the IC chips 101 and the electronic components 111 are to be mounted is fed to a circuit board feed section 76, where a loader 77, which performs moving operations by suction and holding of circuit board 104, makes it possible to remove the circuit board 104 from the circuit board feed section 76 and to feed the circuit board 104 to the stage 7, and moreover, makes it possible to remove the circuit board 104 with the electronic components mounted thereon from the stage 7 and to discharge the circuit board 104 to a circuit board discharge section 78.

Further, as in the case of the electronic component mounting apparatus 201 of the first embodiment, the head tool 3 is movable by the X-direction moving mechanism 22 and the up/down moving unit 21, and the ultrasonic tool 113 is also movable by the X-direction moving mechanism 22 and an up/down moving unit 21A, and furthermore, slide bases 6 are movable by the Y-direction moving mechanism 23.

Also, the IC chips 101 fed to the IC chip feed section 74 are so positioned that their face having electrodes is positioned up, and the face having the electrodes is sucked and held by a suction-and-inversion section 75. Then, while an IC chip 101 is sucked and held, the suction-and-inversion section 75 is rotated so that a rear face of the IC chip 101 having no electrodes is positioned up, thus making it possible to suck and hold the rear face of the IC chip 101 by the head tool 3.

Next, the electronic component mounting method of the first working example in a case where the IC chips 101 and the electronic components 111 are mounted onto the circuit board 104 with the electronic component mounting apparatus 203 having the above-described constitution is explained in detail.

Figure 18A:
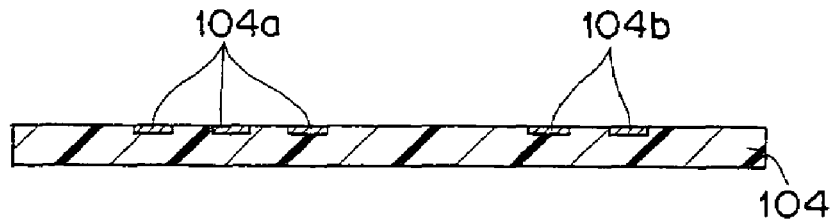
FIGS. 18A, 18B, 18C and 18D are views showing an electronic component mounting method which is a first working example of an electronic component mounting method according to the fifth embodiment of the invention.

As shown in FIG. 18A, a quadrangular-plate shaped circuit board 104 has pads 104a and 104b, which are a plurality of electrodes, on its upper surface. The pads 104a are bondable to a plurality of electrodes 101a of IC chip 101, and the pads 104b are bondable to a plurality of electrodes 111a of electronic component 111.

Referring to FIG. 17, from the circuit board feed section 76, to which a plurality of such circuit boards 104 has been fed, a circuit board 104 is sucked and held, removed, and fed and fixed to the stage 7, by the loader 77.

Then, referring to FIG. 17, the suction-and-inversion section 75 is moved and, after performance of positional alignment of the suction-and-inversion section 75 with one quadrangular-plate shaped IC chip 101 set in the IC chip feed section 74 so that the IC chip 73 becomes suckable and holdable by the suction-and-inversion section 75, the suction-and-inversion section 75 is lowered, thereby sucking and holding the IC chip 101, and elevated, thereby removing the IC chip 101 from the IC chip feed section. Thereafter, the IC chip 101 sucked and held by the suction-and-inversion section 75 is inverted by rotating the suction-and-inversion section 75 so that the rear face of the IC chip 101 is positioned up. Then, the head tool 3 is moved upwardly of the suction-and-inversion section 75, and the rear face of the IC chip 101 sucked and held by the suction-and-inversion section 75 is sucked and held by a suction nozzle 11 of the head tool 3, and moreover, with the IC chip 101 released from the suction and holding by the suction-and-inversion section 75, the IC chip 101 is delivered from the suction-and-inversion section 75 to the head tool 3.

Figure 18B:
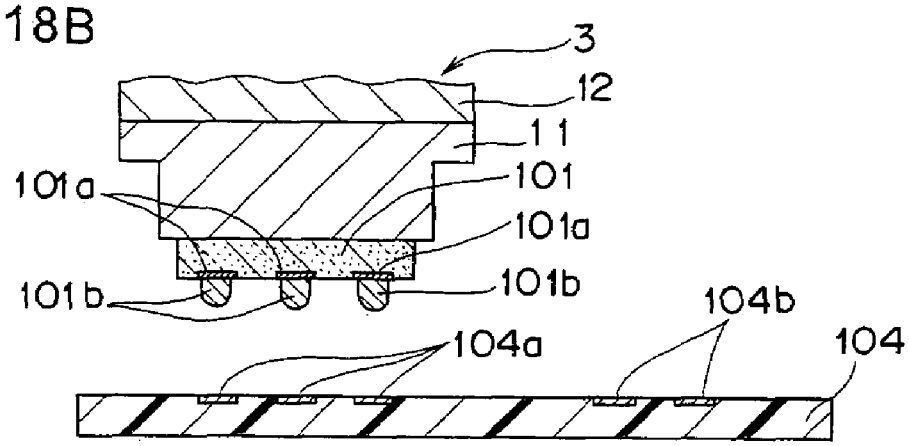

Next, referring to FIG. 18B, as solder bumps 101b are formed on individual electrodes 101a of the IC chip 101 sucked and held by the suction nozzle 11 of the head tool 3, the IC chip 101 is aligned with the circuit board 104 so that the solder bumps 101b of the IC chip 101 become bondable to the pads 104a of the circuit board 104, respectively.

Figure 18C:
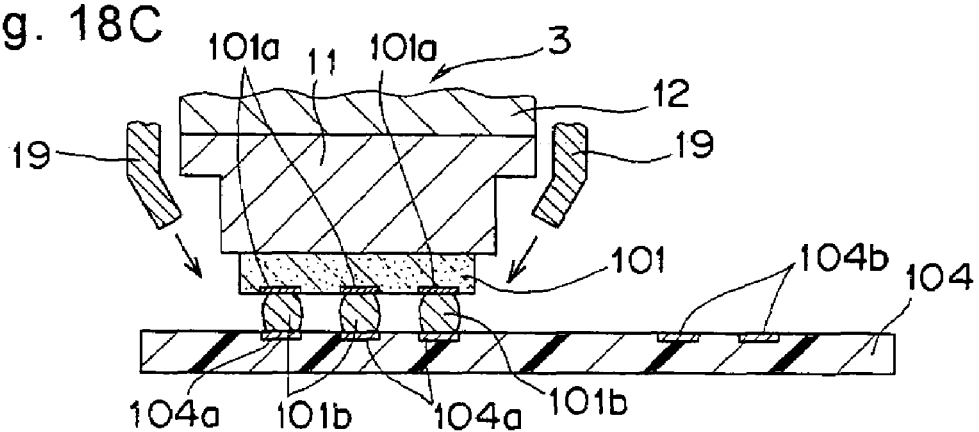

Thereafter, as shown in FIG. 18C, while the suction nozzle 11 of the head tool 3 sucking and holding the IC chip 101 is being moved down, the solder bumps 101b of the IC chip 101 are brought into contact with the pads 104a of the circuit board 104, respectively. After this contact, the solder bumps 101b of the IC chip 101 in contact with the pads 104a of the circuit board 104 are heated and melted by the ceramic heater 12 of the head tool 3. Thereafter, heating by the ceramic heater 12 is stopped, and then the molten solder is subjected to cooling by blows from the cooling blow nozzle 19, thereby the molten solder bumps 101b are solidified, so that the electrodes 101a of the IC chip 101 and the pads 104a of the circuit board 104 are bonded via the solder bumps 101b. The solder may also be solidified by natural cooling of the molten solder instead of forced cooling of the molten solder by the cooling blow nozzle 19.

Figure 18D:
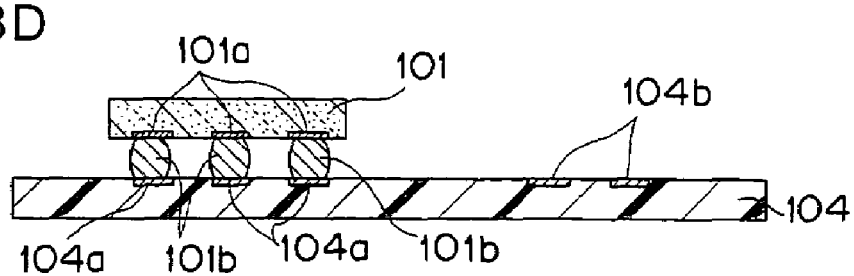

Thereafter, as shown in FIG. 18D, sucking and holding of the IC chip 101 by the suction nozzle 11 of the head tool 3 is released, and the head tool 3 is moved up, thus the IC chip 101 is mounted onto the circuit board 104.

At this point, for example, in a case where flux is fed onto surfaces of respective solder bumps 101b of the IC chip 101 or onto respective pads 104a of the circuit board 104, flux cleaning for removing flux is performed. This flux cleaning in some cases may be unnecessary depending on the type of the flux that is fed.

Next, referring to FIG. 17, the ultrasonic tool 113 is moved, and after performance of positional alignment of the ultrasonic tool 113 with one quadrangular-plate shaped electronic component 111 set in the component tray 5 so that the electronic component 111 becomes suckable and holdable by the ultrasonic tool 113, the ultrasonic tool 113 is lowered, thereby sucking and holding the electronic component 111, and elevated, thereby removing the electronic component 111 from the component tray 5.

Figure 19E:
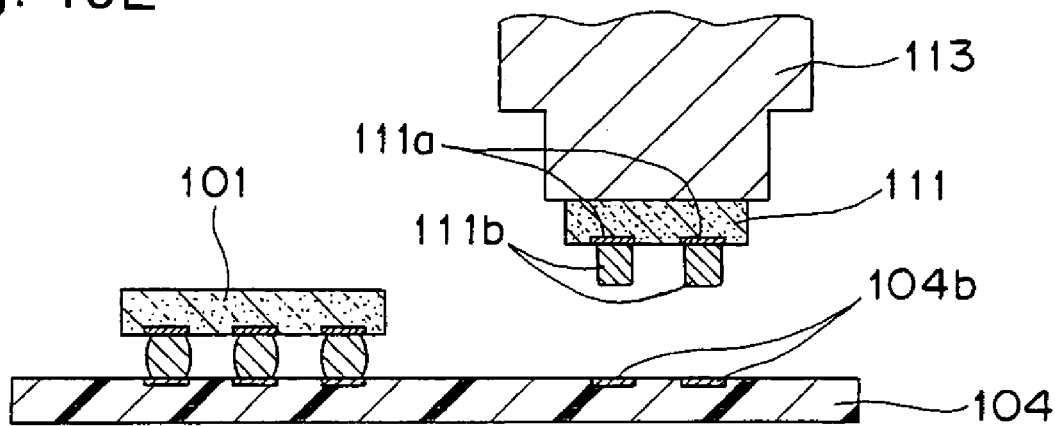
FIGS. 19E, 19F and 19G are views showing the electronic component mounting method that is the first working example of the electronic component mounting method according to the fifth embodiment.

Next, as shown in FIG. 19E, as solder bumps 111b are formed on individual electrodes 11a of the electronic component 111 sucked and held by the ultrasonic tool 113, the electronic component 111 is aligned with the circuit board 104 so that the solder bumps 111b of the electronic component 111 become bondable to pads 104b of the circuit board 104 with the IC chip 101 mounted thereon.

Figure 19F:
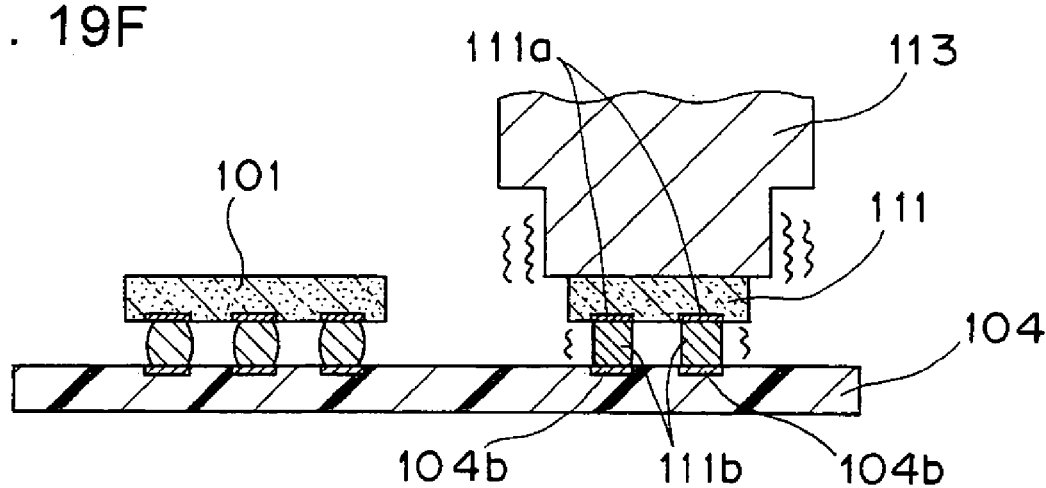

Thereafter, as shown in FIG. 19F, while the ultrasonic tool 113 sucking and holding the electronic component 111 is moved down so that the solder bumps 111b of the electronic component 111 are pressed against the pads 104a of the circuit board 104, ultrasonic vibrations are applied to surfaces of the individual solder bumps 111b of the electronic component 111 and surfaces of the individual pads 104b of the circuit board 104, which are in contact with each other, by the ultrasonic tool 113, thus causing friction to occur between these individual contact surfaces. By frictional heat resulting from this friction, the solder bumps 111b of the electronic component 111 and the pads 104b of the circuit board 104 are bonded together.

Figure 19G:
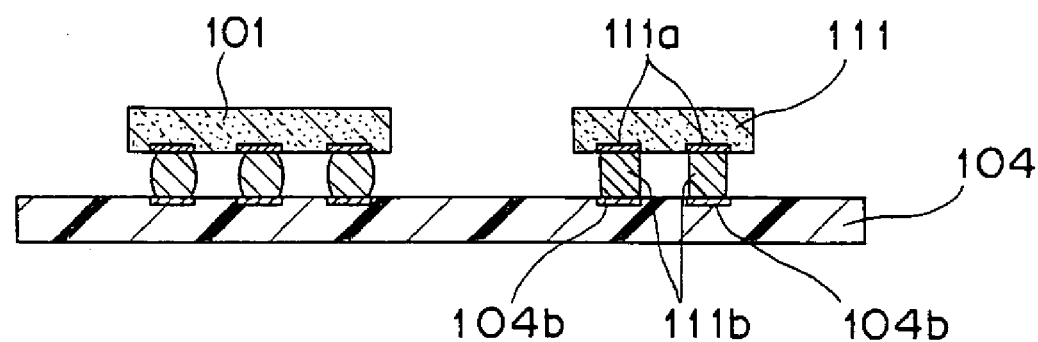

Thereafter, as shown in FIG. 19G, sucking and holding of the electronic component 111 by the ultrasonic tool 113 is released, and the ultrasonic tool 113 is moved up; thus the electronic component 111 is mounted onto the circuit board 104.

Through the electronic component mounting method as described the above, the IC chip 101 and the electronic component 111 are mounted onto the circuit board 104.

Further after that, the circuit board 104 on which the IC chip 101 and the electronic component 111 have been mounted is sucked and held by the loader 77, and thereby removed from the stage 7 and discharged to the circuit board discharge section 78.

These working steps as described above are iteratively performed for each circuit board 104 of a plurality of circuit boards 104, by which the IC chips 101 and the electronic components 111 are mounted on individual circuit boards 104.

According to the first working example of the fifth embodiment as described above, by virtue of an arrangement in which the electronic component mounting apparatus 203 includes the head tool 3 capable of performing the local reflow mounting method of the first embodiment and the ultrasonic tool 113 capable of performing the ultrasonic mounting method, it becomes possible to perform mounting of IC chip 101 onto circuit board 104 by the local reflow mounting method of the first embodiment and thereafter perform mounting of electronic component 111 by the ultrasonic mounting method. Therefore, for example, in a case where the electronic component 111 is an electronic component which requires prevention from any effects of heat, the electronic component 111 is kept from any effects of heat due to melting and heating of solder during mounting of IC chip 101, thus allowing the electronic component 111 to be mounted onto the circuit board 104 without being affected by heat. Also, for example, in a case where flux is fed onto solder bumps 101b of IC chip 101 or onto pads 104a of circuit board 104, and where flux needs to be removed after mounting of the IC chip 101, the IC chip 101 can be mounted onto the circuit board 104 by the local reflow mounting method of the first embodiment, followed by removal of flux that has been fed by performance of flux cleaning, and thereafter, the electronic component 111 can be mounted by the ultrasonic mounting method, thus eliminating a need for taking into consideration any effects of a flux cleaning liquid on the electronic component 111 that is mounted by the ultrasonic mounting method during the flux cleaning, or any effects of re-deposition or the like of minute chips or the like, cleaned away during the flux cleaning, onto the electronic component 111. Thus, it becomes possible to compositely mount onto a circuit board the electronic component 111 that requires consideration for such effects as described the above, e.g. electronic components to which a heatproof environment or waterproof environment is required during their mounting, by the ultrasonic mounting method, together with a high-end electronic component such as IC chips to which high precision for a bonding position is required.

Next, a second working example of the fifth embodiment of the invention is to first perform mounting of electronic component 111 onto circuit board 104 by the ultrasonic mounting method, and thereafter perform mounting of IC chip 101, which is an example of high-end electronic components, onto the circuit board 104, on which the electronic component 111 has been mounted, by the local reflow mounting method of the first embodiment. That is, the second working example is a result of reversing the order of the ultrasonic mounting method and the local reflow mounting method of the first embodiment with respect to the first working example of the fifth embodiment.

According to the second working example of the fifth embodiment as described above, mounting of the electronic component 111 onto the circuit board 104 is performed by the ultrasonic mounting method, and thereafter mounting of the IC chip 101 onto the circuit board 104, on which the electronic component 111 has been mounted, is performed by the local reflow mounting method of the first embodiment. Therefore, it becomes possible to eliminate a need for taking into consideration any effects of ultrasonic vibrations, generated during the ultrasonic mounting, on the IC chip 101. Thus, in a case where the high-end electronic component, such as IC chips to which high precision for a bonding position is required, is an electronic component that requires further consideration as to effects of vibrations, the electronic component can be mounted onto the circuit board mixedly and together with an electronic component that is mounted by the ultrasonic mounting method.

Further, a third working example of the fifth embodiment of the invention is to first perform by the ultrasonic mounting method mounting of an electronic component onto a circuit board via a sealing material for sealing a bonding portion between the electronic component and the circuit board, and thereafter perform by a collective reflow mounting method temporary bonding of a general-purpose electronic component onto the circuit board, on which the electronic component has been mounted, via solder, and thereafter perform primary bonding, and thereby mounting, by applying heat collectively to the electronic component, the general-purpose electronic component to the circuit board to make a seal of the bonding portion between the electronic component and the circuit board by the sealing material, and also to melt solder of the general-purpose electronic component that has been temporarily bonded via the solder. Subsequently, the third working example is further to perform, by the local reflow mounting method of the first embodiment, mounting of a high-end electronic component onto the circuit board on which the electronic component and the general-purpose electronic component have been mounted. Hereinbelow, the electronic component mounting method of this third working example is described in detail.

Figure 20A:
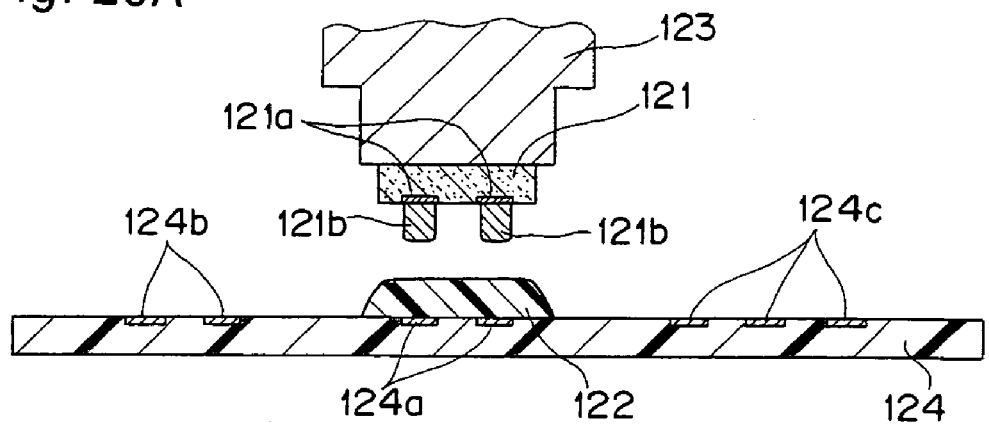
FIGS. 20A, 20B, 20C and 20D are views showing an electronic component mounting method which is a third working example of the electronic component mounting method according to the fifth embodiment of the invention.

As shown in FIG. 20A, a quadrangular-plate shaped circuit board 124 has pads 124a, 124b and 124c, which are a plurality of electrodes, on its upper surface. The pads 124a are bondable to a plurality of electrodes 121a of electronic component 121 to be mounted onto the circuit board 124 by the ultrasonic mounting method, the pads 124b are bondable to a plurality of electrodes 131a of general-purpose electronic component 131, and the pads 124c are bondable to a plurality of electrodes 141a of high-end electronic component 141. A sealing material 122, which is a non-conductive resin material, is fed to portions on the circuit board 124 where the quadrangular-plate shaped electronic component 121 is to be mounted, including places on the pads 124a and their vicinities of the circuit board 124. Also, Au bumps 121b are formed on the electrodes 121a of the electronic component 121. First, a rear face of the electronic component 121, which is a face having no electrodes 121a, is sucked and held by an ultrasonic tool 123, and the electronic component 121 is aligned with the circuit board 124 so that the Au bumps 121b of the electronic component 121 become bondable to the pads 124a of the circuit board 124, respectively.

Figure 20B:
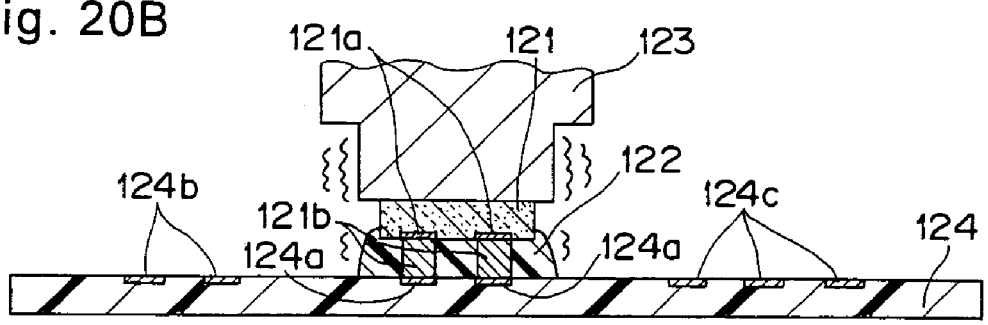

Thereafter, as shown in FIG. 20B, while the ultrasonic tool 123, sucking and holding the electronic component 121, is being moved down, the Au bumps 121b of the electronic component 121 are pressed against the pads 124a of the circuit board 124, respectively, via the sealing material 122. As a result, the sealing material 122 between the Au bumps 121b of the electronic component 121 and the pads 124a of the circuit board 124 is pushed away, and the Au bumps 121b of the electronic component 121 are pressed against the pads 124a of the circuit board 124, respectively, wherein ultrasonic vibrations are applied to surfaces of the individual Au bumps 121b of the electronic component 121 and surfaces of the individual pads 124a of the circuit board 124, which are in contact with each other, by the ultrasonic tool 123, thus causing friction to occur between these individual contact surfaces. By frictional heat resulting from this friction, the Au bumps 121b of the electronic component 121 and the pads 124a of the circuit board 124 are bonded together, wherein these bonding portions are covered with the sealing material 122 fed between the electronic component 121 and the circuit board 124.

Thereafter, sucking and holding of the electronic component 121 by the ultrasonic tool 123 is released, and the ultrasonic tool 123 is moved up, thus the electronic component 121 is mounted onto the circuit board 124.

Figure 20C:
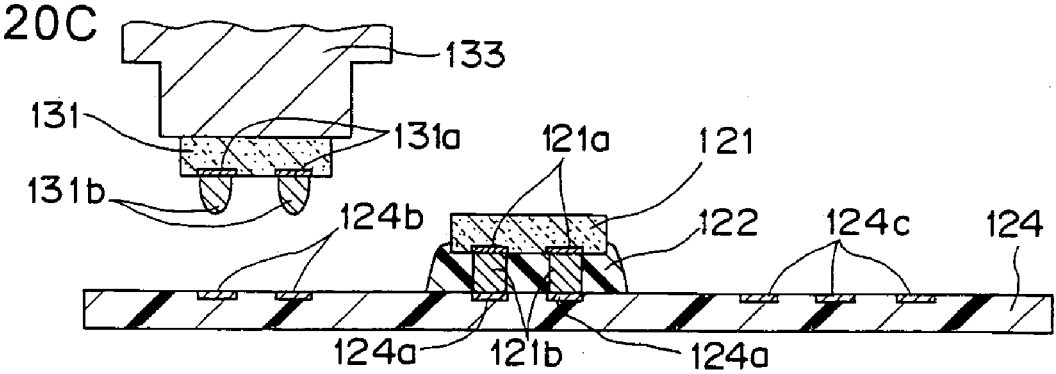

Next, as shown in FIG. 20C, as solder bumps 131b are formed on the electrodes 131a of quadrangular-plate shaped general-purpose electronic component 131, a rear face of the general-purpose electronic component 131, which is a face having no electrodes 131a, is sucked and held by a tool 133, and the general-purpose electronic component 131 is aligned with the circuit board 124 so that the solder bumps 131b of the general-purpose electronic component 131 become bondable to the pads 124b of the circuit board 124, respectively.

Figure 20D:
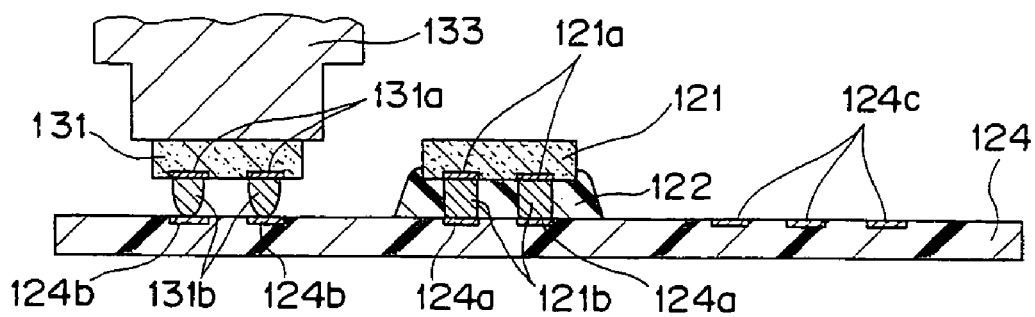

Thereafter, as shown in FIG. 20D, the tool 133, sucking and holding the general-purpose electronic component 131 is moved down, so that the solder bumps 131b of the general-purpose electronic component 131 are pressed against the pads 124b of the circuit board 124, thereby being temporarily bonded. In a case where a plurality of general-purpose electronic components 131 are mounted onto the circuit board 124, the above working steps are iteratively performed for each general-purpose electronic component 131, by which the general-purpose electronic components 131 are temporarily bonded to the circuit board 124.

Figure 21E:
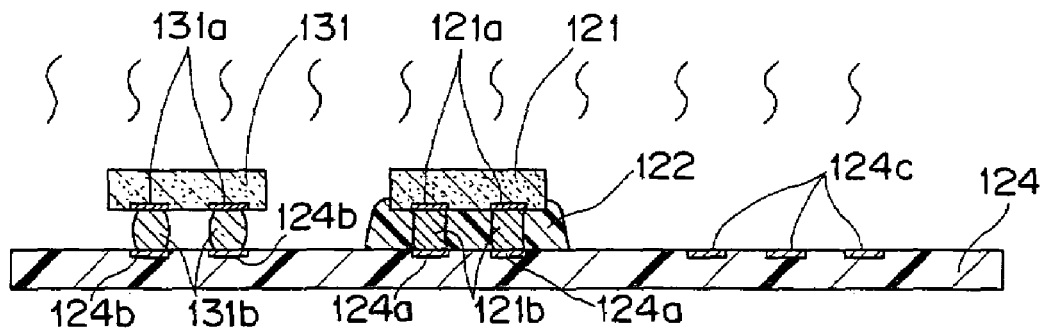
FIGS. 21E, 21F, 21G and 21H are views showing the electronic component mounting method that is the third working example of the electronic component mounting method according to the fifth embodiment.

Next, as shown in FIG. 21E, in a state that the bonding portions are covered with the sealing material 122, the electronic component 121 is mounted, and the circuit board 124 with the general-purpose electronic component 131 temporarily bonded thereto is conveyed to a reflow soldering working section. In the reflow soldering working section, the electronic component 121, the general-purpose electronic component 131 and the circuit board 124 are heated by a heat source, by which the solder bumps 131*b* of the general-purpose electronic component 131 are melted, and moreover, the sealing material 122 of the electronic component 121 is also heated. Thereafter, the heated electronic component 121, general-purpose electronic component 131 and circuit board 124 are cooled. As a result, the solder bumps 131*b* of the molten general-purpose electronic component 131 are solidified, so that the electrodes 131*a* of the general-purpose electronic component 131 are finally bonded, and thereby mounted, to the pads 124*b* of the circuit board 124 via the solder bumps 131*b*. Moreover, the sealing material 122 of the heated electronic component 121 is solidified, so that the Au bumps 121*b* of the electronic component 121 and the pads 124*a* of the circuit board 124, which are bonding portions between the electronic component 121 and the circuit board 124, are sealed by the sealing material 122.

Figure 21F:
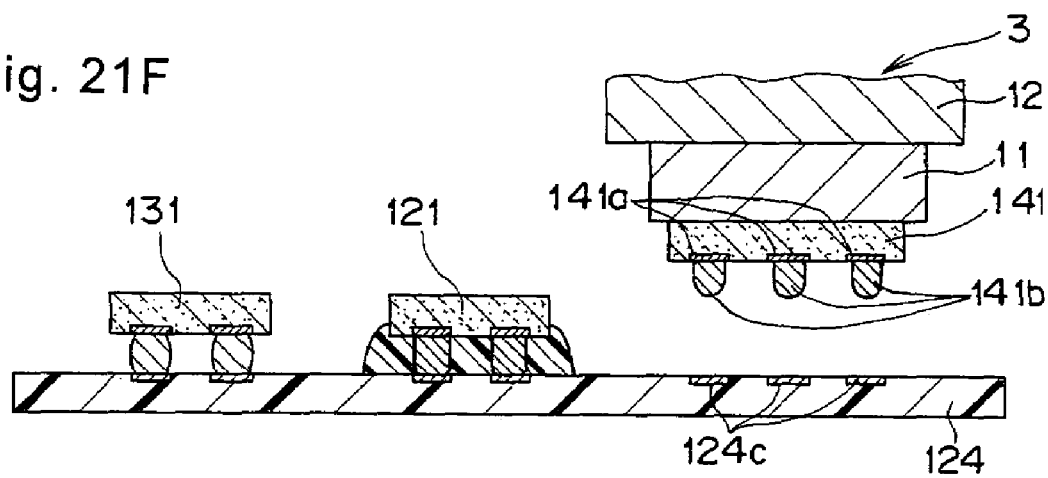

Next, referring to FIG. 21F, as solder bumps 141*b* are formed on the electrodes 141*a* of quadrangular-plate shaped high-end electronic component 141, a rear face of the high-end electronic component 141, which is a face having no electrodes 141*a*, is sucked and held by the suction nozzle 11 of the head tool 3, and the high-end electronic component 141 is aligned with the circuit board 124 so that the solder bumps 141*b* of the high-end electronic component 141 become bondable to the pads 124*c*, respectively, of the circuit board 124 on which the electronic component 121 and the general-purpose electronic component 131 have been mounted.

Figure 21G:
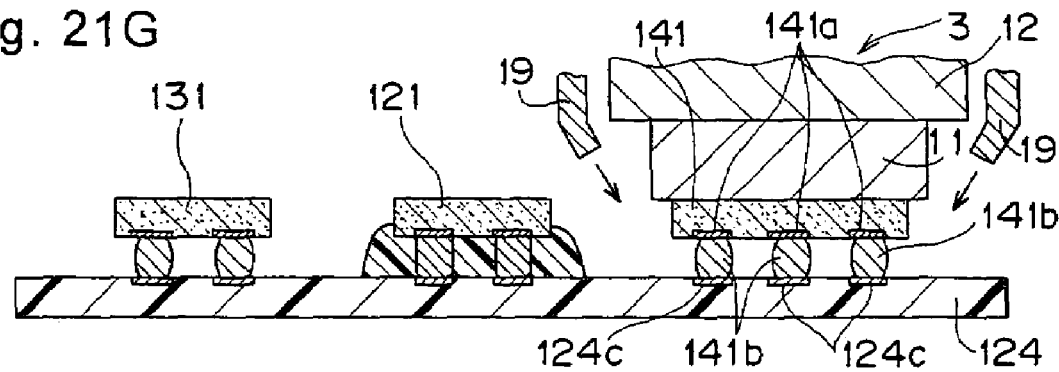

Thereafter, as shown in FIG. 21G, while the suction nozzle 11 of the head tool 3, sucking and holding the high-end electronic component 141, is being moved down, the solder bumps 141*b* of the high-end electronic component 141 are brought into contact with the pads 124*c* of the circuit board 124. After this contact, the solder bumps 141*b* of the high-end electronic component 141, which are in contact with the pads 124*c* of the circuit board 124, are heated and melted by the ceramic heater 12 of the head tool 3. Then, after heating by the ceramic heater 12 is stopped, the molten solder bumps 141*b* are subjected to cooling by blows from the cooling blow nozzle 19, with the molten solder bumps 141*b* being thereby solidified so that the electrodes 141*a* of the high-end electronic component 141 and the pads 124*c* of the circuit board 124 are bonded together, respectively, via the solder bumps 141*b*. The molten solder bumps 141*b* may also be solidified by natural cooling of the molten solder instead of the forced cooling of the molten solder bumps 141*b* by the cooling blow nozzle 19.

Figure 21H:
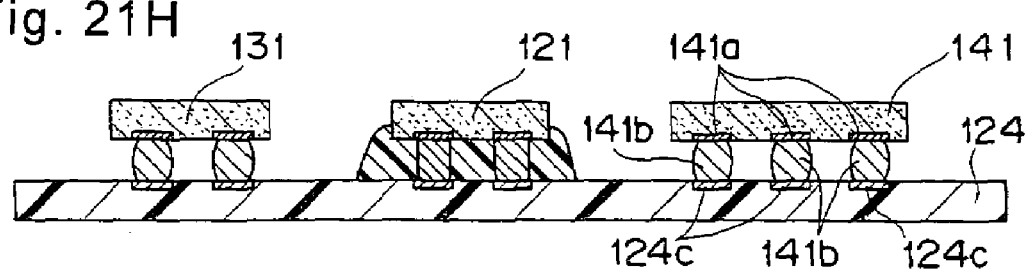
Figure 22A:
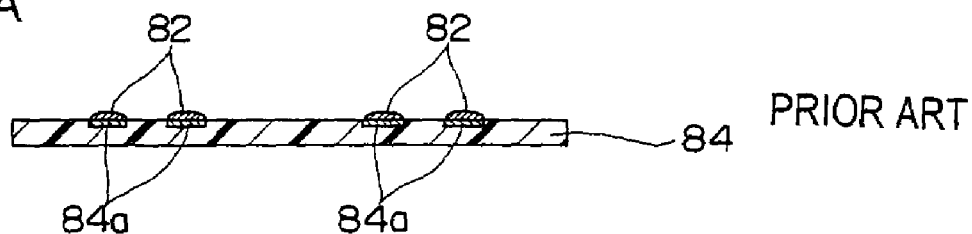
FIGS. 22A, 22B, 22C and 22D are views showing a conventional electronic component mounting performed by a collective reflow mounting method.
Figure 22B:
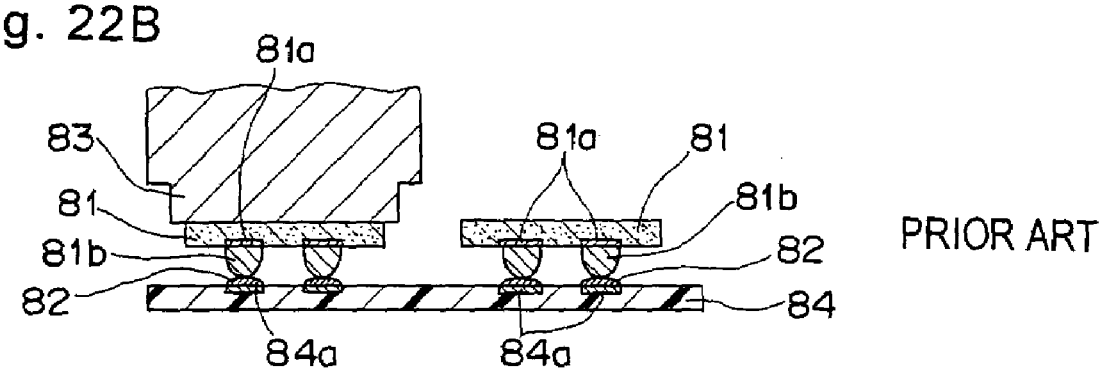
Figure 22C:
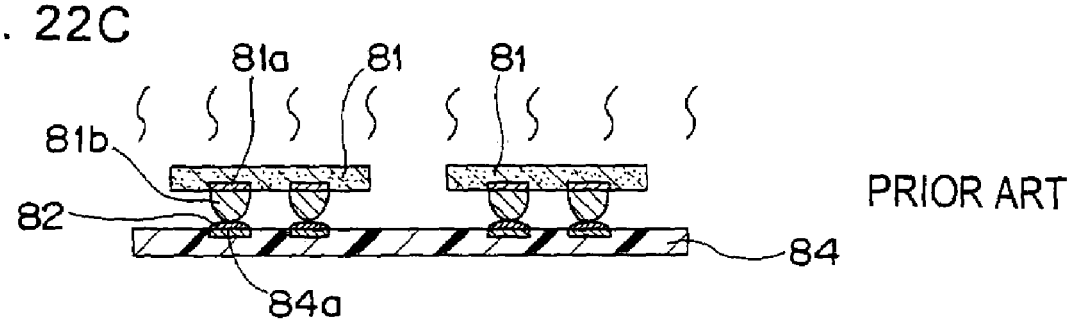
Figure 22D:
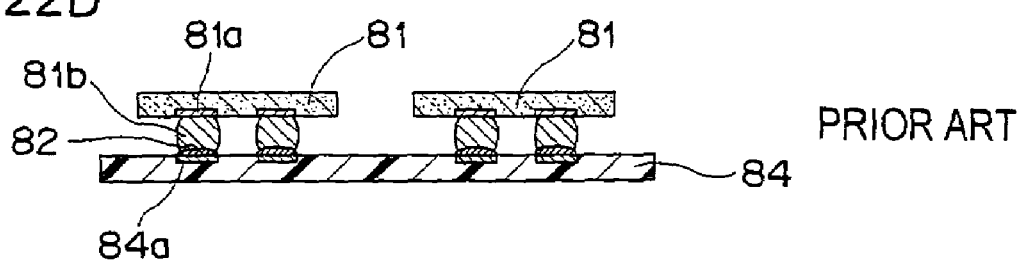
Figure 23A:
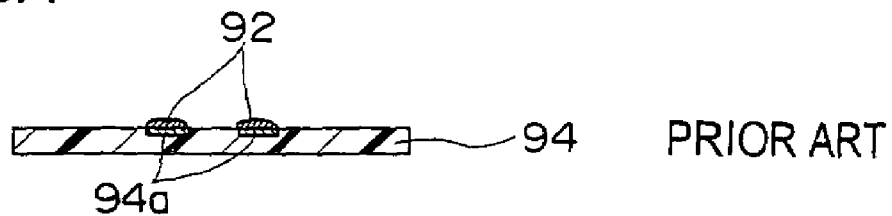
FIGS. 23A, 23B, 23C and 23D are views showing a conventional electronic component mounting performed by a local reflow mounting method.
Figure 23B:
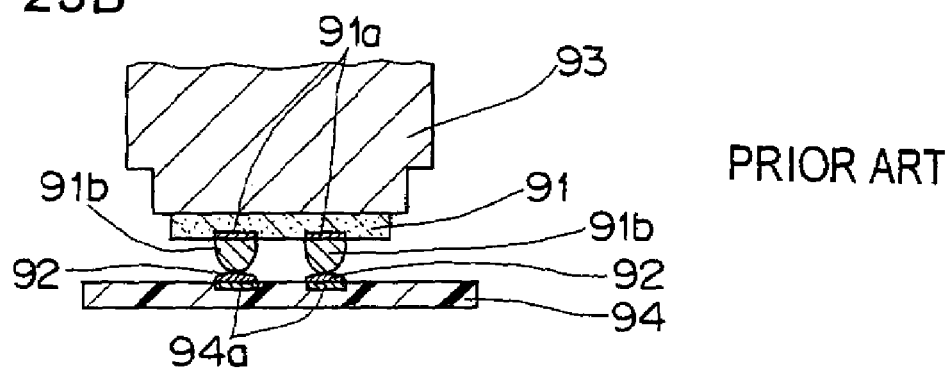
Figure 23C:
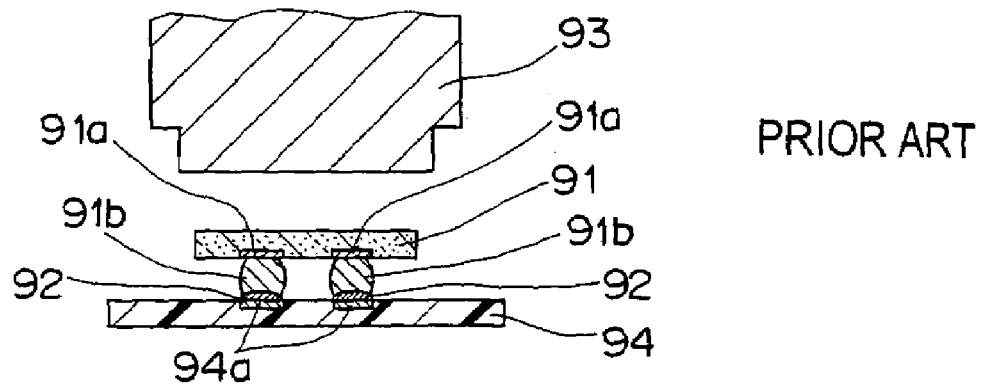
Figure 23D:
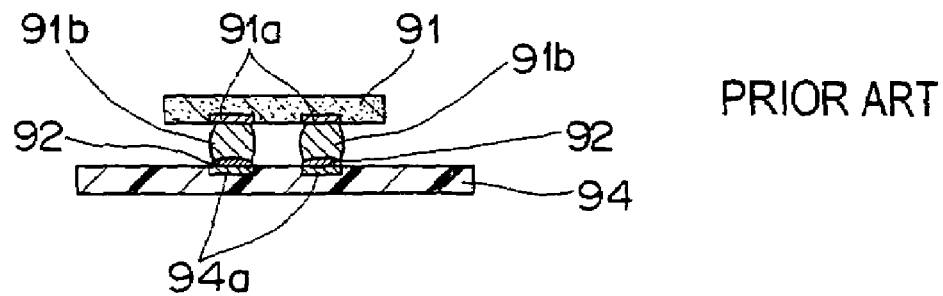

Thereafter, as shown in FIG. 21H, sucking and holding of the high-end electronic component 141 by the suction nozzle 11 of the head tool 3 is released, and the head tool 3 is moved up, thus the high-end electronic component 41 is mounted onto the circuit board 124.

Through the electronic component mounting method as described the above, the electronic component 121, the general-purpose electronic component 131 and the high-end electronic component 141 are mounted onto the circuit board 124.

According to the third working example of the fifth embodiment as described above, in addition to effects of the second working example, sealing by the sealing material 122 for the bonding portions of the electronic component 121 bonded to the circuit board 124 by the ultrasonic mounting method, as well as the primary bonding by the collective reflow for the general-purpose electronic component 131 temporarily bonded to the circuit board 124, can further be performed simultaneously by collectively heating electronic components and a circuit board by a heat source. Therefore, in cases where electronic components to be mixedly placed on a circuit board are general-purpose electronic components, electronic components which are mounted by the ultrasonic mounting method and which need sealing of bonding portions, and high-end electronic components to which high precision for a bonding position is required, it becomes possible to reduce a mounting time of these electronic components onto a circuit board.

In addition, combining any arbitrary embodiments together appropriately from among the foregoing various embodiments allows their respective effects to be produced.

According to the first aspect or second aspect of the present invention, while electrodes of an electronic component sucked and held by the component holding member and electrodes of a circuit board are kept in contact with bonding members, the bonding members between these electrodes are melted by heating, and releasing of the electronic component from suction and holding by the component holding member is performed, not at a time during melting of the bonding members as in the conventional local reflow mounting method, but at a time after the bonding members are melted, cooled and solidified. That is, the electronic-component mounting is not performed based on obtainment of a self alignment effect by surface tension of the molten bonding members as in the conventional local reflow mounting method, but mounting of the electronic component onto the circuit board is performed at a contact position positioned by the component holding member. As a result of this, there can be eliminated any bonding position shifts of the electronic component due to a vacuum break blow occurring when the electronic component is released from the suction and holding by the component holding member. Consequently, it becomes possible to achieve mounting onto the circuit board of such electronic components as those of narrowed electrode pitches of electronic components in which bonding position shifts of the electronic components, due to the vacuum break blow at the component holding member, would matter rather than obtainment of the self alignment effect.

According to the third to sixth aspects of the invention, the bonding-material feeding method, the bonding-material constituent materials or the flux feeding method which have been used in the electronic component mounting method of the prior art can be applied, thus making it possible to provide a mounting method for electronic components of general-purpose use.

According to the seventh to ninth aspects of the invention, operations of causing electrodes of an electronic component, sucked and held by the component holding member, and electrodes of a circuit board to be brought into contact with respective bonding members, and melting the bonding members by heating, are performed not in the manner, as in the local reflow mounting method of the prior art, that the electrodes of the electronic component and the electrodes of the circuit board are merely pressed against the bonding members to make the bonding members melt, or that the electrodes of the electronic component and the electrodes of the circuit board are pressed against the bonding members after melting of the bonding members by heating, but in a manner that the electrodes of the electronic component and the electrodes of the circuit board are brought into contact with the bonding members and thereafter the bonding members are melted by heating. Therefore, since the bonding members are not yet in a molten state at a time of contact, it becomes possible to detect a load that actually occurs between the electrodes of the electronic component and the electrodes of the circuit board, and further to exert control so that, at this contact, a detected load actually occurring becomes beyond a contact load that is predicted to occur upon such contact. Therefore, in a process of performing mounting onto the circuit board iteratively for a plurality of electronic components, it is possible to exert precise control so that an actually occurring load constantly becomes beyond a contact load that is predicted to occur upon contact. Thus, a contact position upon contact of each electronic component with the circuit board can be made more uniform, an interval pitch between the electrodes of the electronic component can be made narrower, and mounting onto the circuit board can be achieved while a bonding position relative to the circuit board is kept more stable for electronic components for which high precision for the bonding position relative to the circuit board is required, such as high-end electronic components.

According to the tenth aspect of the invention, after detection of contact between either electrodes of an electronic component sucked and held by the component holding member or electrodes of a circuit board and bonding members, in this contact state, individual bonding members between the electrodes are heated and thereby melted, and releasing of the electronic component from the suction and holding by the component holding member is performed not at a time during melting of the bonding members as in the conventional local reflow mounting method, but at a time after the bonding members are melted, cooled and solidified. That is, the electronic-component mounting is not performed based on obtainment of a self alignment effect by surface tension of the molten bonding members as in the conventional local reflow mounting method, but mounting of the electronic component onto the circuit board is performed at a contact position positioned by the component holding member. As a result of this, there can be eliminated any bonding position shifts of the electronic component due to a vacuum break blow occurring when the electronic component is released from suction and holding by the component holding member. Consequently, it becomes possible to achieve mounting onto the circuit board of such electronic components as those of narrowed electrode pitches in which bonding position shifts of the electronic components due to a vacuum break blow at the component holding member would matter rather than obtainment of the self alignment effect.

According to the eleventh to fourteenth aspects of the invention, the bonding-material feeding method, bonding-material constituent materials or a flux feeding method which have been used in an electronic component mounting method of the prior art can be applied, thus making it possible to provide a mounting method for electronic components of general-purpose use.

According to the fifteenth aspect of the invention, in addition to effects of the foregoing aspects, after detection of contact between either electrodes of an electronic component or electrodes of a circuit board and bonding members, it is decided whether or not a correction of an elongation amount of the component holding member due to heating is executed, and further, after start of cooling of molten bonding members, it is decided whether or not a correction of shrinkage amount of the component holding member due to cooling is performed. Thus, it becomes possible to obtain a required bonding quality of an electronic component depending on whether both the elongation-amount correction and the shrinkage-amount correction of the component holding member are performed, or only either one of the elongation-amount correction or the shrinkage-amount correction is performed, or neither the elongation-amount correction nor the shrinkage-amount correction is performed, depending on a number of electrodes of the electronic component or a bonding precision required for the electronic component.

According to the sixteenth aspect or seventeenth aspect of the invention, only either one of the elongation-amount correction or the shrinkage-amount correction is performed. Thus, it becomes possible to obtain a required bonding quality of an electronic component, like effects of the fifteenth embodiment.

According to the eighteenth aspect or nineteenth aspect of the invention, after detection of contact between either electrodes of an electronic component or electrodes of a circuit board and bonding members, a load that actually occurs between these electrodes, due to this contact is maintained at a generally constant level, and thereafter, upon a decision that a detection of a decrease of the load is regarded as a start of melting of the bonding members, a control mode is switched from one control mode in which the load is maintained generally constant to another control mode in which a contact height position of the electronic component relative to the circuit board is maintained generally constant, by which even in a molten state of the bonding members, a contact height position of the electronic component can be maintained generally constant. As a result, during melting of the bonding members, molten bonding members can be prevented from crushing due to lowering of the contact height position of the electronic component. Thus, it becomes possible to reliably perform control of the contact height position of the electronic component even during a molten state of the bonding members.

Further, in the control mode in which the load is maintained generally constant, the load is set to a load not less than a contact load upon a contact detection, and this set load is, while maintained generally constant, applied to the electronic component and the circuit board. By so doing, even if some of the electrodes are not in contact with each other via the bonding members because of variations in a formation height of the bonding members upon detection of contact between either electrodes of the electronic component or the electrodes of the circuit board and the bonding members, it is possible to enhance contactability between the electrodes and the bonding members by applying a load that is maintained generally constant, and thus to enhance bonding reliability of the electronic component and the circuit board.

According to the twentieth aspect of the invention, before an electronic component is put into contact with a circuit board, a leveling operation is performed so that bonding members that have preliminarily been fed onto electrodes of the electronic component are made more uniform in their feed height. As a result, even if there are variations in feed height among the bonding members on the electrodes of the electronic component, it is possible to eliminate these variations and make the bonding members more uniform in feed height. Thus, upon contact of the bonding members and either the electrodes of the electronic component or the electrodes of the circuit board, there can be eliminated any effects on a contact load control due to variations in feed height of the bonding members, so that successful controllability for contact load can be obtained and that the contact load can be applied to individual bonding members more uniformly. Consequently, the electrodes of the electronic component and the electrodes of the circuit board can be brought into contact with the bonding members with a more uniform contact load and with reliability. Thus, it is possible to stabilize a bonding quality between the electronic component and the circuit board.

According to the twenty-first aspect of the invention, in the electronic component mounting method for mounting two types of electronic components, a first electronic component and a second electronic component, onto a circuit board, wherein higher bonding positional precision for mounting onto the circuit board is required of the second electronic component than of the first electronic component, the first electronic component is temporarily bonded to the circuit board by the conventional collective reflow mounting method, and this temporarily bonded first electronic component and the circuit board are heated so that the first electronic component is mounted, and thereafter the second electronic component is mounted onto the circuit board, on which the first electronic component has been mounted, by the electronic component mounting methods of the foregoing individual embodiments.

As a result of this, the first electronic component, after being separately temporarily bonded onto the circuit board, can be heated to melt bonding members, and then the first electronic component can be finally bonded and mounted onto the circuit board, thus allowing mounting work to be achieved efficiently. Therefore, mounting costs of the first electronic component onto the circuit board can be suppressed.

Moreover, the second electronic component is maintained sucked and held by the component holding member from contact with bonding members between electrodes of the second electronic component and electrodes of the circuit board until solidification of the bonding members after their melting. As a result of this, there occur no bonding position shifts between the second electronic component and the circuit board, so that the second electronic component can be mounted onto the circuit board with high precision for a bonding position.

Accordingly, in the electronic component mounting method in a case where a plurality of electronic components different in bonding positional precision from each other, like the first electronic component and the second electronic component, are mixed mounted onto a circuit board, it becomes possible to satisfy both productivity and bonding quality at the same time by changing a mounting method for respective electronic components as required depending on required bonding precision of the respective electronic components.

According to the twenty-second aspect or twenty-third aspect of the invention, while electrodes of an electronic component sucked and held on the component holding member by the suction-and-holding mechanism, and electrodes of a circuit board, are kept in contact with bonding members, the bonding members between these electrodes are heated and melted by the heating mechanism, and releasing of the electronic component from the suction and holding on the component holding member by the suction-and-holding mechanism is performed, not at a time during melting of the bonding members as in the conventional local reflow mounting method, but at a time after the bonding members are solidified by cooling by the cooling mechanism, after heating and melting of the bonding members by the heating mechanism. That is, the electronic-component mounting is not performed based on obtainment of a self alignment effect by surface tension of molten bonding members as in the conventional local reflow mounting method, but mounting of the electronic component onto the circuit board is performed at a contact position positioned by the component holding member. As a result of this, there can be eliminated any bonding position shifts of the electronic component due to a vacuum break blow occurring when the electronic component is released from the suction and holding on the component holding member by the suction-and-holding mechanism. Consequently, it becomes possible to achieve mounting onto the circuit board of such electronic components as those of narrowed electrode pitches in which bonding position shifts of the electronic components due to a vacuum break blow at the suction-and-holding mechanism would matter rather than obtainment of the self alignment effect.

According to the twenty-fourth to twenty-sixth aspects of the invention, it becomes possible to provide an electronic component mounting apparatus capable of obtaining the effects of the seventh to ninth embodiments.

According to the twenty-seventh aspect of the invention, it becomes possible to provide an electronic component mounting apparatus capable of obtaining the effects of the tenth embodiment.

According to the twenty-eighth aspect of the invention, after positional alignment is performed so that electrodes of an electronic component sucked and held by the suction-and-holding mechanism of the component holding member are bondable to electrodes of a circuit board, a pressing load with which the shaft at the component-holding-member tip portion is pressed against the load-detecting surface of the load-detecting section by the elastic member is detected by the load detecting section, and this detected pressing load is outputted to the control part. In the control part, this pressing load is set as a load-zero point in the load detecting section. Thus, even in a case where the pressing load by the component-holding-member tip portion changes in the load detecting section because of changes of elastic characteristics of the elastic member under influence of heat or the like, there are no differences between an actual contact load upon contact between either the electrodes of the electronic component or the electrodes of the circuit board and bonding members, and a detected value of the contact load detected by the load detecting section, thus allowing control of the actual contact load according with a preset contact load to be achieved. Thus, in a case where mounting to the circuit board is iteratively performed for a plurality of electronic components, individual electronic components can be put into association with the circuit board constantly with a preset contact load, so that a stable bonding quality of electronic components to the circuit board can be achieved.

According to the twenty-ninth aspect of the invention, the suction-and-holding mechanism in the component holding member, the shaft, and the load detecting section have their centers positioned coaxially on one axis that is positioned parallel to the axis of up/down operations of the component holding member performed by the up-and-down moving mechanism. Thus, the suction-and-holding mechanism, the shaft, and the load detecting section are moved up and down on the same axis. Further, in the component holding member, an end portion of the shaft in the component-holding-member tip portion is pressed against the load-detecting surface of the load detecting section by the elastic member, which is fitted to the support portion to support the shaft. Thus, it becomes possible for the load detecting section to detect a load that acts in the coaxial direction of the component-holding-member tip portion. Then, by a contact load occurring between electrodes of an electronic component sucked and held by the suction-and-holding mechanism of the component holding member and electrodes of a circuit board upon contact between these electrodes and bonding members, the end portion of the shaft in the component-holding-member tip portion is pressed against the load-detecting surface of the load detecting section, thus making it possible for the load detecting section to detect the contact load by the load detecting section with reliability.

Therefore, contact between the electrodes of the electronic component or the electrodes of the circuit board and the bonding members can be detected by detection of the contact load in the load detecting section, and moreover, the component holding member is moved down in small steps by the up/down moving mechanism so that the actual contact load can be more accurately controlled so as to become a preset contact load. Accordingly, in a case where mounting to a circuit board is iteratively performed for a plurality of electronic components, the actual contact load can be more accurately controlled so as to become a preset contact load constantly. Thus, a contact position upon contact of each electronic component with the circuit board can be made more uniform, an interval pitch between the electrodes of the electronic component can be made narrower, and mounting onto the circuit board can be achieved while a bonding position relative to the circuit board is kept more stable for electronic components to which high precision for the bonding position relative to the circuit board is required, such as high-end electronic components.

According to the thirtieth aspect of the invention, the component holding member further includes a pressing mechanism having two pneumatic cylinders different in inner diameter from each other. Therefore, for example, in a case where an electronic component is a general-purpose electronic component to which high bonding precision is not required, and where the general-purpose electronic component is mounted onto a circuit board, a pneumatic cylinder of an inner diameter suitable for a load of use is selected from the pneumatic cylinders, and compressed air is supplied to this selected pneumatic cylinder. By utilizing pressure of this supplied compressed air, the pneumatic cylinder is operated, causing the component-holding-member tip portion to be moved down, so that electrodes of the general-purpose electronic component sucked and held by the suction-and-holding mechanism can be pressed, along with electrodes of the circuit board, against bonding members therebetween. Thus, it becomes possible to operate the pneumatic cylinders by pressure of compressed air, so that the general-purpose electronic component can be mounted with a high mounting speed by the local reflow mounting method of the prior art.

In addition to this, at least one pneumatic cylinder, out of the two pneumatic cylinders of different inner diameters, includes a restricting mechanism for restricting operations of the one pneumatic cylinder. Therefore, for example, in a case where an electronic component is a high-end electronic component to which high bonding precision is required, and where the high-end electronic component is mounted onto a circuit board, compressed air is supplied to the pneumatic cylinder including the restricting mechanism out of the pneumatic cylinders, thereby activating the pneumatic cylinder, by which the other pneumatic cylinder is pressed and operation of the other pneumatic cylinder is restricted. Further, in this state, restricting operation of the pneumatic cylinder including the restricting mechanism by the restricting mechanism results in a state that operations of the two pneumatic cylinders are restricted, wherein the component-holding-member tip portion and the component-holding-member body portion in the component holding member can each be in an integrated-structure state. As a result, the component holding member can be made in a structural state similar to that of the component holding member of the twenty-first aspect, and therefore, like the effects of the twenty-first aspect, contact between either electrodes of a high-end electronic component or electrodes of a circuit board and bonding members can be detected by detection of a contact load in the load detecting section, and moreover, the component holding member is moved down in small steps by the up/down moving mechanism so that an actual contact load can be more accurately controlled so as to become a preset contact load. Accordingly, in a case where mounting to a circuit board is iteratively performed for a plurality of the high-end electronic components, an actual contact load can be more accurately controlled so as to become a preset contact load constantly. Thus, a contact position upon contact of each high-end electronic component with the circuit board can be made more uniform, an interval pitch between the electrodes of the electronic component can be made narrower, and mounting onto the circuit board can be achieved while a bonding position relative to the circuit board is kept more stable for electronic components for which high precision for the bonding position relative to the circuit board is required, such as high-end electronic components.

According to the thirty-first aspect of the invention, the restricting mechanism includes a recessed portion of a rod of a pneumatic cylinder having the restricting mechanism, a guide hole, and a bar member which extends through the hole and which is fittable into the recessed portion. Thus, by inserting the bar member through hole so that the bar member is fitted into the recessed portion, it becomes possible to mechanically restrict operations of the pneumatic cylinder having the restricting mechanism with a simpler mechanism.

According to the thirty-second aspect of the invention, a large cylinder is provided in the component-holding-member body portion, and a small cylinder is provided in the component-holding-member tip portion. By this arrangement, increase in weight due to placement of the pneumatic cylinders at the component-holding-member tip portion supported by the component-holding-member body portion via the elastic member can be suppressed. Thus, smaller contact loads can be detected, so that an actual contact load can be controlled with higher controllability so as to become a preset contact load.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom. For example, even though the electrodes have been described as being distinct from solder that forms the bonding members, insofar as the appended claims are concerned an "electrode" is considered to be any electrically conductive member that functions as an electrode, including a combination of electrode 4a and solder portion 2, or a combination of electrode 1a and other electrically conductive material thereon.

What is claimed is:

1. A method for mounting an electronic component, comprising:
   using a component holding member to suck and hold an electronic component having electrodes;
   performing positional alignment so that said electrodes of said electronic component and electrodes of a circuit board become bondable to each other with bonding members interposed therebetween;
   moving said component holding member, with said electronic component sucked and held thereon, toward said circuit board;
   detecting contact between said bonding members and one of
   (i) said electrodes of said electronic component, and
   (ii) said electrodes of said circuit board;
   maintaining to be generally constant a load actually generated from said bonding members contacting said one of
   (i) said electrodes of said electronic component, and
   (ii) said electrodes of said circuit board;
   while contact is maintained between said bonding members and said electrodes of said electronic component and said electrodes of said circuit board, while said electronic component is sucked and held on said component holding member, and while said load is maintained to be generally constant, heating and thereby initiating melting of said bonding members; and then
   cooling and thereby solidifying said bonding members;
   and further comprising, after initiating melting said bonding members,
   (i) no longer maintaining said load to be generally constant, and
   (ii) maintaining to be generally constant a contact height position of said electronic component relative to said circuit board.

2. The method according to claim 1, wherein
   detecting contact between said bonding members and one of
   (i) said electrodes of said electronic component, and
   (ii) said electrodes of said circuit board
   comprises detecting that a load actually generated from said bonding members coming into engagement with said one of
   (i) said electrodes of said electronic component, and
   (ii) said electrodes of said circuit board exceeds a load expected to be generated from such engagement.

3. The method according to claim 1, wherein
   detecting contact between said bonding members and one of
   (i) said electrodes of said electronic component, and
   (ii) said electrodes of said circuit board comprises, when said component holding member is incrementally moved toward said circuit board in response to a load actually generated from said bonding members coming into engagement with said one of
   (i) said electrodes of said electronic component, and
   (ii) said electrodes of said circuit board, detecting that said load actually generated from said bonding members coming into engagement with said one of
   (i) said electrodes of said electronic component, and
   (ii) said electrodes of said circuit board exceeds a load expected to be generated from such engagement.

4. The method according to claim 1, further comprising:
   releasing said electronic component from said component holding member after solidifying said bonding members.

5. The method according to claim 1, further comprising:
   preliminarily feeding said bonding members onto at least either said electrodes of said electronic component or said electrodes of said circuit board.

6. The method according to claim 1, wherein said bonding members comprise solder.

7. The method according to claim 1, further comprising:
   preliminarily feeding flux onto said electrodes of said electronic component, onto said electrodes of said circuit board, or onto said bonding members.

8. The method according to claim 1, wherein said bonding members comprise solder bumps on said electrodes of said electronic component, or solder bumps on said electrodes of said electronic component and solder portions on said electrodes of said circuit board.

9. The method according to claim 1, wherein commencement of melting said bonding members corresponds to when a decrease of said load is detected.

10. The method according to claim 1, further comprising:
    while using said component holding member to suck and hold said electronic component, preliminarily feeding individual ones of said bonding members onto corresponding ones of said electrodes of said electronic component that are at a uniform feed height.

11. The method according to claim 1, further comprising:
    prior to performing said positional alignment,
    (i) using another component holding member to suck and hold another electronic component having electrodes;
    (ii) performing positional alignment so that said electrodes of said another electronic component and other electrodes of said circuit board become bondable to each other with additional bonding members interposed therebetween;
    (iii) moving said another component holding member, with said another electronic component sucked and held thereon, toward said circuit board such that said electrodes of said another electronic component and said other electrodes of said circuit board press therebetween said additional bonding members so as to temporarily bond said another electronic component to said circuit board; then
    (iv) heating and thereby melting said additional bonding members; and then
    (v) cooling and thereby solidifying said additional bonding members so as to finally bond said another electronic component to said circuit board,
    wherein said electronic component is required to be mounted onto said circuit board with a bonding position precision that is greater than a bonding position precision necessary to mount said another electronic component onto said circuit board.

12. The method according to claim 1, wherein
    maintaining to be generally constant said contact height position of said electronic component relative to said circuit board comprises moving said component holding member away from said circuit board, while heating said bonding members, based on data pertaining to elongation-amount variations of said component holding member corresponding to said component holding member being heated such that an elongation-amount correction of said component holding member is performed in response to the heating of said bonding members.

13. The method according to claim 12, wherein
    maintaining to be generally constant said contact height position of said electronic component relative to said circuit board further comprises moving said component holding member toward said circuit board, while cooling said bonding members, based on data pertaining to shrinkage-amount variations of said component holding member corresponding to said component holding member being cooled such that a shrinkage-amount correction of said component holding member is performed in response to the cooling of said bonding members.

14. The method according to claim 1, wherein maintaining to be generally constant said contact height position of said electronic component relative to said circuit board comprises moving said component holding member toward said circuit board, while cooling said bonding members, based on data pertaining to shrinkage-amount variations of said component holding member corresponding to said component holding member being cooled such that a shrinkage-amount correction of said component holding member is performed in response to the cooling of said bonding members.

15. An apparatus for mounting an electronic component to a circuit board, comprising:
   a suction-and-holding mechanism for sucking and holding an electronic component thereon;
   an up-and-down moving mechanism for axially moving said suction-and-holding mechanism;
   a load detecting section for detecting a contact load generated, from causing said up-and-down moving mechanism to move said suction-and-holding mechanism toward the circuit board while the electronic component is sucked and held on said suction-and-holding mechanism, between electrodes of the electronic component and electrodes of a circuit board upon contact of the electrodes of the electronic component and the electrodes of the circuit board with interposing bonding members;
   a heating mechanism for heating the bonding members;
   a cooling mechanism for cooling the bonding members after being heated by said heating mechanism; and
   control means for controlling said suction-and-holding mechanism, said up-and-down moving mechanism, said load detecting section, said heating mechanism and said cooling mechanism, such that
      (i) said up-and-down moving mechanism is controlled so as to maintain the contact load as detected by said load detecting section to be generally constant, from the contact of the electrodes of the electronic component and the electrodes of the circuit board with the interposing bonding members until start of melting of the bonding members via heat applied by said heating mechanism, while sucking and holding the electronic component by said suction-and-holding mechanism,
      (ii) said up-and-down moving mechanism is controlled so as to no longer maintain the contact load to be generally constant, and maintain a mounting height between the electronic component and the circuit board to be generally constant, after the start of the melting of the bonding members, while sucking and holding the electronic component by said suction-and-holding mechanism, and
      (iii) said suction-and-holding mechanism is controlled so as to release the electronic component therefrom after solidifying of the bonding members once melted,
      with the proviso that when said up-and-down moving mechanism is controlled in accordance with (i) said up-and-down moving mechanism is not controlled in accordance with (ii), and when said up-and-down moving mechanism is controlled in accordance with (ii) said up-and-down moving mechanism is not controlled in accordance with (i).

16. The apparatus according to claim 15, wherein said load detecting section is for detecting contact between the bonding members and one of
   (i) the electrodes of the electronic component, and
   (ii) the electrodes of the circuit board by having said control means determine that a load, as detected by said load detecting section, generated from the bonding members coming into engagement with the one of
   (i) the electrodes of the electronic component, and
   (ii) the electrodes of the circuit board exceeds a load expected to be generated from such engagement.

17. The apparatus according to claim 15, wherein said load detecting section is for detecting contact between the bonding members and one of
   (i) the electrodes of the electronic component, and
   (ii) the electrodes of the circuit board by having said control means control said up-and-down moving mechanism such that said suction-and-holding mechanism is incrementally moved toward the circuit board in response to a load, as detected by said load detecting section, actually generated from the bonding members coming into engagement with the one of
   (i) the electrodes of the electronic component, and
   (ii) the electrodes of the circuit board, and having said control means determine that the load actually generated from the bonding members coming into engagement with the one of
   (i) the electrodes of the electronic component, and
   (ii) the electrodes of the circuit board exceeds a load expected to be generated from such engagement.

18. The apparatus according to claim 15, wherein said control means is also for controlling said suction-and-holding mechanism such that said suction-and-holding mechanism is controlled
   (i) so as to maintain suction and holding of the component to said suction-and-holding mechanism during melting of the bonding members in response to being heated by said heating mechanism, and
   (ii) so as to release suction and holding of the component to said suction-and-holding mechanism after solidification of the bonding members in response to being cooled by said cooling mechanism.

19. The apparatus according to claim 15, wherein said control means is also for, for a time period from when the electrodes of the electronic component and the electrodes of the circuit board are aligned with one another with the bonding members interposed therebetween to until said suction-and-holding mechanism is moved toward the circuit board while sucking and holding the electronic component, setting a load detected by said load detecting section to a load-zero point.

20. The apparatus according to claim 15, further comprising:
   a detection device for detecting the start of melting of the bonding members by detecting a decrease of the contact load between the electrodes of the electronic component and the electrodes of the circuit board, as detected by said load detecting section.

21. The apparatus according to claim 15, wherein
said up-and-down moving mechanism is controlled so as to maintain a mounting height between the electronic component and the circuit board to be generally constant by being controlled so as to move said suction-and-holding mechanism away from the circuit board, while heating the bonding members, based on data pertaining to elongation-amount variations of said suction-and-holding mechanism corresponding to said suction-and-holding mechanism being heated such that an elongation-amount correction of said suction-and-holding mechanism is performed in response to the heating of the bonding members.

22. The apparatus according to claim 21, wherein
said up-and-down moving mechanism is controlled so as to maintain a mounting height between the electronic component and the circuit board to be generally constant by being further controlled so as to move said suction-and-holding mechanism toward the circuit board, while cooling the bonding members, based on data pertaining to shrinkage-amount variations of said suction-and-holding mechanism corresponding to said suction-and-holding mechanism being cooled such that a shrinkage-amount correction of said suction-and-holding mechanism is performed in response to the cooling of the bonding members.

23. The apparatus according to claim 15, wherein
said up-and-down moving mechanism is controlled so as to maintain a mounting height between the electronic component and the circuit board to be generally constant by being controlled so as to move said suction-and-holding mechanism toward the circuit board, while cooling the bonding members, based on data pertaining to shrinkage-amount variations of said suction-and-holding mechanism corresponding to said suction-and-holding mechanism being cooled such that a shrinkage-amount correction of said suction-and-holding mechanism is performed in response to the cooling of the bonding members.

24. An apparatus for mounting an electronic component to a circuit board, comprising:
a suction-and-holding mechanism for sucking and holding an electronic component thereon;
an up-and-down moving mechanism for axially moving said suction-and-holding mechanism;
a load detecting section for detecting a contact load generated, from causing said up-and-down moving mechanism to move said suction-and-holding mechanism toward the circuit board while the electronic component is sucked and held on said suction-and-holding mechanism, between electrodes of the electronic component and electrodes of a circuit board upon contact of the electrodes of the electronic component and the electrodes of the circuit board with interposing bonding members;
a heating mechanism for heating and melting the bonding members while interposed between and in contact with the electrodes of the electronic component and the electrodes of the circuit board, and while the electronic component is being sucked and held on said suction-and-holding device; and
a cooling mechanism for cooling the bonding members, after being heated and melted by said heating mechanism, so as to solidify the bonding members, with the electronic component being sucked and held by said suction-and-holding mechanism;
a tip portion having said suction-and-holding mechanism, said heating mechanism, said cooling mechanism and a shaft portion; and
a body portion having a support portion to which is fitted said load detecting section, said support portion for supporting said tip portion and said load detecting section,
wherein centers of said suction-and-holding mechanism, said heating mechanism, said shaft portion and said load detecting section are on a single axis which is parallel to an axis of movement of said support portion, and
wherein said load detecting section is capable of detecting a load of the tip portion acting in a direction of said shaft portion via an arrangement in which an end of said shaft portion is pressed against a load-detecting surface of said load detecting section by an elastic member fitted to said support portion and supporting said shaft portion, said apparatus further comprising:
a pressing mechanism including first and second pneumatic cylinders that have different inner diameters relative to one another, with said first pneumatic cylinder being provided in said body portion and said second pneumatic cylinder being provided in said tip portion, such that by actuating a selective one of said first and second pneumatic cylinders said tip portion is moved along said single axis toward the circuit board so as to press the bonding members between the electrodes of the electronic component and the electrodes of the circuit board, when the electronic component is sucked and held by said suction-and-holding mechanism, such that generated is a suitable contact load,
with at least one of said first and second pneumatic cylinders including a restricting mechanism for mechanically restricting movement of said at least one of said first and second pneumatic cylinders, such that when said at least one of said first and second pneumatic cylinders presses the other of said first and second pneumatic cylinders, with movement of said at least one of said first and second pneumatic cylinders being restricted via said restricting mechanism, a pressing function of said pressing mechanism is restricted.

25. The apparatus according to claim 24, wherein
said at least one of said first and second pneumatic cylinders includes a cylindrical guide and a columnar rod disposed within said cylindrical guide, and
said restricting mechanism includes
(i) a groove in an outer circumferential face of said columnar rod,
(ii) a hole in a cylindrical side face of said cylindrical guide at a position that can be coincident with said groove, and
(iii) a bar member extendable through said hole and receivable within said groove, such that said restricting mechanism is for mechanically restricting movement of said at least one of said first and second pneumatic cylinders by having said bar member extend, from outside of said cylindrical guide, through said hole and into said groove.

26. The apparatus according to claim 24, wherein
the one of said first and second pneumatic cylinders having the larger inner diameter is in said body portion, and the one of said first and second pneumatic cylinders having the smaller inner diameter is in said tip portion, with centers of said first and second pneumatic cylinders being on the same axis, said one of said first and second pneumatic cylinders having the larger inner diameter includes said restricting mechanism, said cylindrical guide of said one of said first and second pneumatic cylinders having the larger inner diameter is fitted to an end of said support portion, and said columnar rod of said one of said first and second pneumatic cylinders having the larger inner diameter is fitted to said load detecting section, and said one of said first and second pneumatic cylinders having the smaller inner diameter includes a cylindrical guide and a columnar rod disposed within said cylindrical guide, with this cylindrical guide being fitted to an end of said shaft portion and this columnar rod being set so as to be contacted by a load-detecting surface of said load detecting section.

* * * * *